(12) United States Patent
Wang et al.

(10) Patent No.: US 12,266,403 B2
(45) Date of Patent: Apr. 1, 2025

(54) THREE-DIMENSIONAL NAND MEMORY AND FABRICATION METHOD THEREOF

(71) Applicant: Yangtze Memory Technologies Co., Ltd., Hubei (CN)

(72) Inventors: Di Wang, Hubei (CN); Wenxi Zhou, Hubei (CN); Tingting Zhao, Hubei (CN); Zhiliang Xia, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 388 days.

(21) Appl. No.: 17/709,651

(22) Filed: Mar. 31, 2022

(65) Prior Publication Data

US 2022/0366985 A1    Nov. 17, 2022

(30) Foreign Application Priority Data

May 17, 2021 (CN) .......................... 202110532721.7

(51) Int. Cl.

| | |
|---|---|
| *H01L 23/528* | (2006.01) |
| *G11C 16/04* | (2006.01) |
| *H10B 41/10* | (2023.01) |
| *H10B 41/27* | (2023.01) |
| *H10B 41/35* | (2023.01) |
| *H10B 43/10* | (2023.01) |
| *H10B 43/27* | (2023.01) |
| *H10B 43/35* | (2023.01) |

(52) U.S. Cl.
CPC ...... *G11C 16/0483* (2013.01); *H01L 23/5283* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
None
See application file for complete search history.

(56) References Cited

U.S. PATENT DOCUMENTS

| | | | |
|---|---|---|---|
| 10,741,576 B2 | 8/2020 | Nishikawa et al. | |
| 11,594,544 B2 | 2/2023 | Ryu et al. | |
| 2018/0366482 A1 | 12/2018 | Zhou et al. | |
| 2020/0051995 A1 | 2/2020 | Tanaka et al. | |

FOREIGN PATENT DOCUMENTS

| | | |
|---|---|---|
| CN | 111448662 A | 7/2020 |
| CN | 112802856 A | 5/2021 |

*Primary Examiner* — Anthony Ho
(74) *Attorney, Agent, or Firm* — HANLEY, FLIGHT & ZIMMERMAN, LLC

(57) ABSTRACT

The present disclosure provides a method for forming a three-dimensional (3D) memory device. The method includes sequentially forming a first and a second dielectric stacks on a substrate. The first dielectric stack includes a first and a second dielectric layers alternatingly stacked in a first direction perpendicular to the substrate. The second dielectric stack comprises a third and a fourth dielectric layers stacked in the first direction. The method further includes forming an etch-stop layer on the second dielectric stack and forming a gate line slit (GLS) trench spacer to cover a sidewall of the etch-stop layer. The method further includes replacing the fourth and the second dielectric layers with conductive layers through a GLS opening to form a top select gate (TSG) film stack and a film stack of alternating conductive and dielectric layers, respectively.

20 Claims, 34 Drawing Sheets

400A

400B

THREE-DIMENSIONAL NAND MEMORY AND FABRICATION METHOD THEREOF

CROSS-REFERENCE TO RELATED APPLICATIONS AND INCORPORATION BY REFERENCE

This application claims priority to Chinese Patent Application No. 202110532721.7, filed on May 17, 2021, which is incorporated herein by reference in its entireties.

TECHNICAL FIELD

The present disclosure generally relates to the field of semiconductor technology, and more particularly, to a three-dimensional NAND flash memory and its fabrication methods.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. Gate line slits (GLS) and top select gate (TSG) cuts can be used to divide a memory block into smaller storage units, such as memory fingers and memory slices. As the number of vertically stacked layers increases, feature sizes of the memory cells have also been scaled down to further increase the storage density. Accordingly, process window has been reduced in the fabrication of the 3D NAND memory. For example, if there is an overlay offset between a bit line (BL) contact and a top select structure, the BL contact can be connected with the TSG, causing circuit shorts. Therefore, a need exists to provide a method for forming a 3D NAND flash memory with high density and improved product yield.

BRIEF SUMMARY

Embodiments of a three-dimensional (3D) memory device and a method for forming the same are described in the present disclosure.

One aspect of the present disclosure provides a method for forming a three-dimensional (3D) memory device. The method includes forming a first dielectric stack on a substrate; forming a second dielectric stack on the first dielectric stack; forming an etch-stop layer on a first side of the second dielectric stack that is away from the substrate; forming a gate line slit (GLS) trench on the first side, wherein the GLS trench penetrates at least the etch-stop layer; filling the GLS trench with a first filling layer; and forming a GLS opening in the GLS trench filled with the first filling layer, wherein the GLS opening penetrates through the second dielectric stack and the first dielectric stack and extends into the substrate. In a direction parallel to the substrate, the GLS opening has a width smaller than a width of the GLS trench.

In some embodiments, the second dielectric stack includes at least one pair of alternately stacked top dielectric layers (i.e., third dielectric layers) and top sacrificial layers (i.e., fourth dielectric layers), wherein the etch-stop layer is a first top sacrificial layer that is the farthest from the substrate in the top sacrificial layers. In some embodiments, the etch-stop layer is disposed on the first top sacrificial layer on a side away from the substrate.

In some embodiments, an etching selection ratio of the top sacrificial layer over the first filling layer is greater than a predetermined value so as to retain the first filling layer when the top sacrificial layer is removed.

In some embodiments, the top dielectric layer and the first filling layer are formed using the same material.

In some embodiments, the first dielectric stack includes alternatingly stacked sacrificial layers (i.e., second dielectric layers) and dielectric layers (i.e., first dielectric layers), wherein the method further includes: removing, through the GLS opening, the top sacrificial layers except the first top sacrificial layer to form a second set of lateral tunnels; and removing, through the GLS opening, the sacrificial layers to form a first set of lateral tunnels.

In some embodiments, when the etch-stop layer is disposed on the first top sacrificial layer, removing the top sacrificial layers to form a second set of lateral tunnels through the GLS opening; and removing, through the GLS opening, the sacrificial layers to form a first set of lateral tunnels.

In some embodiments, the method further includes filling the first set of lateral tunnels and the second set of lateral tunnels with conductive layers to form control gates and top select gates (TSGs) of the 3D memory device. The method also includes filling the GLS opening to form a GLS.

In some embodiments, the method also includes, prior to forming the GLS opening, forming a channel hole that penetrates through the first dielectric stack and extends into the substrate; and forming a channel structure inside the channel hole. The method further includes forming a top select opening (i.e., a first opening) that penetrates through the second dielectric stack, wherein the top select opening aligns with the channel hole and the channel structure. A width of the top select opening is smaller than a width of a top portion of the channel hole. The method further includes forming a top select structure (i.e., a first opening structure) inside the top select opening.

In some embodiments, the method further includes forming a bit line (BL) contact opening (i.e., a second opening) on the first opening structure; and filling the BL contact opening with a metallic material to form a BL contact. An etching process for forming the BL contact opening stops on the side of the first top sacrificial layer away from the substrate.

In some embodiments, the method further includes, after forming the TSGs and the control gates of the 3D memory device, forming a TSG cut opening (i.e., a third opening) that penetrates through the second dielectric stack, wherein the TSG cut opening is distant from the top select opening in a direction parallel to an extending direction of the control gates. The method also includes filling the TSG cut opening to form a TSG cut.

In some embodiments, the filling the GLS opening to form the GLS includes forming a GLS isolation layer on an inner wall of the GLS opening; and filling the GLS opening with a second filling layer.

Another aspect of the present disclosure provides a three-dimensional (3D) memory device, wherein the 3D memory device includes a substrate and a film stack on the substrate, wherein the film stack includes alternately stacked second conductive layers and first dielectric layers. The 3D memory device also includes a memory string (or a channel structure) that penetrates through the film stack and extends into the substrate. The 3D memory device further includes a top select gate (TSG) film stack disposed on the film stack, wherein the TSG film stack includes at least one pair of alternately stacked top dielectric layers (third dielectric layers) and first conductive layers. The TSG film stack further includes an etch-stop layer disposed on an outermost side away from the substrate.

In some embodiments, the 3D memory device also includes a channel top plug disposed on the memory string, wherein the channel top plug is electrically connected to a channel layer of the memory string. The 3D memory device also includes a top select structure (i.e., a first opening structure) that penetrates through the TSG film stack and is electrically connected to the channel top plug. A lateral dimension of the top select structure in a direction parallel to the substrate, is smaller than a lateral dimension of a top portion of memory string.

In some embodiments, the 3D memory device further includes a gate line slit (GLS) that penetrates through the TSG film stack and the film stack and extends into the substrate. The GLS includes a GLS trench spacer (i.e., a first filling layer), a GLS isolation layer, and a GLS opening filler (i.e., second filling layer) that are sequentially disposed on an inner wall of a GLS opening, wherein the GLS trench spacer penetrates through the etch-stop layer in a direction perpendicular to the substrate and terminates above an uppermost first conductive layer away from the substrate.

In some embodiments, the first dielectric layers and the third dielectric layers include same dielectric material.

In some embodiments, the 3D memory device further includes a TSG cut that penetrates through the TSG film stack and is distant from the top select structure in a direction parallel to an extending direction of the second conductive layers.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
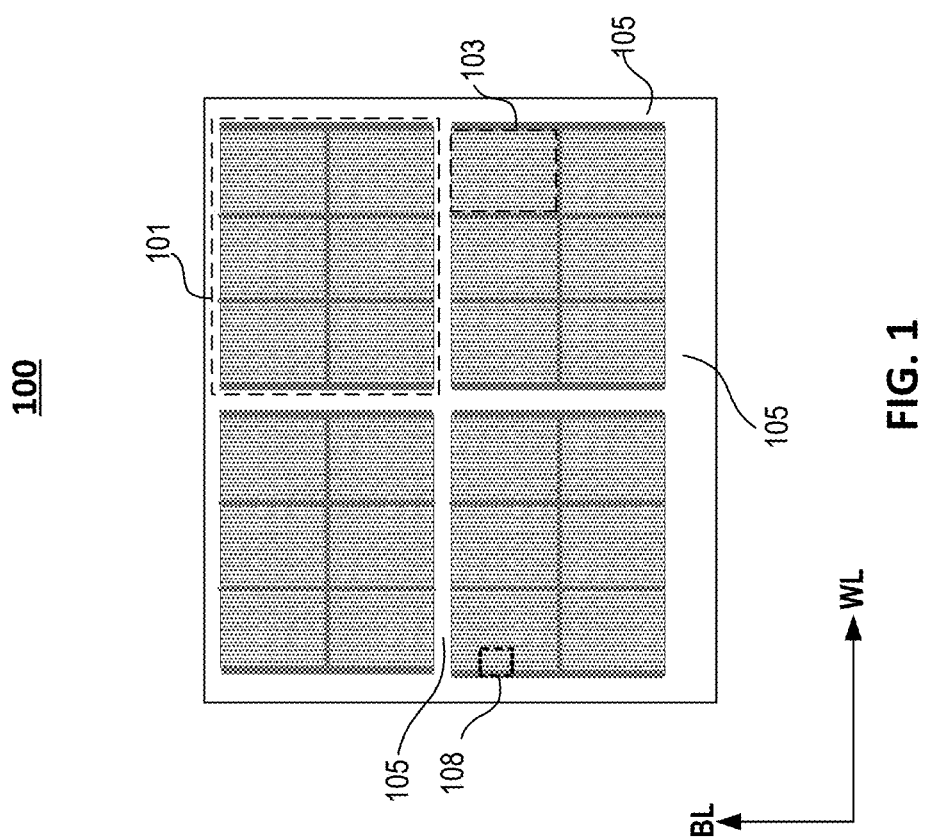
FIG. 1 illustrates a schematic top-down view of an exemplary three-dimensional (3D) memory die, according to some embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

Although the terms "first," "second," or the like, may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain un-patterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate. Likewise, "parallel" and "perpendicular" are also nominal terms.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100, such as 3D NAND Flash memory, can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
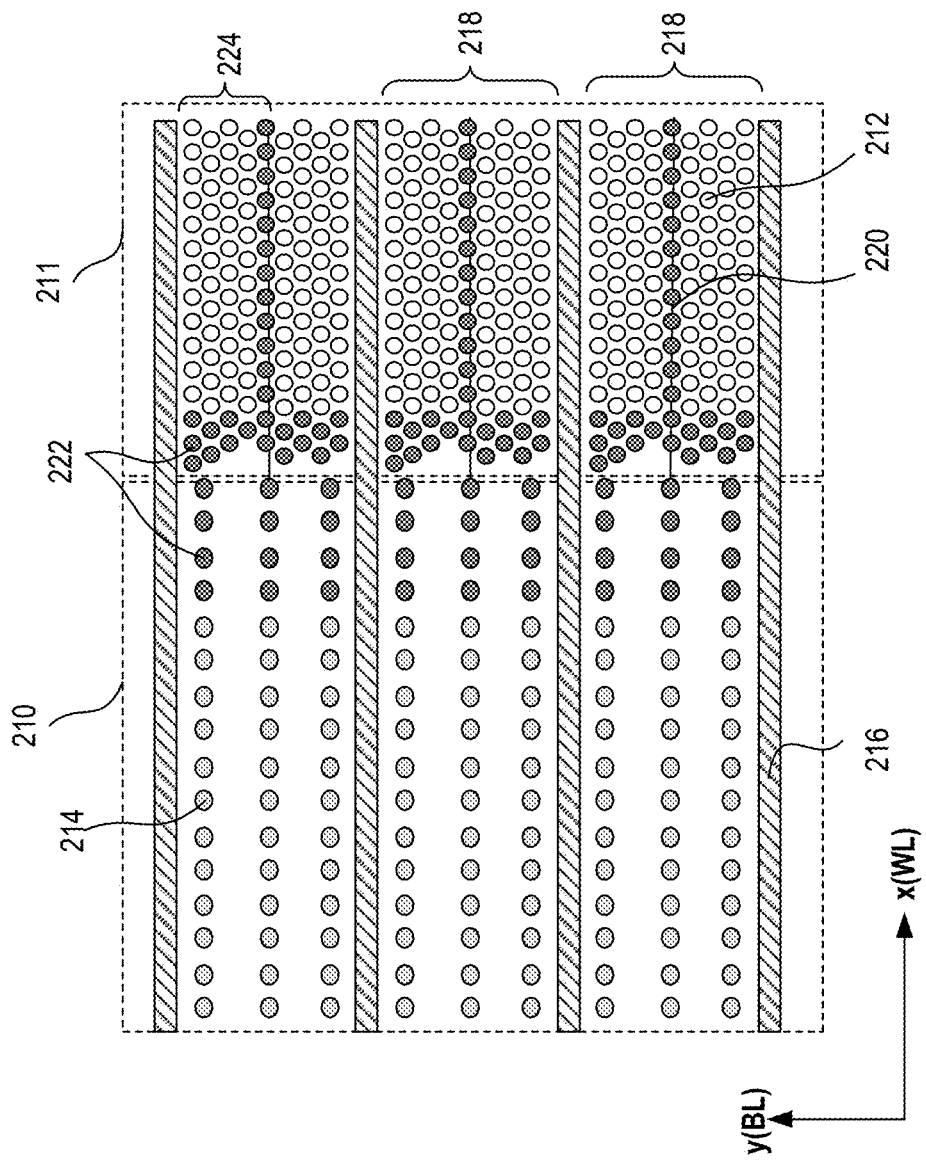
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, slit structures 216 (also referred to gate line slit or "GLS"), extending in WL direction across the channel structure region 211 and the staircase region 210, can divide a memory block into multiple memory fingers 218. At least some slit structures 216 can function as the common source contact (e.g., array common source) for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
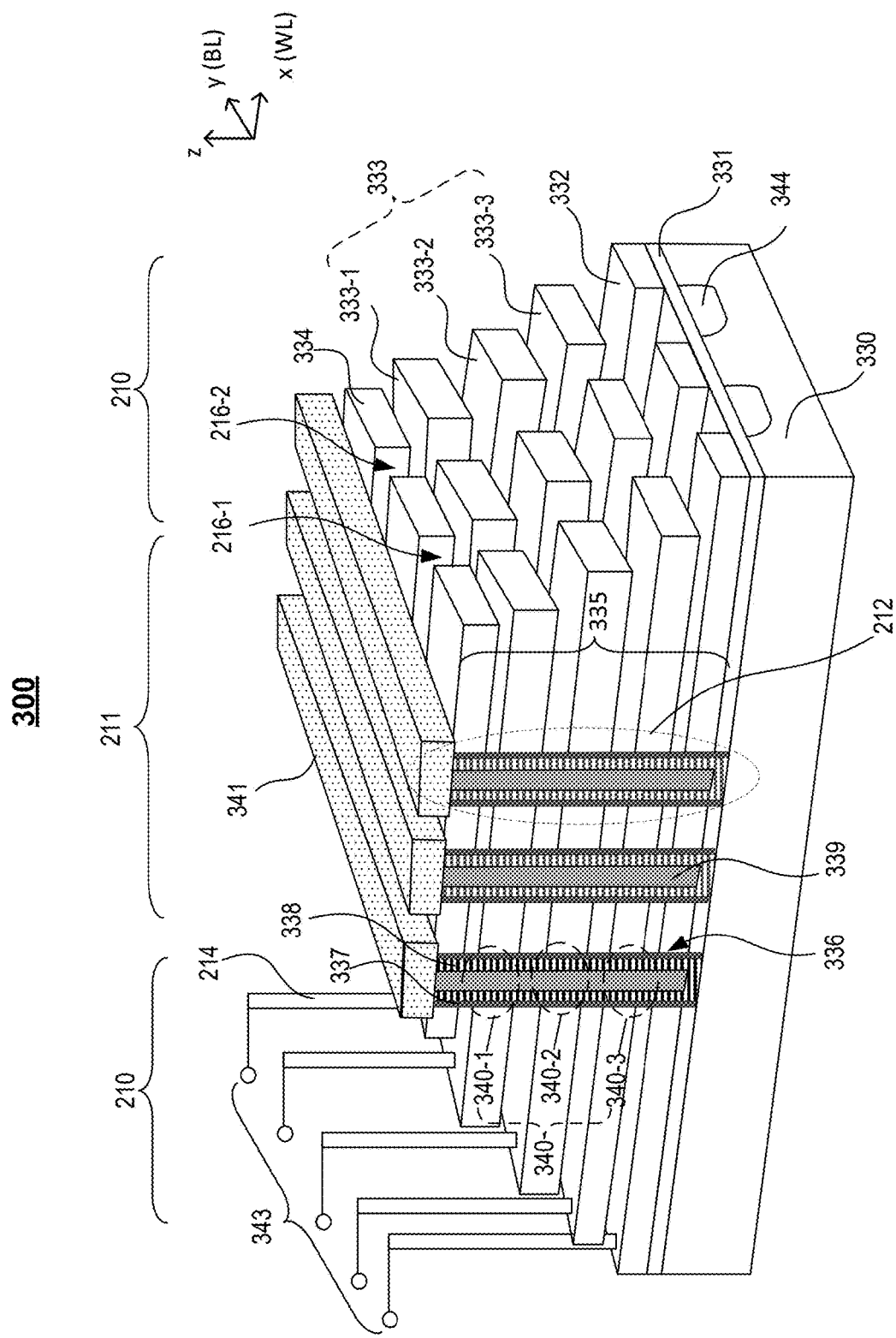
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of bottom select gates (BSGs) 332 over the insulating film 331, and a plurality of tiers of control gates 333, also referred to as "word lines (WLs)," stacking on top of the BSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and BSG 332 is also referred to as "gate electrodes". The memory array structure 300 further includes memory strings 212 and doped source line regions 344 in portions of substrate 330 between adjacent BSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel layer 338 of the memory cell. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of BSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact (i.e., array common source) and dummy memory string. These structures are not shown in FIG. 3 for simplicity.

To increase the storage capacity of a 3D NAND flash memory, the number of control gates and the number of vertically stacked memory cells can be greatly increased. With the increase in the number of vertically stacked layers, the number of memory strings (or channel holes) per unit area can also be increased to further increase the storage capacity of the 3D NAND flash memory.

Figure 4A:
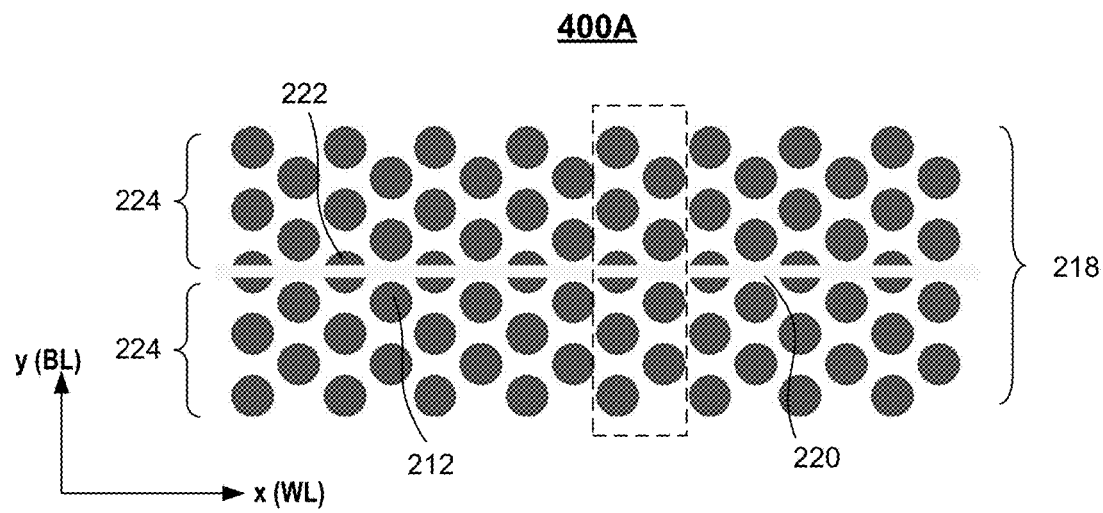
FIGS. 4A and 4B illustrate a top-down view of a 3D NAND flash memory device, according to some embodiments of the present disclosure.
Figure 4B:
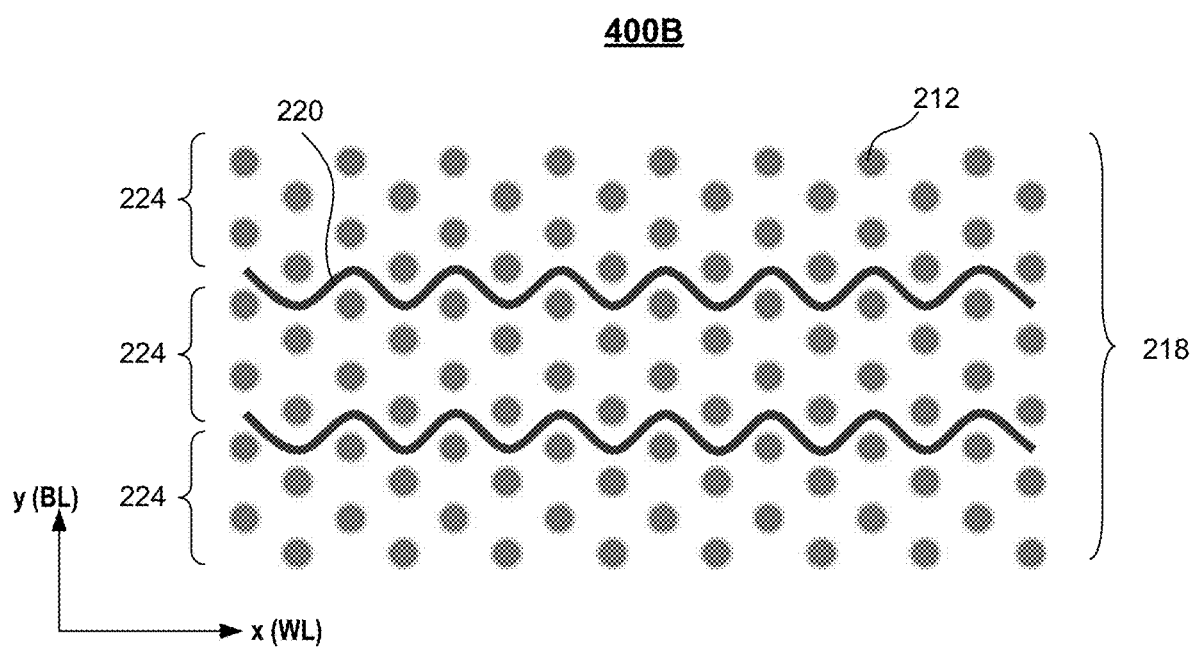

As discussed above, in a three-dimensional memory, the GLS 216 and the TSG cut 220 can be used to divide the memory block 103 into smaller storage units, such as memory fingers 218 and memory slice 224. FIGS. 4A and 4B illustrate two exemplary layouts 400A and 400B of the memory strings in a 3D NAND flash memory. In FIGS. 4A and 4B, the memory finger 218 includes the memory strings 212 arranged periodically in the y-direction (i.e., BL direction) and the x-direction (i.e., WL direction), where there are offsets between adjacent memory strings in the x-direction and y-direction. For example, the layout 400A can be considered as a set of nine memory strings 212 repeated along the x-direction.

In FIG. 4A, the TSG cut 220 is configured as a straight line extending in the x-direction, separating the memory finger 218 into two memory slices 224. In the layout 400A, the TSG cut 220 goes through the memory strings 212 located in the center of the memory finger 218, turning these memory strings 212 into dummy memory strings 222. The dummy memory strings 222 does not have storage function.

In FIG. 4B, the TSG cut 220 is configured as a waving curve extending in the x-direction, where the TSG cut 220 goes through a spacing between adjacent memory strings 212. In the layout 400B, the TSG 220 does not intersect with the memory strings 212. As such, the layout 400B provides a higher density of memory strings per unit area.

To increase process window such that the TSG 220 can avoid intersecting with the memory strings 212, a critical dimension ("CD") (e.g., a diameter) of the memory strings can be reduced. However, memory strings with a smaller diameter can cause circuit shorts between a bit line 341 and the TSG 334 when there is a misalignment between a bit line contact and a memory string. Therefore, a need exists to provide a method for forming a 3D NAND flash memory with high density of memory strings.

Figure 5:
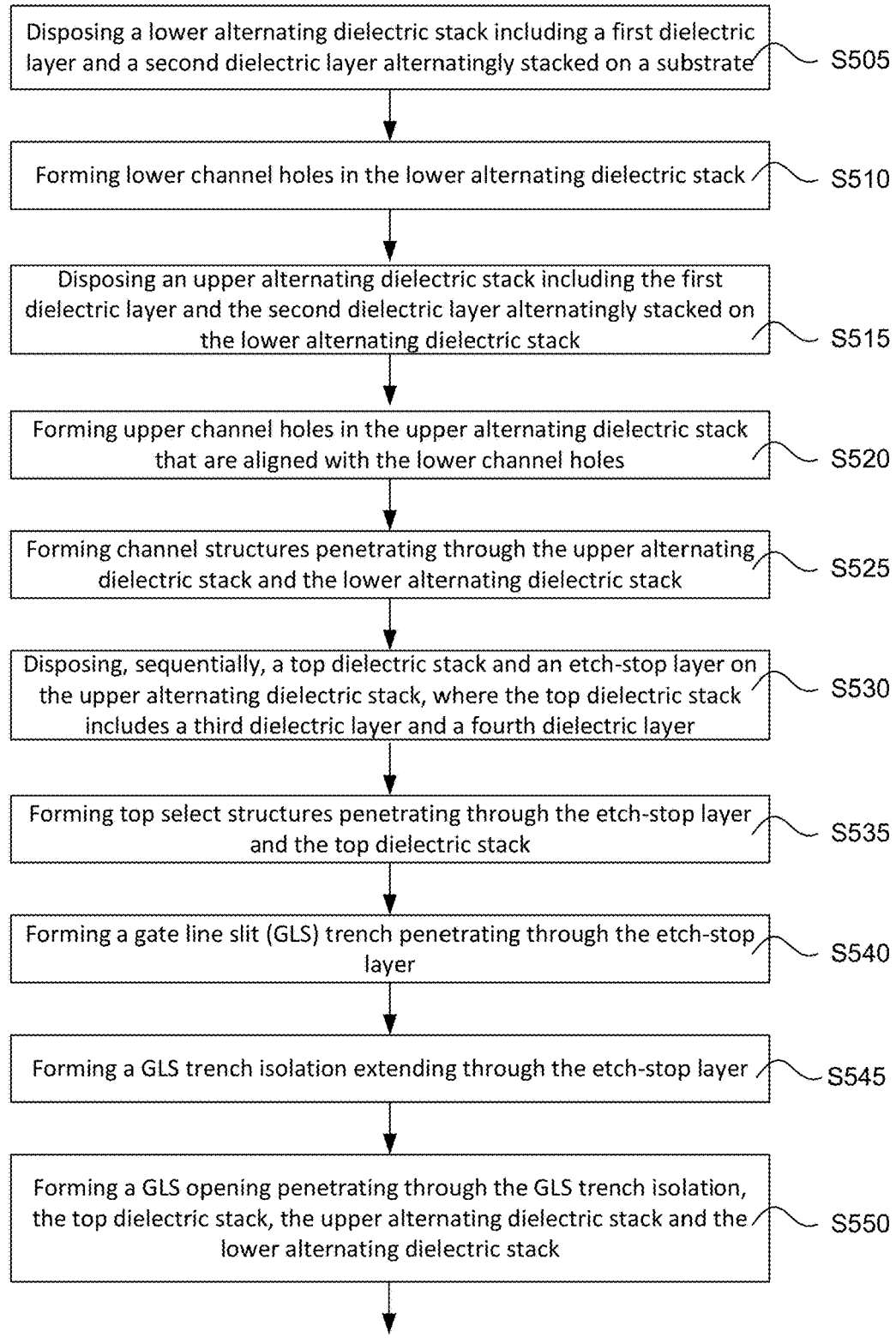
FIG. 5 illustrates a method for forming a 3D memory device, according to some embodiments of the present disclosure.
Figure 5:
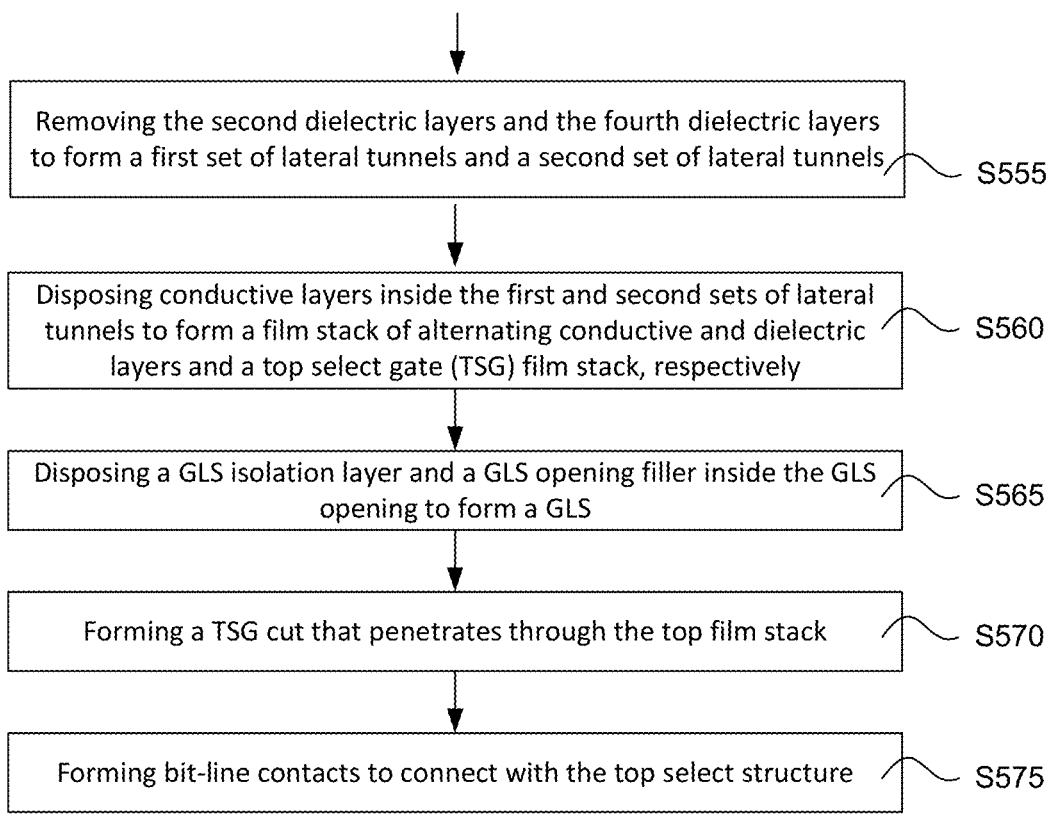

FIG. 5 illustrates a method 500 for forming a three-dimensional (3D) memory device, according to some embodiments of the present disclosure. It should be understood that process steps shown in method 500 are not exhaustive and that other steps can be performed as well before, after, or between any of the illustrated steps. In some embodiments, some steps of method 500 can be omitted or include other steps that are not described here for simplicity.

In some embodiments, steps of method 500 can be performed in a different order and/or vary.

FIGS. 6-17 illustrate exemplary structures of a 3D memory device at certain process step according to the method 500.

Referring to FIG. 5, at process step S505, a lower alternating dielectric stack can be disposed on a substrate. At process step S510, lower channel holes can be formed in the lower alternating dielectric stack. At process step S515, an upper alternating dielectric stack can be disposed on the lower alternating dielectric stack. At process step S520, upper channel holes can be formed in the upper alternating dielectric stack that are align with the lower channel holes. At process step S525, channel structures can be formed penetrating through the upper alternating dielectric stack and the lower alternating dielectric stack. A cross-sectional view of an exemplary 3D memory structure 600 is shown in FIG. 6, according to the process steps S505-S525.

Figure 6:
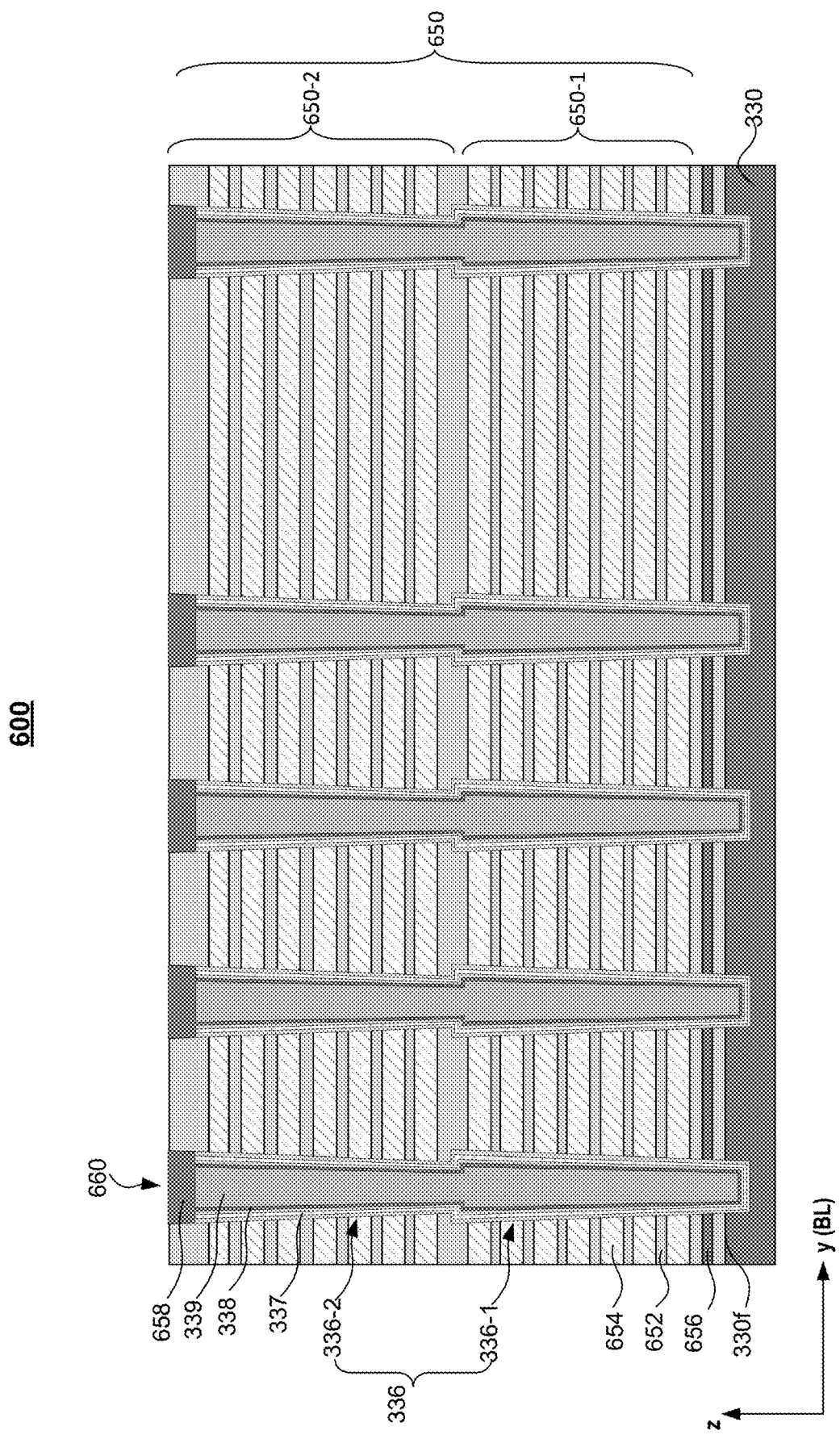
FIGS. 6-15 illustrate cross-sectional views of a 3D memory device at certain process steps, according to some embodiments of the present disclosure.

As shown in FIG. 6, the 3D memory structure 600 include a lower alternating dielectric stack 650-1 disposed on the substrate 330. In some embodiments, there can be another layer or film between the lower alternating dielectric stack 650-1 and the substrate 330.

The substrate 330 can provide a platform for forming subsequent structures. In some embodiments, the substrate 330 can be any suitable semiconductor substrate having any suitable semiconductor materials, such as monocrystalline, polycrystalline or single crystalline semiconductors. For example, the substrate 330 can include silicon, silicon germanium (SiGe), germanium (Ge), silicon on insulator (SOI), germanium on insulator (GOI), gallium arsenide (GaAs), gallium nitride, silicon carbide, III-V compound, or any combinations thereof. In some embodiments, the substrate 330 can include a layer of semiconductor material formed on a handle wafer, for example, glass, plastic, or another semiconductor substrate.

A front surface 330f of the substrate 330 is also referred to as a "main surface" or a "top surface" of the substrate herein. Layers of materials can be disposed on the front surface 330f of the substrate 330. A "topmost" or "upper" layer is a layer farthest or farther away from the front surface 330f of the substrate. A "bottommost" or "lower" layer is a layer closest or closer to the front surface 330f of the substrate.

In some embodiments, the lower alternating dielectric stack 650-1 includes dielectric layer pairs alternatingly stacked on top of each other, where each dielectric layer pair includes a first dielectric layer 652 (also referred to as "dielectric layer") and a second dielectric layer 654 (also referred to as "sacrificial layer") that is different from the first dielectric layer 652. The lower alternating dielectric stack 650-1 extends in a lateral direction that is parallel to the front surface 330f of the substrate 330.

In the lower alternating dielectric stack 650-1, first dielectric layers 652 and second dielectric layers 654 alternate in a vertical direction, perpendicular to the substrate 330. In the other words, each second dielectric layer 654 can be sandwiched between two first dielectric layers 652, and each first dielectric layer 652 can be sandwiched between two second dielectric layers 654 (except the bottommost and the topmost/uppermost layer).

The formation of the lower alternating dielectric stack 650-1 can include disposing the first dielectric layers 652 to each have the same thickness or to have different thicknesses. Example thicknesses of the first dielectric layers 652 can range from 10 nm to 500 nm, preferably from about 20 nm to about 30 nm. Similarly, the second dielectric layer 654 can each have the same thickness or have different thicknesses. Example thicknesses of the second dielectric layer 654 can range from 10 nm to 500 nm, preferably from about 25 nm to about 40 nm. It should be understood that the number of dielectric layer pairs in FIG. 6 is for illustrative purposes only and that any suitable number of layers may be included in the lower alternating dielectric stack 650-1.

In some embodiments, the first dielectric layer 652 includes any suitable insulating materials, for example, silicon oxide, silicon oxynitride, silicon nitride, TEOS or silicon oxide with F-, C-, N-, and/or H-incorporation. The first dielectric layer 652 can also include high-k dielectric materials, for example, hafnium oxide, zirconium oxide, aluminum oxide, tantalum oxide, or lanthanum oxide films. In some embodiments, the first dielectric layer 652 can be any combination of the above materials.

The formation of the first dielectric layer 652 on the substrate 330 can include any suitable deposition methods such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), thermal oxidation, nitridation, any other suitable deposition method, and/or combinations thereof.

In some embodiments, the second dielectric layer 654 includes any suitable material that is different from the first dielectric layer 652 and can be removed selectively with respect to the first dielectric layer 652. For example, the second dielectric layer 654 can include silicon oxide, silicon oxynitride, silicon nitride, TEOS, poly-crystalline silicon, poly-crystalline germanium, poly-crystalline germanium-silicon, and any combinations thereof. In some embodiments, the second dielectric layer 654 also includes amorphous semiconductor materials, such as amorphous silicon or amorphous germanium. The second dielectric layer 654 can be disposed using a similar technique as the first dielectric layer 652, such as CVD, PVD, ALD, thermal oxidation or nitridation, or any combination thereof.

In some embodiments, the first dielectric layer 652 can be silicon oxide and the second dielectric layer 654 can be silicon nitride.

In some embodiments, the lower alternating dielectric stack 650-1 can include layers in addition to the first dielectric layer 652 and the second dielectric layer 654, and can be made of different materials and/or with different thicknesses.

In addition to the lower alternating dielectric stack 650-1, in some embodiments, peripheral devices (not shown) can be formed in the periphery region 105 (see FIG. 1) on the front surface 330f of the substrate 330. In some embodiments, active device areas (not shown) can also be formed in the memory blocks 103 (see FIG. 1) on the front surface 330f of the substrate 330. The peripheral devices can include any suitable semiconductor devices, for example, metal oxide semiconductor field effect transistors (MOSFETs), diodes, resistors, capacitors, etc. The peripheral devices can be used in the design of digital, analog and/or mixed signal circuits supporting the storage function of the memory core, for example, row and column decoders, drivers, page buffers, sense amplifiers, timing and controls. The active device areas in the memory blocks are surrounded by isolation structures, such as shallow trench isolation. Doped regions, such as p-type doped and/or n-type doped wells, can be formed in the active device area according to the functionality of the array devices in the memory blocks.

In some embodiments, the 3D memory structure 600 can also include a bottom semiconductor layer 656 disposed in between two first dielectric layers 652 on the substrate 330. The bottom semiconductor layer 656 can include a crystalline or poly-crystalline semiconductor material, for example, silicon, silicon germanium, germanium, gallium arsenide, gallium nitride, III-V compound, or any combination thereof. The bottom semiconductor layer 656 can be deposited by any suitable thin film deposition technique (e.g., ALD, CVD, PVD). The bottom semiconductor layer 656 can also be epitaxially grown from the substrate 330. In some embodiments, the bottom semiconductor layer 656 can be selectively grown from an exposed surface of the substrate 330, for example a doped region (not shown in FIG. 6) in the substrate 330. The doped region can be formed by ion implantation using p-type or n-type dopants, for example boron, phosphorus, arsenic, or any combination thereof. The ion implantation can be performed before the deposition of the lower alternating dielectric stack 650-1. In some embodiments, the bottom semiconductor layer 656 can be formed by other techniques, for example, wafer bonding (e.g., to form silicon-on-insulator substrate).

As shown in FIG. 6, the 3D memory structure 600 include lower channel holes 336-1 formed in the lower alternating dielectric stack 650-1, wherein the lower channel holes 336-1 penetrate through the lower alternating dielectric stack 650-1 and extend into the substrate 330. In some embodiments, the lower channel holes 336-1 can be formed in the channel structure region 211 (see FIGS. 2 and 3). In some embodiments, the lower channel holes 336-1 can also be formed in a portion of the staircase region 210 (see FIGS. 2 and 3) that is adjacent to the channel structure region 211 to improve process window (e.g., to provide uniformity in forming the lower channel holes 336-1). In some embodiments, the lower channel holes 336-1 can have a cylinder shape.

In some embodiments, forming of the lower channel holes 336-1 includes processes such as photolithography and etching. In some embodiments, a carbon-based polymer material or a hard mask can be used in addition to photoresist for the etching process. The hard mask can include silicon oxide, silicon nitride, TEOS, silicon-containing antireflective coating (SiARC), amorphous silicon, or polycrystalline silicon, or any combination thereof. The etching process to form the lower channel holes 336-1 can include a dry etching, a wet etching, or a combination thereof. In some embodiments, the lower alternating dielectric stack 650-1 can be etched using an anisotropic etching such as a reactive ion etch (ME). In some embodiments, fluorine or chlorine based gases such as carbon-fluorine ($CF_4$), hexafluoroethane ($C_2F_6$), $CHF_3$, $C_3F_6$, $Cl_2$, $BCl_3$, etc., or any combination thereof, can be used. The methods and etchants to etch the first dielectric layer 652 and the second dielectric layers 654 should not be limited by the embodiments of the present disclosure.

As shown in FIG. 6, the 3D memory structure 600 also includes an upper alternating dielectric stack 650-2 disposed on the lower alternating dielectric stack 650-1. In some embodiments, the upper alternating dielectric stack 650-2 can be similar to the lower alternating dielectric stack 650-1 and can also include dielectric layer pairs alternatingly stacked on top of each other. In some embodiment, each dielectric layer pair of the upper alternating dielectric stack can also include the first dielectric layer 652 and the second dielectric layer 654. In this example, the lower alternating dielectric stack 650-1 and the upper alternating dielectric stack 650-2 together can be referred to as an alternating dielectric stack 650 (also referred to as a "first dielectric stack"). In some embodiments, the alternating dielectric stack 650 can also include layers other than the first dielectric layer 652 and the second dielectric layer 654. For example, the alternating dielectric stack 650 can also include an interface layer (not shown) located between the lower alternating dielectric stack 650-1 and the upper alternating dielectric stack 650-2. The interface layer can include an insulating material similar to the first dielectric layer 652 and/or the second dielectric layer 654. The interface layer can include an insulating material different from the first dielectric layer 652 and/or the second dielectric layer 654.

After disposing the upper alternating dielectric stack 650-2, upper channel holes 336-2 can be formed, where the upper channel hole 336-2 can be substantially aligned with the lower channel hole 336-1 to form a channel hole 336 that penetrates vertically through the entire alternating dielectric stack 650. In some embodiments, the channel hole 336 extends further into the substrate 330.

Similar techniques can be used to form the upper channel holes 336-2 and the lower channel holes 336-1, e.g., including processes such as photolithography and etching. The etching process to form the upper channel holes 336-2 can also include a dry etching, a wet etching, or a combination thereof. In some embodiments, the upper alternating dielectric stack 650-2 can be etched using an anisotropic etching such as a reactive ion etch (ME). In some embodiments, fluorine or chlorine based gases such as carbon-fluorine ($CF_4$), hexafluoroethane ($C_2F_6$), $CHF_3$, $C_3F_6$, $Cl_2$, $BCl_3$, etc., or any combination thereof, can be used. The methods and etchants to etch the first dielectric layer 652 and the second dielectric layers 654 should not be limited by the embodiments of the present disclosure.

The photolithography process used to pattern the upper channel holes can have an overlay tolerance such that the upper channel holes 336-2 are substantially aligned with the lower channel holes 336-1 to form the channel holes 336 penetrating both the upper alternating dielectric stack 650-2 and the lower alternating dielectric stack 650-1. As such, the upper channel holes 336-2 and the lower channel holes 336-1 can be connected, where each channel hole 336 includes the lower channel hole 336-1 at bottom and the upper channel hole 336-2 on the top.

After forming the channel holes 336 extending vertically through the alternating dielectric stack 650, the memory film 337 can be disposed a sidewall of the channel holes 336. In some embodiments, the memory film 337 can be a composite layer including a tunneling layer, a storage layer (also known as "charge trap/storage layer"), and a blocking layer. In some embodiments, the tunneling layer, the storage layer, and the blocking layer are arranged along a direction from a center of the channel hole 336 toward the outer of the channel hole 336 in the above order. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 337 includes ONO dielectrics (e.g., a tunneling layer including silicon oxide, a storage layer including silicon nitride, and a blocking layer including silicon oxide). The memory film 337 can be formed by using a thin film deposition process, such as ALD, CVD, PVD, sputtering or any other suitable process. In some embodiments, a thickness of the memory film 337 can be in a range from about 10 nm to about 50 nm.

Next, the channel layer 338 and the core filling film 339 can be disposed sequentially in the channel holes 336, where the channel layer 338 covers a sidewall of the memory film 337 inside the channel hole 336. The channel layer 338 can be any suitable semiconductor material such as silicon. In some embodiments, the channel layer 338 can be amorphous, polysilicon, or single crystalline silicon. The channel layer 338 can be formed by any suitable thin film deposition processes including, but not limited to, CVD, PVD, ALD, sputtering, evaporation, or a combination thereof. In some embodiments, a thickness of the channel layer 338 can be in a range from about 10 nm to about 30 nm.

In some embodiments, the core filling film 339 can be disposed to fill the channel holes 336. In some embodiments, the middle of the core filling film 339 can include one or more seams (not shown). The core filling film 339 can be any suitable insulator, for example, silicon oxide, silicon nitride, silicon oxynitride, spin-on-glass, boron or phosphorus doped silicon oxide, carbon-doped oxide (CDO or SiOC or SiOC:H), fluorine doped oxide (SiOF), or any combination thereof. The core filling film 339 can be deposited by using, for example, ALD, PVD, CVD, spin-coating, sputtering, or any other suitable film deposition techniques. The core filling film 339 can also be formed by using repeated deposition and etch-back processes. The etch-back process can include, but not limited to, a wet etching, a dry etching, or a combination thereof.

In some embodiments, the upper channel holes 336-2 and the lower channel holes 336-1 can have similar shapes (e.g., cylindrical) and similar dimensions. The upper channel holes 336-2 can be aligned with the lower channel holes 336-1.

In some embodiments, after forming the lower channel holes 336-1 and before disposing the upper alternating dielectric stack 650-2, a sacrificial filler (not shown) can be disposed inside the lower channel hole 336-1. The sacrificial filler inside the lower channel holes 336-1 can be removed after forming the upper channel holes 336-2 before disposing the memory film 337. The sacrificial filler can be used to protect the lower channel holes 336-1 during the formation of the upper channel holes 336-2. The sacrificial filler can be any suitable material that can be removed selectively to the first dielectric layer 652 and the second dielectric layer 654.

In some embodiments, the 3D memory structure 600 also includes a channel top plug 658 at a top portion of the upper channel hole 336-2. The channel top plug 658 can form electrical contact with the channel layer 338 inside the channel hole 336. The channel top plug 658 can be amorphous or polycrystalline silicon. In some embodiments, the channel top plug 658 can also include metal, metal alloy and/or metal silicide, for example, tungsten, titanium, tantalum, tungsten nitride, titanium nitride, tantalum nitride, nickel silicide, cobalt silicide, tungsten silicide, titanium silicide, or a combination thereof. The channel top plug 658 can be formed by a recess etching process followed by thin film deposition. The recess etching process includes wet etch, dry etch or a combination thereof. The thin film deposition includes CVD, PVD, ALD, sputtering, or any other suitable processes.

In some embodiments, the 3D memory device 600 can include an epitaxial plug (not shown) at bottom of the lower channel hole 336-1. The epitaxial plug can include any suitable semiconductor material, such as silicon, silicon germanium, germanium, gallium arsenide, gallium nitride, III-V compound, or any combination thereof. The epitaxial plug can be epitaxially grown from the substrate 330. In some embodiments, the epitaxial plug can also include a polycrystalline semiconductor material, for example, polycrystalline silicon. In some embodiments, a portion of the memory film 337 at the bottom of the lower channel hole 336-1 can be removed such that the channel layer 338 can directly contact with the epitaxial plug.

As shown in FIG. 6, after forming the channel hole 336 and disposing the memory film 337, the channel layer 338 and the core filling film 339 inside the channel hole 336, a channel structure 660 can be formed penetrating through the alternating dielectric stack 650. In some embodiments, a planarization process, for example RIE etch-back and/or chemical mechanical polishing (CMP) can be used to form a coplanar surface between alternating dielectric stack 650 and the channel structure 660.

Referring to FIG. 5, at process step S530, a top dielectric stack and an etch-stop layer can be disposed sequentially on the upper alternating dielectric stack. A cross-sectional view of an exemplary 3D memory structure 700 is shown in FIG. 7 according to the process step S530.

Figure 7:
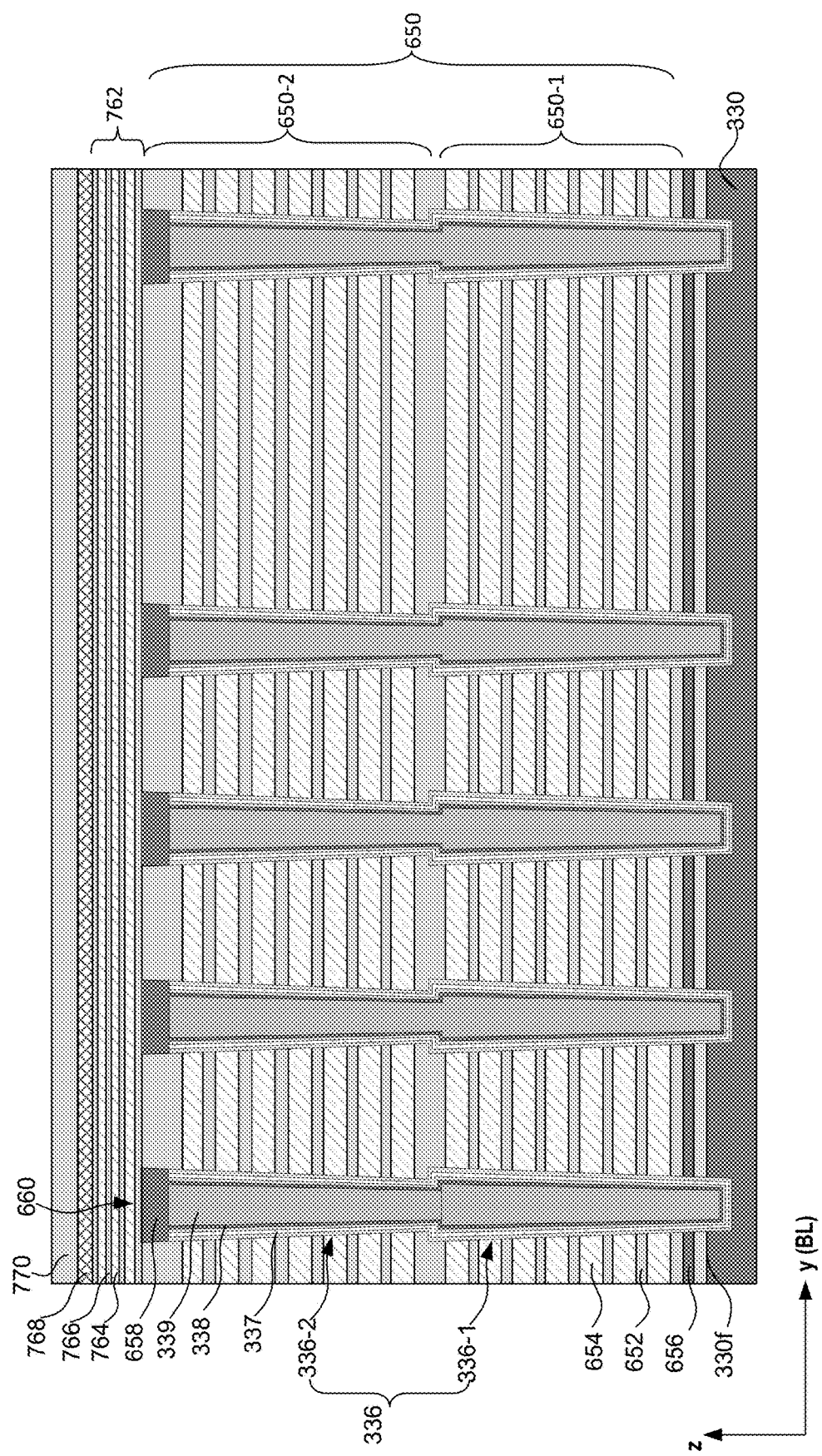

As shown in FIG. 7, the top dielectric stack 762 (also referred to as a second dielectric stack) can be disposed on the upper alternating dielectric stack 650-2. In some embodiments, the top dielectric stack 762 can include a third dielectric layer 766 (also referred to as top dielectric layer) and a fourth dielectric layer 764 (also referred to as top sacrificial layer) that is different from the third dielectric layer 766.

Similar to the alternating dielectric stack 650, the top dielectric stack 762 also extends in a lateral direction that is parallel to the front surface 330f of the substrate 330. In the top dielectric stack 762, the third dielectric layers 766 and the fourth dielectric layers 764 can be alternatingly stacked in a vertical direction, perpendicular to the substrate 330. In the other words, each fourth dielectric layer 764 can be sandwiched between two third dielectric layers 766, and each third dielectric layer 766 can be sandwiched between two fourth dielectric layers 764 (except the bottommost and the topmost/uppermost layer). It is noted that the numbers of the third dielectric layers 766 and the fourth dielectric layers 764 in the top dielectric stack 762 are not limited to the example shown in FIG. 7. In some embodiments, the top dielectric stack 762 can include at least one fourth dielectric layer 764 sandwiched between two third dielectric layers 766.

The formation of the top dielectric stack 762 can include disposing the third dielectric layers 766 to each have the same thickness or to have different thicknesses. Example thicknesses of the third dielectric layers 766 can range from 10 nm to 500 nm, preferably from about 20 nm to about 30 nm. Similarly, the fourth dielectric layer 764 can each have the same thickness or have different thicknesses. Example thicknesses of the fourth dielectric layer 764 can range from 10 nm to 500 nm, preferably from about 25 nm to about 40 nm. It should be understood that the number of third and fourth dielectric layers in FIG. 7 is for illustrative purposes only and that any suitable number of layers may be included in the top dielectric stack 762. In some embodiments, the top dielectric stack 762 includes at least one pair of alternately stacked third dielectric layer 766 and the fourth dielectric layer 764.

In some embodiments, the third dielectric layer 766 includes any suitable insulating materials, for example, silicon oxide, silicon oxynitride, silicon nitride, TEOS or silicon oxide with F-, C-, N-, and/or H-incorporation. The third dielectric layer 766 can also include high-k dielectric materials, for example, hafnium oxide, zirconium oxide, aluminum oxide, tantalum oxide, or lanthanum oxide films.

In some embodiments, the third dielectric layer 766 can be any combination of the above materials. The formation of the third dielectric layer 766 can include any suitable deposition methods such as, CVD, PVD, ALD, sputtering, thermal oxidation, nitridation, any other suitable deposition method, and/or combinations thereof.

In some embodiments, the fourth dielectric layer 764 includes any suitable material that is different from the third dielectric layer 766 and can be removed selectively with respect to the third dielectric layer 766. For example, the fourth dielectric layer 764 can include silicon oxide, silicon oxynitride, silicon nitride, TEOS, poly-crystalline silicon, poly-crystalline germanium, poly-crystalline germanium-silicon, and any combinations thereof. In some embodiments, the fourth dielectric layer 764 also includes amorphous semiconductor materials, such as amorphous silicon or amorphous germanium. The fourth dielectric layer 764 can be disposed using a similar technique as the third dielectric layer 766, such as CVD, PVD, ALD, thermal oxidation or nitridation, or any combination thereof.

In some embodiments, the third dielectric layer 766 and the fourth dielectric layer 764 can have a same dielectric material as the first dielectric layer 652 and the second dielectric layer 654, respectively. In some embodiments, the third dielectric layer 766 and the first dielectric layer 652 can have different dielectric materials, and the fourth dielectric layer 764 and the second dielectric layer 654 can also have different dielectric materials. In some embodiments, the third dielectric layer 766 can be silicon oxide and the fourth dielectric layer 764 can be silicon nitride.

As shown in FIG. 7, an etch-stop layer 768 can be disposed on the top dielectric stack 762, followed by a first capping layer 770. In some embodiments, the etch-stop layer 768 includes any suitable material that is different from the first capping layer 770, where the first capping layer 770 can be etched selectively with respect to the etch-stop layer 768. Namely, the first capping layer 770 can be etched using an etching process, where an etch rate of the first capping layer 770 can be much higher than an etch rate of the etch-stop layer 768.

In some embodiments, the etch-stop layer 768 can be disposed directly on the third dielectric layer 766 (see FIG. 7). Namely, the etch-stop layer 768 can be sandwiched between the third dielectric layer 766 and the first capping layer 770. In this example, the etch-stop layer 768 includes any suitable material that is different from the third dielectric layer 766 such that the etch-stop layer 768 can be removed selectively with respect to the third dielectric layer 766.

In some embodiments, the etch-stop layer can also be a first top sacrificial layer that is the farthest from the substrate in the top sacrificial layers (i.e., topmost sacrificial layer). In this example, the top dielectric stack 762 includes at least two pairs of alternatingly stack top dielectric layers and top sacrificial layers. In this example, the etch-stop layer 768 can be sandwiched between two third dielectric layers 766 (e.g., the capping layer 770 can include the third dielectric layer 766).

The etch-stop layer 768 can include silicon oxide, silicon oxynitride, silicon nitride, TEOS, poly-crystalline silicon, poly-crystalline germanium, poly-crystalline germanium-silicon, and any combinations thereof. In some embodiments, the etch-stop layer 768 also includes amorphous semiconductor materials, such as amorphous silicon or amorphous germanium. The etch-stop layer 768 can also include high-k dielectric materials, for example, hafnium oxide, zirconium oxide, aluminum oxide, tantalum oxide, or lanthanum oxide films. In some embodiments, the etch-stop layer 768 can include a combination of the materials above. The etch-stop layer 768 can be disposed using a similar technique as the third dielectric layer 766, such as CVD, PVD, ALD, thermal oxidation or nitridation, or any combination thereof.

The first capping layer 770 includes any suitable insulating materials, for example, silicon oxide, silicon oxynitride, silicon nitride, TEOS or silicon oxide with F-, C-, N-, and/or H-incorporation. In some embodiments, the first capping layer 770 can be any combination of the above materials. The first capping layer 770 can be disposed by any suitable deposition methods such as CVD, PVD, ALD, sputtering, thermal oxidation, nitridation, and/or combinations thereof.

In some embodiments, the etch-stop layer 768 includes silicon nitride and the first capping layer 770 includes silicon oxide.

Referring to FIG. 5, at process step S535, top select structures can be formed in the top dielectric stack. A cross-sectional view of an exemplary 3D memory structure 800 is shown in FIG. 8 according to the process step S535.

Figure 8:
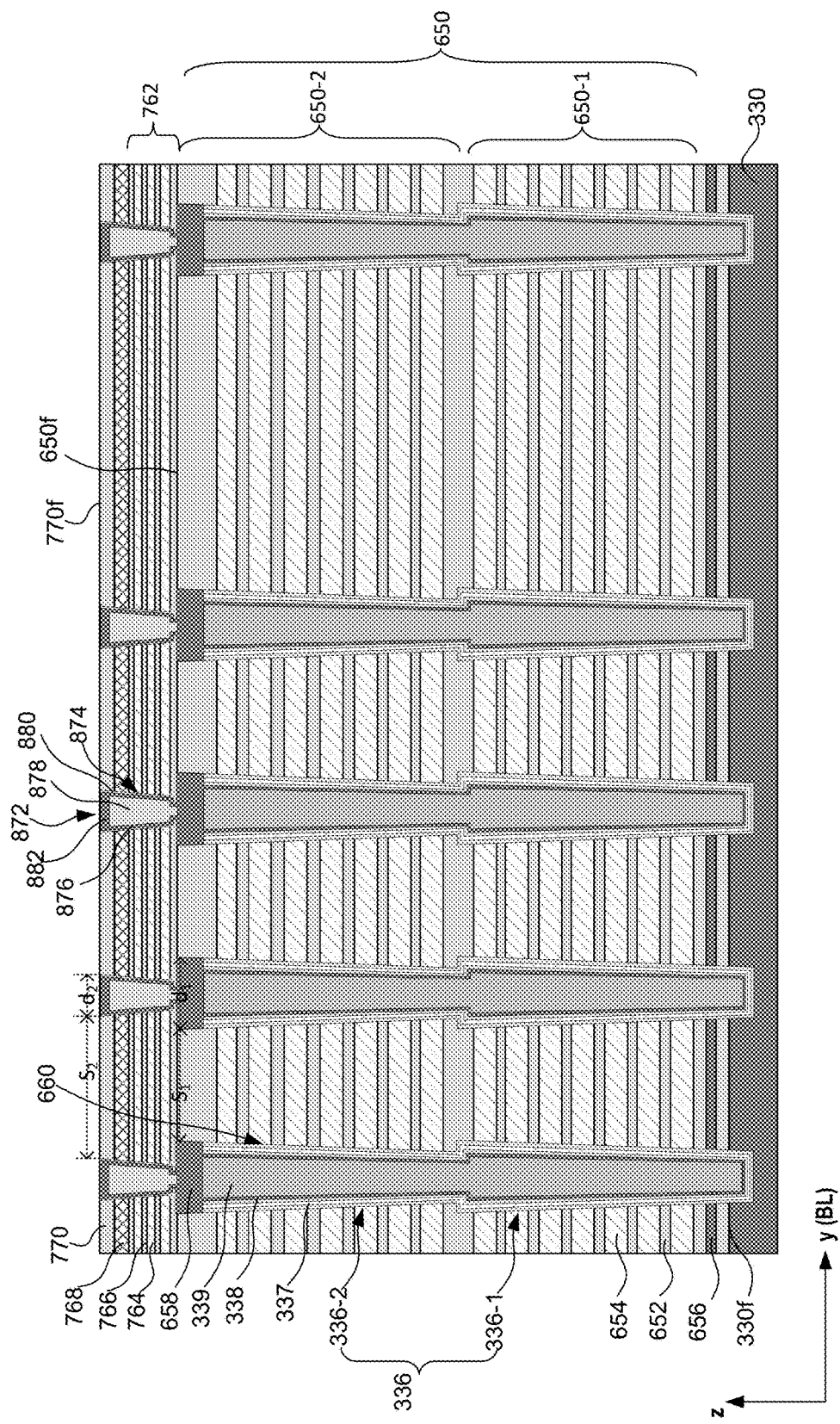

As shown in FIG. 8, the 3D memory structure 800 includes the top select structures 872 penetrating through the top dielectric stack 762 and extending into the channel top plugs 658 of the channel structures 660. In some embodiments, the top select structures 872 also penetrate through the first capping layer 770 and the etch-stop layer 768. The top select structures 872 can be substantially aligned with the channel structures 660. In some embodiments, the top select structures 872 can also have a cylindrical shape. A diameter "$d_2$" at a top of the top select structures 872 can be smaller than a diameter "$d_1$" at a top of the channel structures 660 to produce a spacing "$S_2$" between adjacent top select structures 872 larger than a spacing "$S_1$" between two adjacent channel structures 660. As shown below in subsequent processes, larger spacing "$S_2$" between the top select structures 872 can provide larger process window to form TSG cut 220 without intersecting the top select structure 872 or channel structure 660.

The forming of the top select structures 872 includes the following steps: forming top select openings 874 (i.e., first openings) that penetrate through the first capping layer 770, the etch-stop layer 768 and the top dielectric stack 762; disposing a top select channel layer 876 on sidewalls of the top select openings 874; and disposing a top select filling material 878 inside the top select openings 874.

The top select openings 874 can be substantially aligned with the channel holes 336. The top select openings 874 can penetrate vertically through the first capping layer 770, the etch-stop layer 768 and the top dielectric stack 762. In some embodiments, the top select openings 874 extend further into the channel top plug 658. The top select openings 874 can be formed by processes such as photolithography and etching. The etching process to form the top select openings 874 can include a dry etching, a wet etching, or a combination thereof.

In some embodiments, after forming the top select openings 874, a top select dielectric layer 880 can be disposed sidewalls of the top select openings 874. In some embodiments, the top select dielectric layer 880 can include silicon oxide, silicon nitride, silicon oxynitride, high dielectric constant (high-k) dielectrics, or any combination thereof. The top select dielectric layer 880 can be formed by using a thin film deposition process, such as ALD, CVD, PVD, sputtering or any other suitable process. In some embodiments, a thickness of the top select dielectric layer 880 can be in a range from about 10 nm to about 50 nm.

Next, the top select channel layer 876 can be disposed in the top select opening 874, where the top select channel layer 876 covers a sidewall of the top select dielectric layer 880 inside the top select opening 874. The top select channel layer 876 can be any suitable semiconductor material such as silicon. In some embodiments, the top select channel layer 876 can be amorphous, polysilicon, or single crystalline silicon. The top select channel layer 876 can be formed by any suitable thin film deposition processes including, but not limited to, CVD, PVD, ALD, sputtering, evaporation, or a combination thereof. In some embodiments, a thickness of the top select channel layer 876 can be in a range from about 10 nm to about 30 nm.

Then, the top select filling material 878 can be disposed to fill the top select opening 874. The top select filling material 878 can be any suitable insulator, for example, silicon oxide, silicon nitride, silicon oxynitride, spin-on-glass, boron or phosphorus doped silicon oxide, carbon-doped oxide (CDO or SiOC or SiOC:H), fluorine doped oxide (SiOF), or any combination thereof. The top select filling material 878 can be deposited by using, for example, ALD, PVD, CVD, spin-coating, sputtering, or any other suitable film deposition techniques. The top select filling material 878 can also be formed by using repeated deposition and etch-back processes. The etch-back process can include, but not limited to, a wet etching, a dry etching, or a combination thereof.

In some embodiments, a portion of the top select dielectric layer 880 at a bottom of the top select opening 874 can be removed before disposing the top select channel layer 876 such that the top select channel layer 876 can be connected to the channel top plug 658 of the channel structure 660. As a result, the channel layer 338 of the channel structure 660 can be connected to the top select channel layer 876 of the top select structure 872.

In some embodiments, the top select structure 872 also includes a top select plug 882 at a top portion of the top select opening 874. The top select plug 882 can form electrical contact with the top select channel layer 876 on the sidewall of the top select opening 874. As such, the top select plug 882 can also be connected with the channel top plug 658 and the channel layer 338 inside the channel hole 336. The top select plug 882 can be amorphous or polycrystalline silicon. In some embodiments, the top select plug 882 can also include metal, metal alloy and/or metal silicide, for example, tungsten, titanium, tantalum, tungsten nitride, titanium nitride, tantalum nitride, nickel silicide, cobalt silicide, tungsten silicide, titanium silicide, or a combination thereof. The top select plug 882 can be formed by a recess etching process followed by thin film deposition. The recess etching process includes wet etch, dry etch or a combination thereof. The thin film deposition includes CVD, PVD, ALD, sputtering, or any other suitable processes.

As shown in FIG. 8, after forming the top select structure 872, a planarization process, for example RIE etch-back and/or chemical mechanical polishing (CMP) can be used to form a coplanar surface between the first capping layer 770 and the top select structure 872.

After completing the process step 535, the top select structure 872 can be substantially aligned with the channel structure 660, where the top select structure 872 can include the top select plug 882 having a diameter smaller than a diameter of the channel top plug 658. For example, the top select plug 882 has the diameter "$d_2$" measured at a surface 770*f* of the first capping layer 770, which is smaller than the diameter "$d_1$" of the channel top plug 658 measured at a surface 650*f* of the alternating dielectric stack 650. Accordingly, the spacing "$S_2$" between adjacent top select plugs 882 is larger than the spacing "$S_1$" between adjacent channel top plugs 658. As discussed previously, a critical dimension ("CD")—a dimension on a surface parallel to the front surface 330*f* of the substrate 330—can determine a process window for fabricating the 3D memory structure. Therefore, by forming the top select structure 872 on top of the channel structure 660, a process window of forming TSG cut 220 in the spacing "$S_2$" between top select structures 872 can be larger than forming TSG cut 220 in the spacing "S1" between channel structures 660.

In some embodiments, after forming the channel structures 660 and the top select structures 872, a staircase structure (not shown in FIG. 8) can be formed in the alternating dielectric stack 650 and the top dielectric stack 762. Each staircase step, which terminates at a shorter length than the staircase step underneath, can provide electrical connections to a gate electrode form in the subsequent processes. For simplicity, details of the staircase structure and its fabrication method are not described in the present disclosure.

Referring to FIG. 5, at process step S540, a gate line slit (GLS) trench can be formed in the etch-stop layer. A cross-sectional view of an exemplary 3D memory structure 900 is shown in FIG. 9, according to the process step S540.

Figure 9:
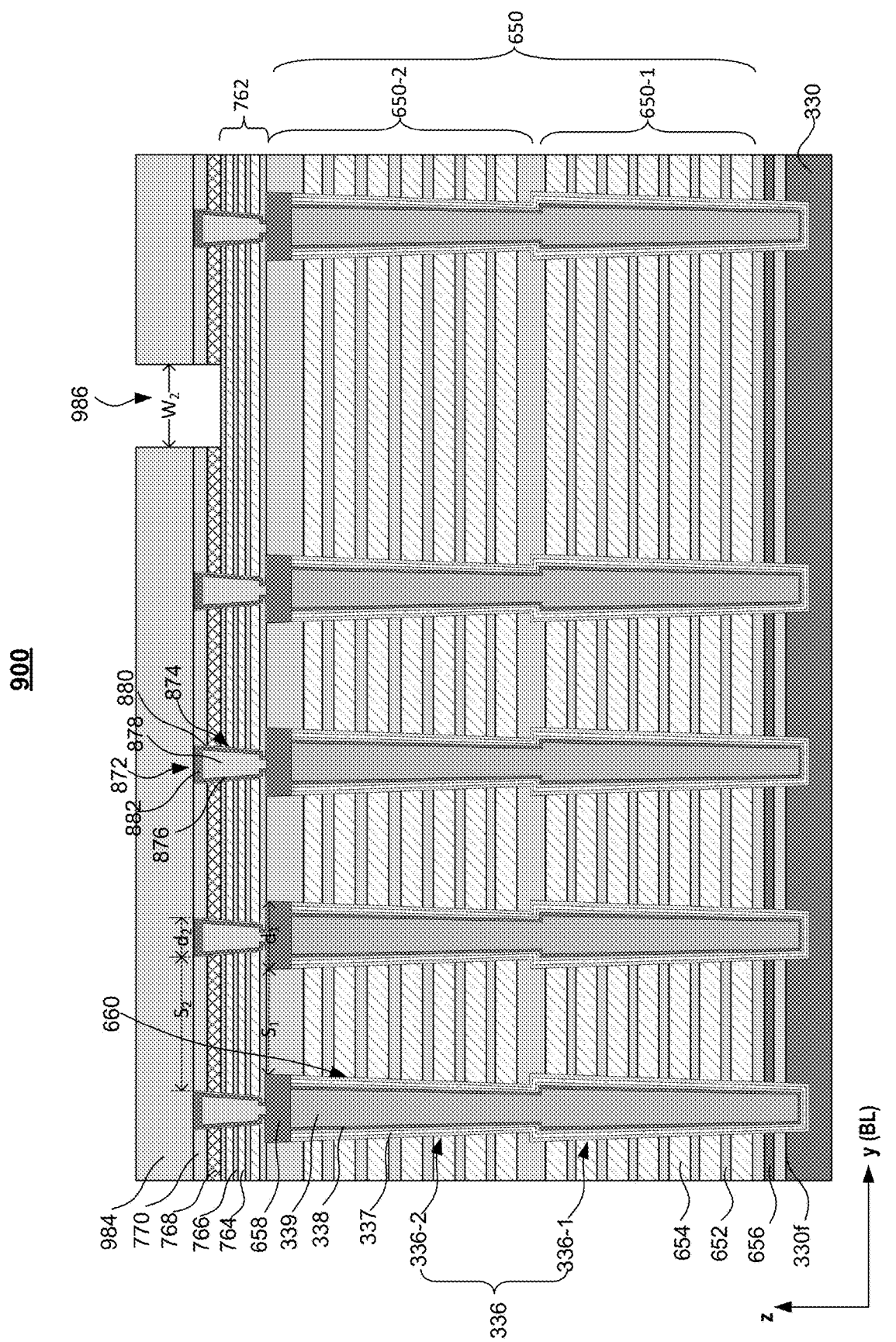

As shown in FIG. 9, a second capping layer 984 can be disposed on the first capping layer 770. Then, a GLS trench 986 can be formed in the etch-stop layer 768, the first capping layer 770 and the second capping layer 984.

The second capping layer 984 can be similar to the first capping layer 770, and can include a similar material disposed by a similar technique. The second capping layer 984 covers the top select structures 872.

In a direction ("z-direction") perpendicular to the substrate 330, the GLS trench 986 penetrates through the second capping layer 984, the first capping layer 770 and the etch-stop layer 768 to expose the third dielectric layer 766 underneath the etch-stop layer 768. In some embodiments, the GLS trench 986 extends into an uppermost third dielectric layer 766 without exposing or penetrating through an uppermost fourth dielectric layer 764 in the top dielectric stack 762. The GLS trench 986 can be formed by any suitable etching process, for example, dry etching, wet etching and/or a combination thereof.

In a direction ("x-direction") parallel to the substrate 330, the GLS trench 986 extends laterally, similar to the GLS 216 in FIG. 2. The GLS trench 986 include a width "$w_2$" larger than the GLS 216 to be formed in the subsequent process steps.

Referring to FIG. 5, at process step S545, a GLS trench isolation can be formed. A cross-sectional view of an exemplary 3D memory structure 1000 is shown in FIG. 10, according to the process step S545.

Figure 10:
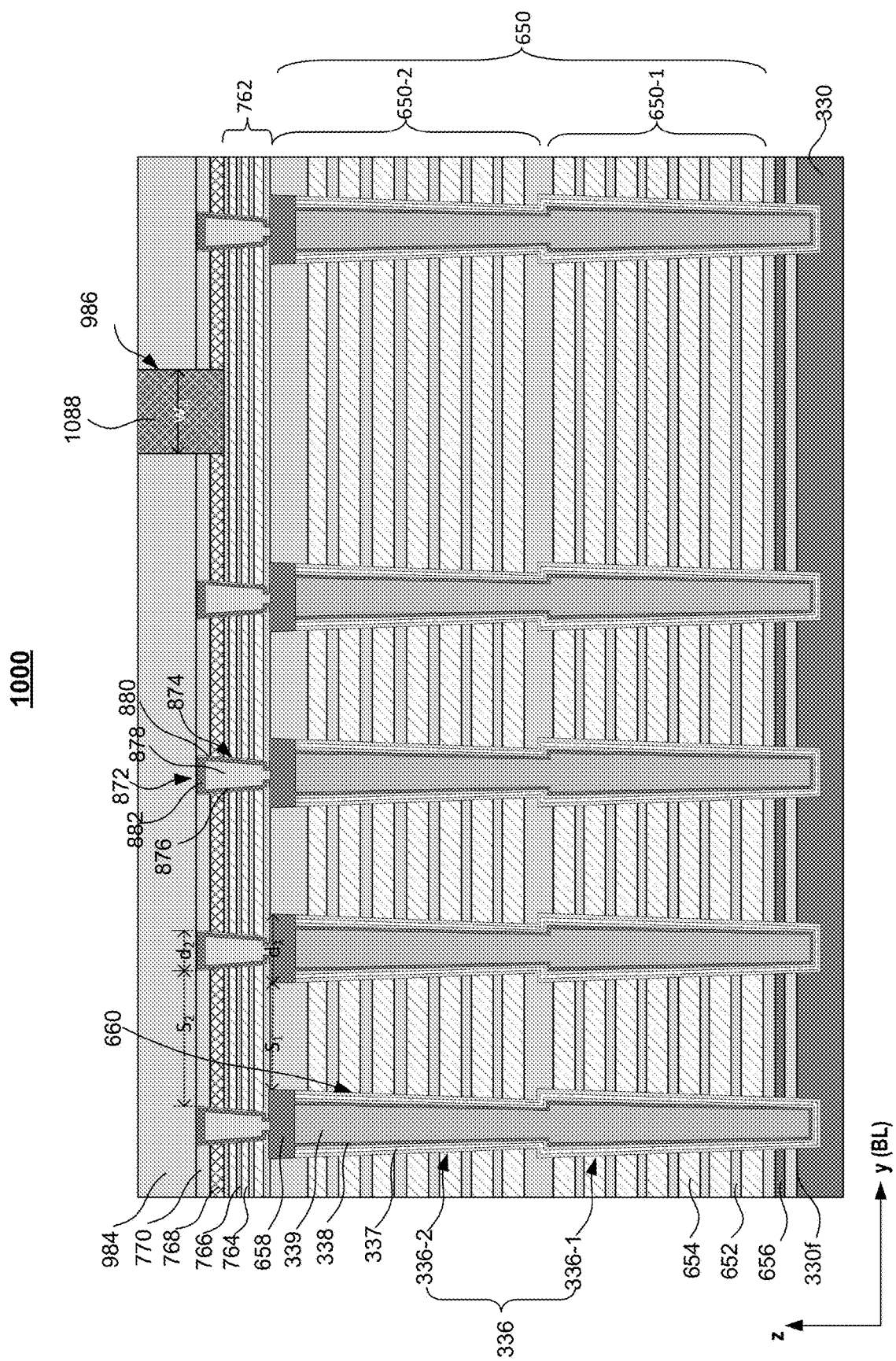

As shown in FIG. 10, the 3D memory structure 1000 includes a GLS trench isolation 1088 extending vertically through the second capping layer 984, the first capping layer 770 and the etch-stop layer 768. The GLS trench isolation 1088 can be formed by disposing, inside the GLS trench 986, a first filling layer that is different from the etch-stop layer 768 and the fourth dielectric layer 764. The first filling layer of the GLS trench isolation 1088 can include silicon oxide, silicon oxynitride, silicon nitride, TEOS, high-k dielectric materials (e.g., hafnium oxide, zirconium oxide, aluminum oxide, tantalum oxide, or lanthanum oxide films, etc.), or a combination thereof. The first filling layer for the GLS trench isolation can be disposed using any suitable technique, such as CVD, PVD, ALD, thermal oxidation or nitridation, or any combination thereof. In some embodiments, the first filling layer and the top dielectric layer (i.e., the third dielectric layer) are formed using the same material. In some embodiments, the GLS trench isolation 1088 includes silicon oxide. In some embodiments, the first filling layer fills up the GLS trench.

In some embodiments, an etching selection ratio of the top sacrificial layer 764 (i.e., the fourth dielectric layer) over the first filling layer (i.e., the GLS trench isolation 1088) is greater than a predetermined value so as to retain the first filling layer when the top sacrificial layer is removed.

In some embodiments, a planarization process (e.g., CMP) can be performed to form a coplanar surface between the GLS trench isolation 1088 and the second capping layer 984.

As discussed previously, the GLS trench 986 has the width "$w_2$." Therefore, the GLS trench isolation 1088 also includes a width similar to the width "$w_2$."

Referring to FIG. 5, at process step S550, a GLS opening can be formed, where the GLS opening penetrates through the GLS trench isolation, the top dielectric stack and the alternating dielectric stack. A cross-sectional view of an exemplary 3D memory structure 1100 is shown in FIG. 11, according to the process step S550.

Figure 11:
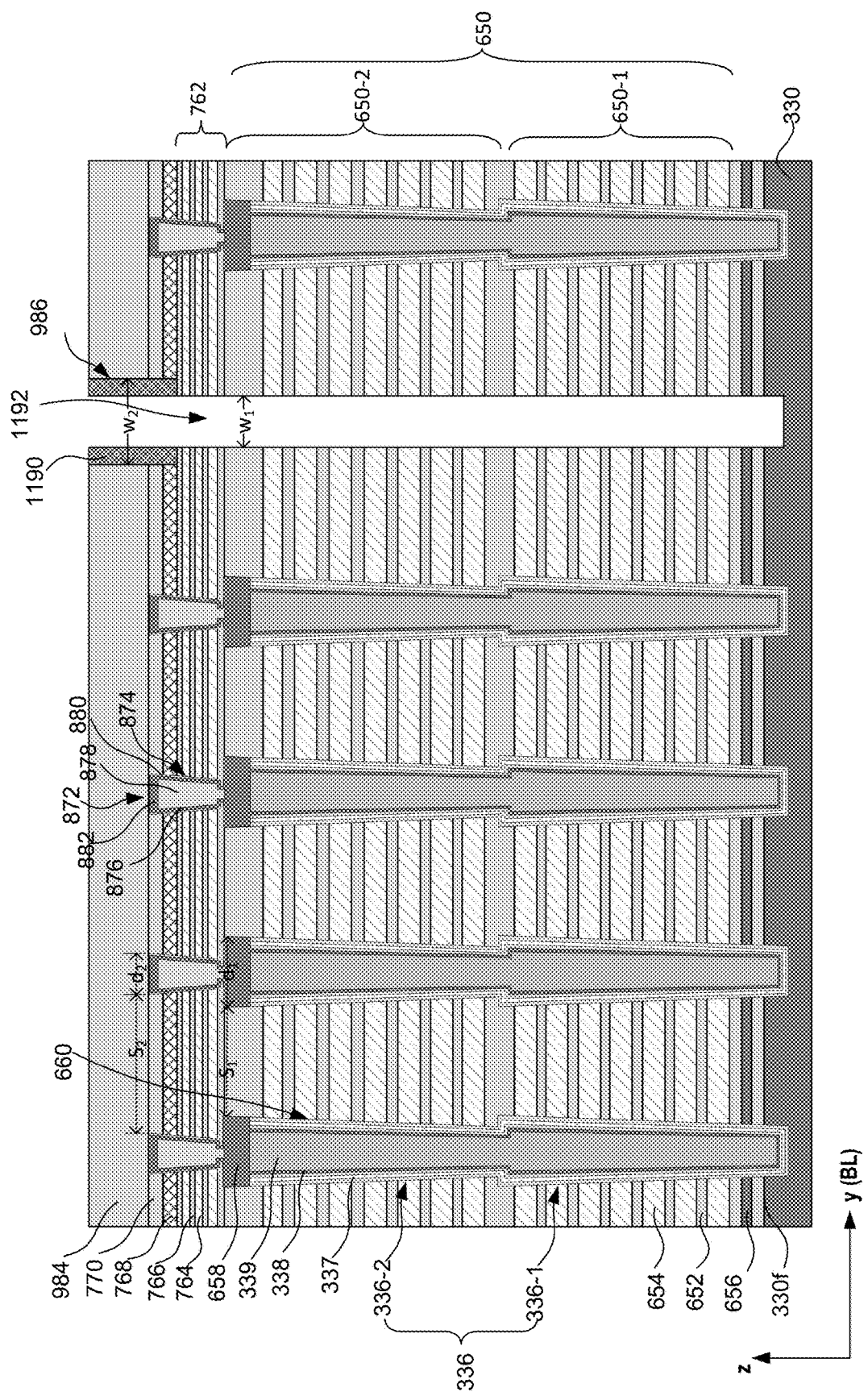

As shown in FIG. 11, the 3D memory structure 1100 includes a GLS opening 1192 penetrating vertically through the GLS trench isolation 1088, the top dielectric stack 762 and the alternating dielectric stack 650. In some embodiments, the GLS opening 1192 extends further into the substrate 330. The GLS opening 1192 includes a width "$w_1$" at a top, e.g., in the GLS trench isolation 1088, which determines a width of the GLS 216 formed in the subsequent processes. In some embodiments, the GLS 216 extends laterally along the x-direction (see FIG. 2), and thereby the GLS opening 1192 also extends laterally along the x-direction. In the present disclosure, the width "$w_1$" of the GLS opening 1192 in the GLS trench isolation 1088 is smaller than the width "$w_2$" of the GLS trench isolation 1088. The GLS opening 1192 can be substantially aligned to the GLS trench isolation 1088 to form a GLS trench spacer 1190 on a sidewall of the GLS trench 986. The GLS trench spacer 1190 covers a sidewall of the second capping layer 984, a sidewall of the first capping layer 770 and a sidewall of the etch-stop layer 768. In some embodiments, the GLS trench spacer 1190 penetrates through the etch-stop layer in a direction perpendicular to the substrate and terminates above the uppermost fourth dielectric layer 764 away from the substrate. A bottom portion of the GLS trench spacer 1190 contacts the third dielectric layer 766 that is directly underneath the etch-stop layer 768.

As such, the etch-stop layer 768 is surrounded by the first capping layer 770 on a top, the GLS trench spacer 1190 on a side and the third dielectric layer 766 at a bottom. As discussed previously, the GLS trench isolation 1088 and thereby the GLS trench spacer 1190 includes an insulating material different from the etch-stop layer 768. The GLS trench spacer 1190 has an etch rate much lower than that of the second dielectric layers 654 and the fourth dielectric layers 764. Therefore, the etch-stop layer 768 can be protected during the subsequent etching process that removes the second dielectric layers 654 and the fourth dielectric layers 764 through the GLS opening 1192.

The GLS opening 1192 can be formed by a suitable etching process, for example, dry etching, wet etching, or a combination thereof. As shown in FIG. 2, the GLS opening 1192 (and the GLS 216) can separate a memory block into multiple memory fingers.

Figure 12:
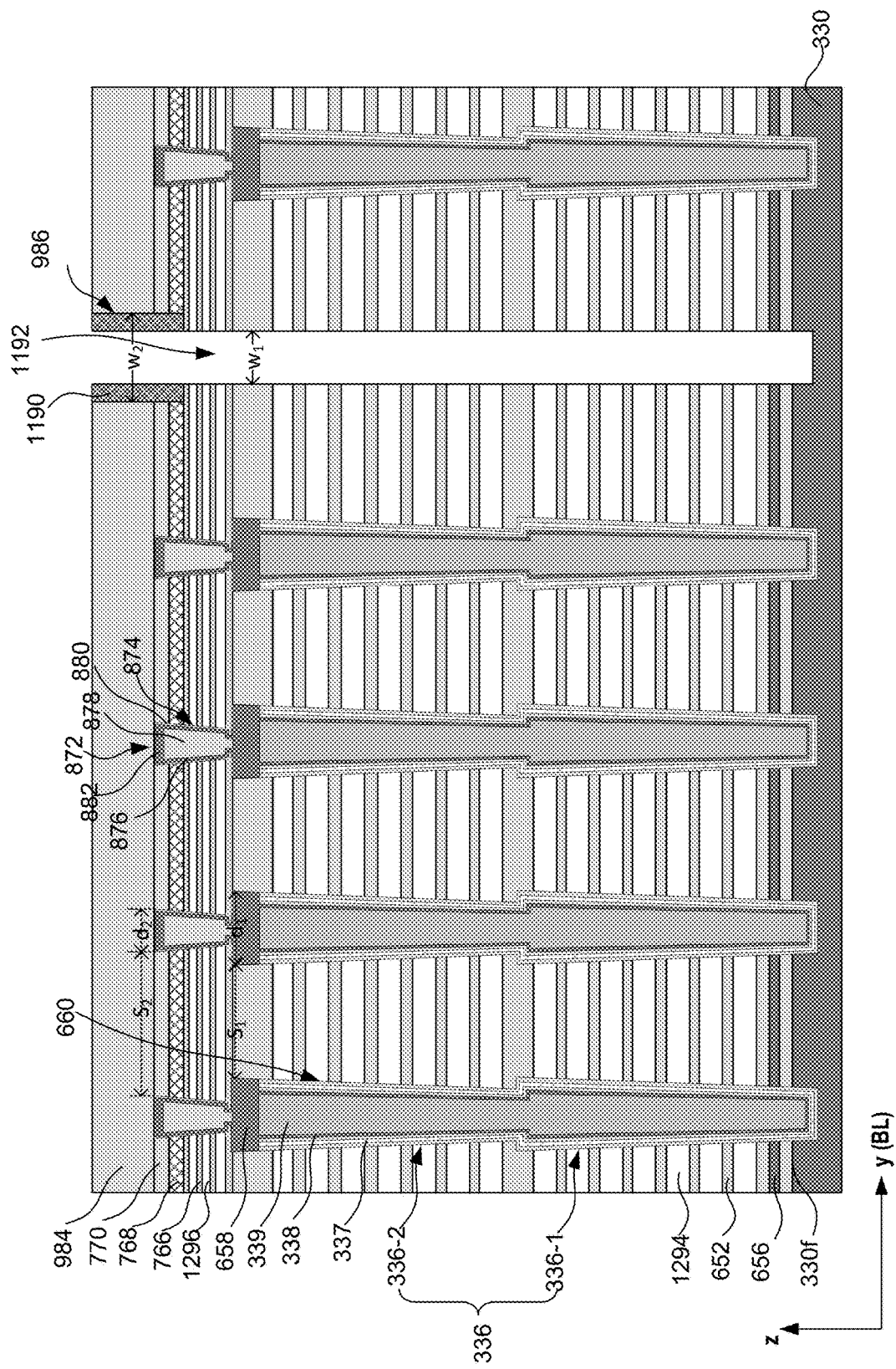

Referring to FIG. 5, at process step S555, the second dielectric layers 654 in the alternating dielectric stack 650 and the fourth dielectric layers 764 in the top dielectric stack 762 can be removed through the GLS opening 1192 to form a first set of lateral tunnels 1294 and a second set of lateral tunnels 1296, respectively. A cross-sectional view of an exemplary 3D memory structure 1200 is shown in FIG. 12, according to the process step S555.

The first set of lateral tunnels 1294 can extend in a lateral direction between adjacent first dielectric layers 652. The second set of lateral tunnels 1296 can extend in a lateral direction between adjacent third dielectric layers 766. It is noted that, the term "lateral/laterally" used herein means the plane parallel to the top surface 330f of the substrate 330.

The second dielectric layers 654 in the alternating dielectric stack 650 (see FIG. 11) function as sacrificial layers, which can be removed selectively from between the first dielectric layers 652. Likewise, the fourth dielectric layers 764 in the top dielectric stack 762 can also function as sacrificial layers, which can be removed selectively from between the third dielectric layers 766. In the other words, the etching process of the second dielectric layers 654 and the fourth dielectric layers 764 can have minimal impact on the first dielectric layers 652 and the third dielectric layers 766. The second dielectric layers 654 and the fourth dielectric layers 764 can be removed by an isotropic dry etch and/or wet etch. The plasma and/or chemical used in the dry/wet etch can travel vertically and laterally via the GLS openings 1192. For example, the plasma and/or chemical can travel vertically along z-direction from top to bottom of the GLS opening 1192, and can also travel laterally along the y-direction from the GLS openings 1192 towards the top select structures 872 and the channel structures 660. In some embodiments, the second dielectric layers 654 and the fourth dielectric layers 764 can be silicon nitride, and the first dielectric layers 652 and the third dielectric layers 766 can be silicon oxide. In this example, the second dielectric layers 654 and the fourth dielectric layers 764 can be removed by RIE using one or more etchants of $CF_4$, $CHF_3$, $C_4F_5$, $C_4F_6$, and $CH_2F_2$, etc. In some embodiments, the second dielectric layers 654 and the fourth dielectric layers 764 can be removed using wet etch, such as phosphoric acid.

When the etching process (e.g., phosphoric acid) used for removing the second dielectric layers 654 and the fourth dielectric layers 764 (e.g., silicon nitride) is also selective to the GLS trench spacer 1190 (e.g., silicon oxide), the GLS trench spacer 1190 disposed on the sidewall of the etch-stop layer 768 can protect the etch-stop layer 768 (e.g., silicon nitride) being etched. In this example, the etch-stop layer 768 is surrounded by the third dielectric layers 766 (e.g., silicon oxide) on the top and bottom and the GLS trench spacer 1190 (e.g., silicon oxide) on the side, where the third dielectric layers 766 and the GLS trench spacer 1190 are both selective to the etching process for removing the second dielectric layers 654 and the fourth dielectric layers 764. Namely, the second dielectric layers 654 and the fourth dielectric layers 764 can be removed at a much higher etching rate than the third dielectric layer 766 and the GLS trench spacer 1190.

In some embodiments, the second capping layer 984 (e.g., silicon oxide) can also be selective to the etching process for removing the second dielectric layers 654 and the fourth dielectric layers 764. In this example, the second capping layer 984 can protect structures underneath.

After removing the second dielectric layers 654 and the fourth dielectric layers 764, portions of the memory films 337 of the channel structures 660 can be exposed inside the first set of lateral tunnels 1294, and the portions of the top select dielectric layers 880 of the top select structures 872 can be exposed inside the second set of lateral tunnels 1296.

Referring to FIG. 5, at process step S560, conductive layers can be disposed inside the first set of lateral tunnels 1294 and the second set of lateral tunnels 1296 to form a film stack of alternating conductive and dielectric layers. A cross-sectional view of an exemplary 3D memory structure 1300 is shown in FIG. 13, according to the process step S560.

Figure 13:
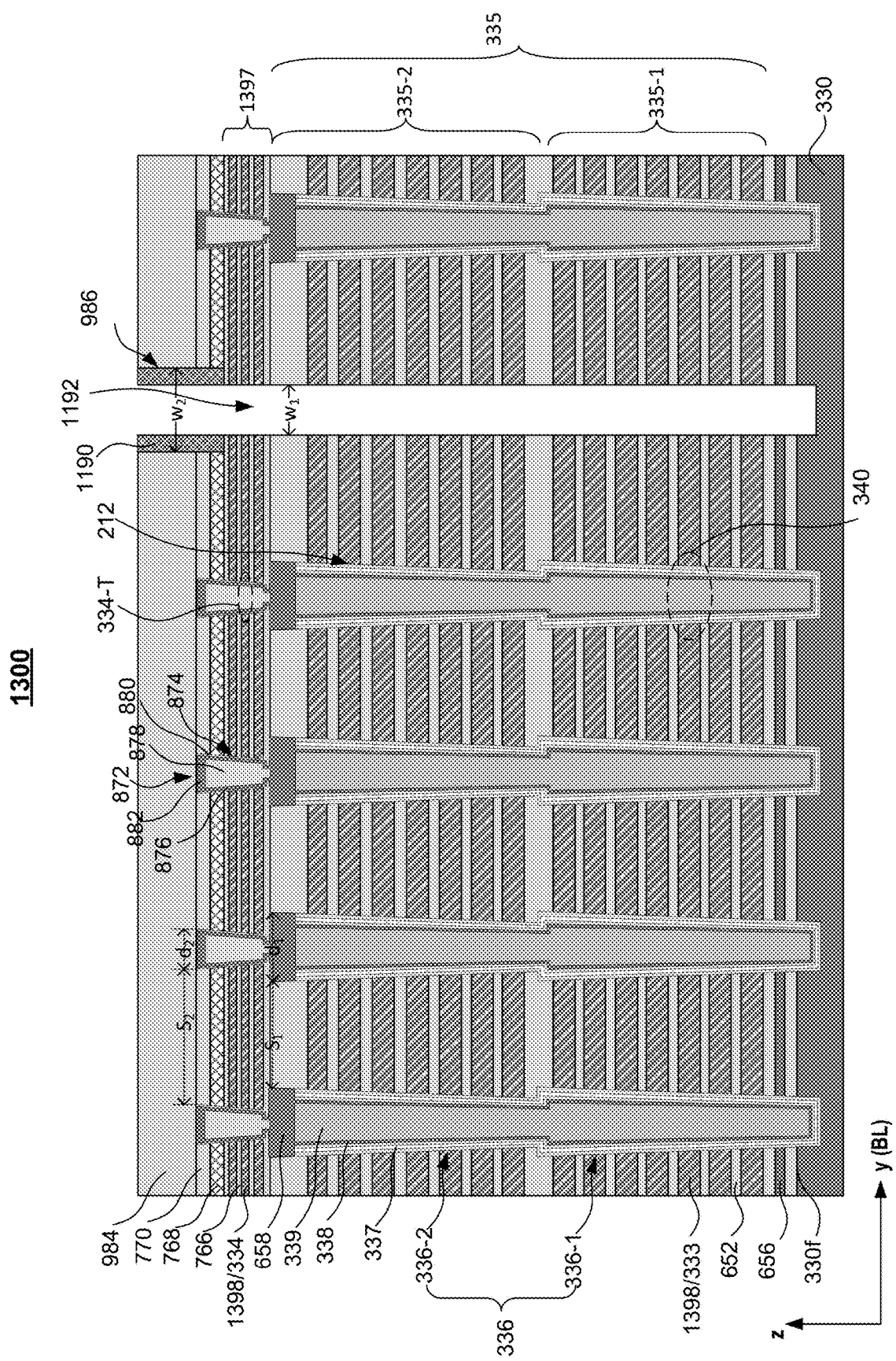

As shown in FIG. 13, the 3D memory structure 1300 includes the film stack 335 of alternating conductive and dielectric layers having a lower film stack 335-1 and an upper film stack 335-2. The lower film stack 335-1 includes the first dielectric layers 652 and the conductive layers 1398 alternatingly stacked on the substrate 330. The upper film stack 335-2 includes the first dielectric layers 652 and the conductive layers 1398 alternatingly stacked on the lower film stack 335-1. The 3D memory structure 1300 also includes a TSG film stack 1397 having the third dielectric layers 766 and the conductive layers 1398 alternatingly stacked on the upper film stack 335-2. The film stack 335 and the TSG film stack 1397 can be formed by replacing the second dielectric layers 654 and the fourth dielectric layers 764 with the conductive layers 1398.

After removing the second dielectric layers 654 and the fourth dielectric layers 764, the conductive layers 1398 can be disposed inside the first set of lateral tunnels 1294 (in FIG. 12) in between adjacent first dielectric layers 652 and can be disposed inside the second set of lateral tunnels 1296 in between adjacent third dielectric layers 766. In some embodiments, the conductive layers 1398 can be formed by filling the first set of lateral tunnels 1294 and the second set of lateral tunnels 1296 with a suitable conductive material. The conductive material for the conductive layers 1398 can include metal or metal alloys such as tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, or any combination thereof. In some embodiments, the conductive material for the conductive layers 1398 can also include poly-crystalline semiconductors, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, arsenic, or any combination thereof. In some embodiments, the conductive layers 1398 can also include amorphous semiconductors such as amorphous silicon. In some embodiments, the conductive layers 1398 can be disposed inside the lateral tunnels using a suitable deposition method such as CVD (LPCVD, PECVD, MOCVD, RTCVD, etc.), PVD, sputtering, evaporation, ALD, or any combination thereof. In some embodiments, the conductive layers 1398 include tungsten (W) deposited by CVD.

In some embodiments, a gate dielectric layer (not shown) can be disposed in the first set of lateral tunnels 1294 and the second set of lateral tunnels 1296, prior to disposing the conductive layer 1398. Therefore, the gate dielectric layer can surround the conductive layer 1398 inside the first set of lateral tunnels 1294 and the second set of lateral tunnels 1296. The gate dielectric layer can be used to reduce leakage current between adjacent conductive layers 1398 that form gate electrodes. The gate dielectric layer can also be used to reduce leakage current between the conductive layer 1398 (e.g., as a control gate) and the channel of the memory cell (e.g., the channel layer 338). The gate dielectric layer can include any suitable insulator, for example, silicon oxide, silicon nitride, silicon oxynitride, and/or any suitable combinations thereof. The gate dielectric layer can also include high-k dielectric materials, such as hafnium oxide, zirconium oxide, aluminum oxide, tantalum oxide, lanthanum oxide, and/or any combination thereof. The gate dielectric layer can be disposed by one or more suitable deposition processes, such as CVD, PVD, and/or ALD.

In some embodiments, the conductive layers 1398 can form the bottom select gate 332 (in FIG. 3), the control gates (i.e., word lines) 333 or the TSG 334. At least one conductive layer 1398 in the lower film stack 335-1 and the upper film stack 335-2 can function as the control gate 333, wherein the intersection between the control gate 333, the memory film 337 and the channel layer 338 forms the memory cell 340. The vertically stacked memory cells 340 along the same channel hole 336 forms the memory string 212. At least one conductive layer 1398 in the TSG film stack 1397 can function as the TSG 334, wherein the intersection between the TSG 334, the top select dielectric layer 880 and the top select channel layer 876 forms a top select transistor 334-T. In some embodiments, the top select transistor 334-T is a MOSFET.

The top select transistor 334-T can be switched on or off by applying a suitable voltage on the TSG 334 such that the connectivity between the channel layer 338 of the memory string 212 and the top select plug 882 (and bit-line or bit-line contact formed in the subsequent processes) can be controlled. The top select transistor 334-T formed by the method 500 does not include the memory film 337, and thereby does not have a charge trapping layer. The top select dielectric layer 880 functions as a gate dielectric for the top select transistor 334-T, which can include a dielectric having minimum number of defects or charge traps. When a voltage is applied on the TSG 334 to switch on or off the top select transistor 334-T, a threshold voltage of the top select transistor 334-T will not be changed due to charge trapping. By removing the memory film 337 from the top select transistor 334-T and forming a MOSFET structure with the top select dielectric layer 880 of high switching quality, the threshold voltage of the top select transistor 334-T can be maintained constant. Reliability of the top select transistor 334-T can thus be improved.

In some embodiments, etching and cleaning processes can be used to remove excess conductive layers 1398 on sidewalls of the GLS opening 1192. As such, each conductive layer 1398 can be electrically isolated from each other. In some embodiments, the etching and cleaning processes can also remove excess conductive layers 1398 on a bottom of the GLS opening 1192 to expose a portion of the substrate.

Referring to FIG. 5, at process step S565, a GLS isolation layer and a GLS opening filling can be disposed inside the GLS opening to form a GLS. A cross-sectional view of an exemplary 3D memory structure 1400 is shown in FIG. 14, according to the process step S565.

Figure 14:
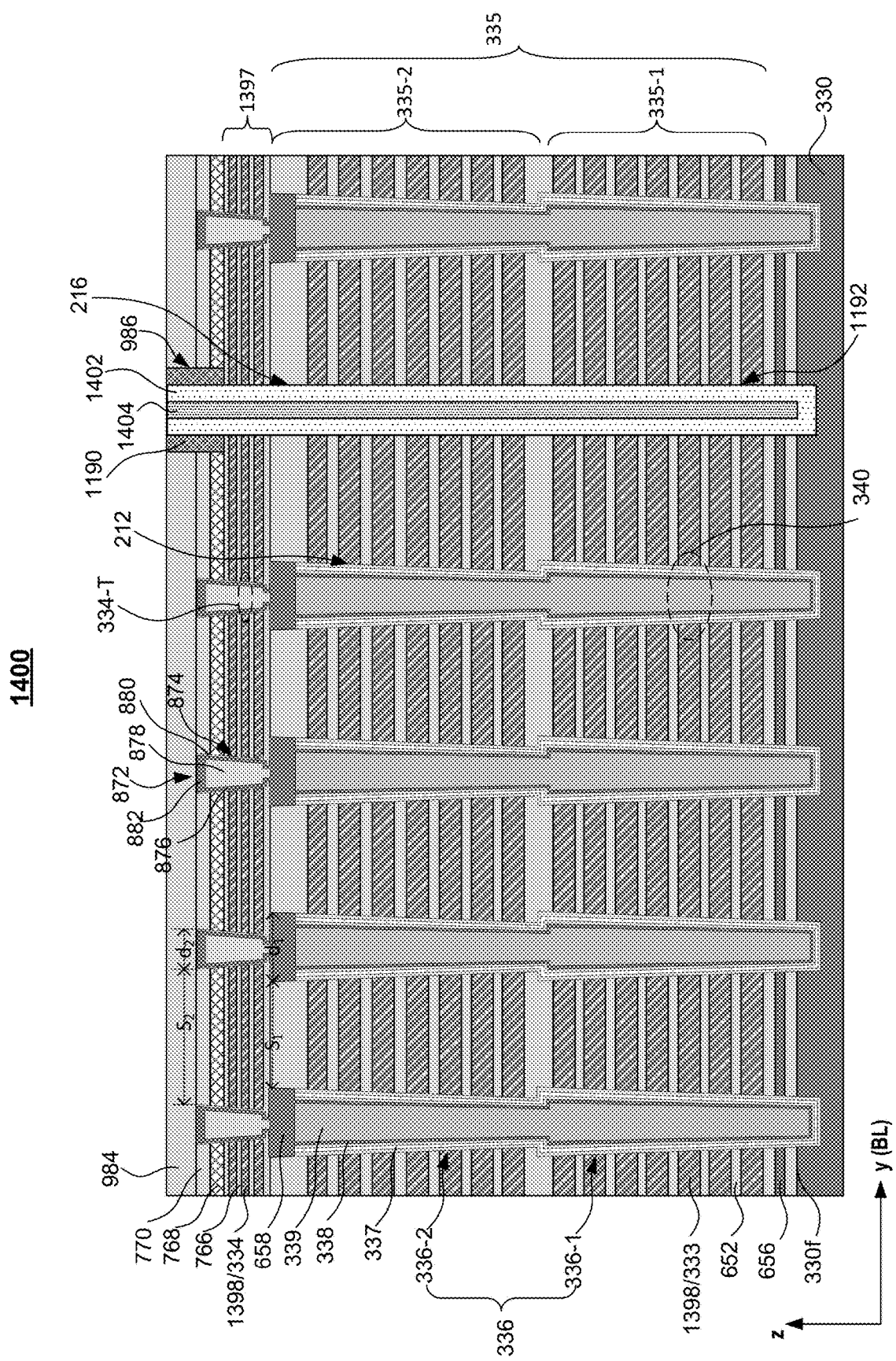

As shown in FIG. 14, the 3D memory structure 1400 includes a GLS 216 (also referred to as the slit structure 216 as shown in FIGS. 2-3). The GLS 216 penetrates vertically through the TSG film stack 1397 and the film stack 335. In some embodiments, the GLS 216 also penetrates through the second capping layer 984, the first capping layer 770 and the etch-stop layer 768. In some embodiments, the GLS 216 extends into the substrate 330.

The GLS 216 includes a GLS isolation layer 1402 disposed on a sidewall of the GLS opening 1192. The GLS isolation layer 1402 covers sidewalls of the conductive layers 1398 that are exposed inside the GLS opening 1192.

The GLS isolation layer 1402 can also cover the exposed substrate 330 inside the GLS opening 1192. The GLS isolation layer 1402 can include any suitable insulator, for example, silicon oxide, silicon nitride, silicon oxynitride, boron or phosphorus doped silicon oxide, carbon-doped oxide (CDO or SiOC or SiOC:H), or fluorine doped oxide (SiOF), or any combination thereof. The GLS isolation layer 1402 can be deposited by using, for example, ALD, CVD (e.g., PECVD, RTCVD, LPCVD, etc.), PVD, sputtering, evaporating, or any other suitable film deposition techniques.

In some embodiments, a GLS opening filler 1404 (i.e., second filling layer) can be disposed inside the GLS openings 1192 to form the GLS 216. The GLS opening filler 1404 can be any suitable insulator, for example, silicon oxide, silicon nitride, silicon oxynitride, boron or phosphorus doped silicon oxide, carbon-doped oxide (CDO or SiOC or SiOC:H), or fluorine doped oxide (SiOF), or any combination thereof. The GLS opening filler 1404 can be deposited by using, for example, ALD, CVD (e.g., PECVD, RTCVD, LPCVD, etc.), PVD, sputtering, evaporating, or any other suitable film deposition techniques. In this example, an array common source (not shown in FIG. 14) can be formed subsequently from a backside of the substrate 330 that is farther away from the top dielectric stack 762.

In some embodiments, the GLS opening filler 1404 can include any suitable conductive material, for example, tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, or any combination thereof. In some embodiments, the GLS opening filler 1404 can also include poly-crystalline semiconductors, such as poly-crystalline silicon, poly-crystalline germanium, poly-crystalline germanium-silicon and any other suitable material, and/or combinations thereof. In some embodiments, the poly-crystalline material can be incorporated with any suitable n-type or p-type of dopants, such as boron, phosphorous, arsenic, or any combination thereof. In some embodiments, the GLS opening filler 1404 can also include amorphous semiconductors such as amorphous silicon. In some embodiments, the GLS opening filler 1404 can also include metal silicide, such as $WSi_x$, $CoSi_x$, $NiSi_x$, $TiSi_x$, or $AlSi_x$, etc. In some embodiments, the GLS opening filler 1404 can include any combination of the conductive material aforementioned. In some embodiments, the GLS opening filler includes tungsten (W). In this example, an array common source (not shown in FIG. 14) can be formed in the substrate 330, where the GLS opening filler 1404 can provide electrical connection to the array common source. In one example, a doped region can be formed in the substrate 330 near a bottom of the GLS 216.

In some embodiments, a portion of the GLS isolation layer 1402 on the bottom of the GLS opening 1192 can also be removed by a dry or wet etching process, after the deposition of the GLS isolation layer 1402 to expose the portion of the substrate 330 inside the GLS opening 1192. In this example, the GLS 216 can form an electrical connection with the substrate 330.

In some embodiments, the 3D memory device 1400 can have a planar top surface by using a planarization process after disposing the GLS opening filler 1404. Any excess material of the GLS isolation layer 1402, the GLS opening filler 1404 and/or the conductive layer 1398 outside the GLS opening 1192 (e.g., on top of the second capping layer 984) can be removed by the planarization process. The planarization process can include RIE etch back and/or CMP.

As discussed previously, the GLS 216 can divide a memory block into multiple functional units (e.g., memory fingers 218 in FIG. 2). The GLS 216 can also provide mechanic support in the channel structure region 211. The GLS 216 can provide electrical connection to the substrate 330 or an array common source (not shown in FIG. 2). In some embodiments, the GLS 216 can be used for electrical connection with peripheral circuits fabricated on the substrate 330.

Referring to FIG. 5, at process step S570, a TSG cut can be formed in the top film stack. A cross-sectional view of an exemplary 3D memory structure 1500 is shown in FIG. 15, according to the process step S570.

Figure 15:
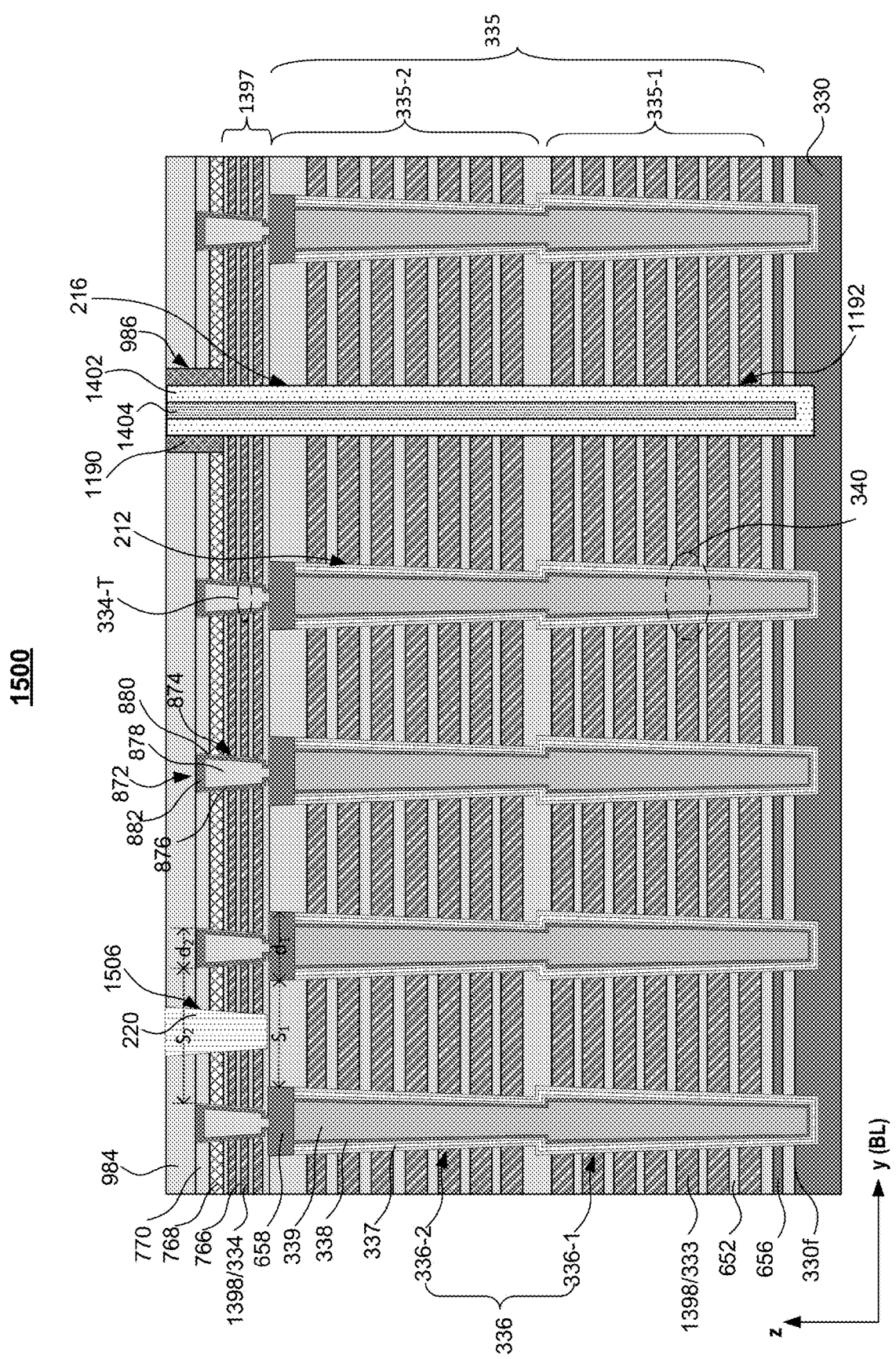

As shown in FIG. 15, the TSG cut 220 penetrates vertically through the TSG film stack 1397 and electrically separates the TSGs 334. In some embodiments, the TSG cut 220 also penetrates through the second capping layer 984, the first capping layer 770 and the etch-stop layer 768.

The TSG cut 220 can be formed by etching through the TSG film stack 1397 to form a TSG cut opening 1506 (i.e., a third opening), followed by disposing a suitable insulating material inside the TSG cut opening 1506. The insulating material of the TSG cut 220 can include silicon oxide, silicon nitride, silicon oxynitride, boron or phosphorus doped silicon oxide, carbon-doped oxide (CDO or SiOC or SiOC:H), or fluorine doped oxide (SiOF), or any combination thereof. The insulating material for the TSG cut 220 can be deposited by using, for example, ALD, CVD (e.g., PECVD, RTCVD, LPCVD, etc.), PVD, sputtering, evaporating, or any other suitable film deposition techniques. In some embodiments, a planarization process (e.g., CMP, ME) can be used to form a coplanar surface between the TSG cut 220 and the second capping layer 984.

As discussed previously, the TSG cut 220 can divide the conductive layers 1398 in the TSG film stack 1397 into separately controllable TSGs 334. As shown in FIG. 2, the TSG cut 220 extends lateral along the x-direction (i.e., the WL direction) and can divide the memory finger 218 into multiple memory slices 224. The TSG cut 220 electrically isolates the TSGs 334 such that the TSG 334 in each memory slice 224 can be independently controlled. As such, each memory slice 224 can be controlled independently from each other, which can effectively reduce the programming, reading and erasing time as well as data transmission time. Efficiency of data storage can be improved.

As shown in FIG. 15, the TSG cut opening 1506 and the TSG cut 220 are distant from the top select opening 874 and the top select structure 872 in the y-direction, a direction parallel to an extending direction of the conductive layers 1398 (or gate electrodes, e.g., TSG 334 and control gate 333). Namely, the TSG cut 220 is formed in between the top select structures 872. The TSG cut 220 does not intersect with the top select structure 872.

Figure 16:
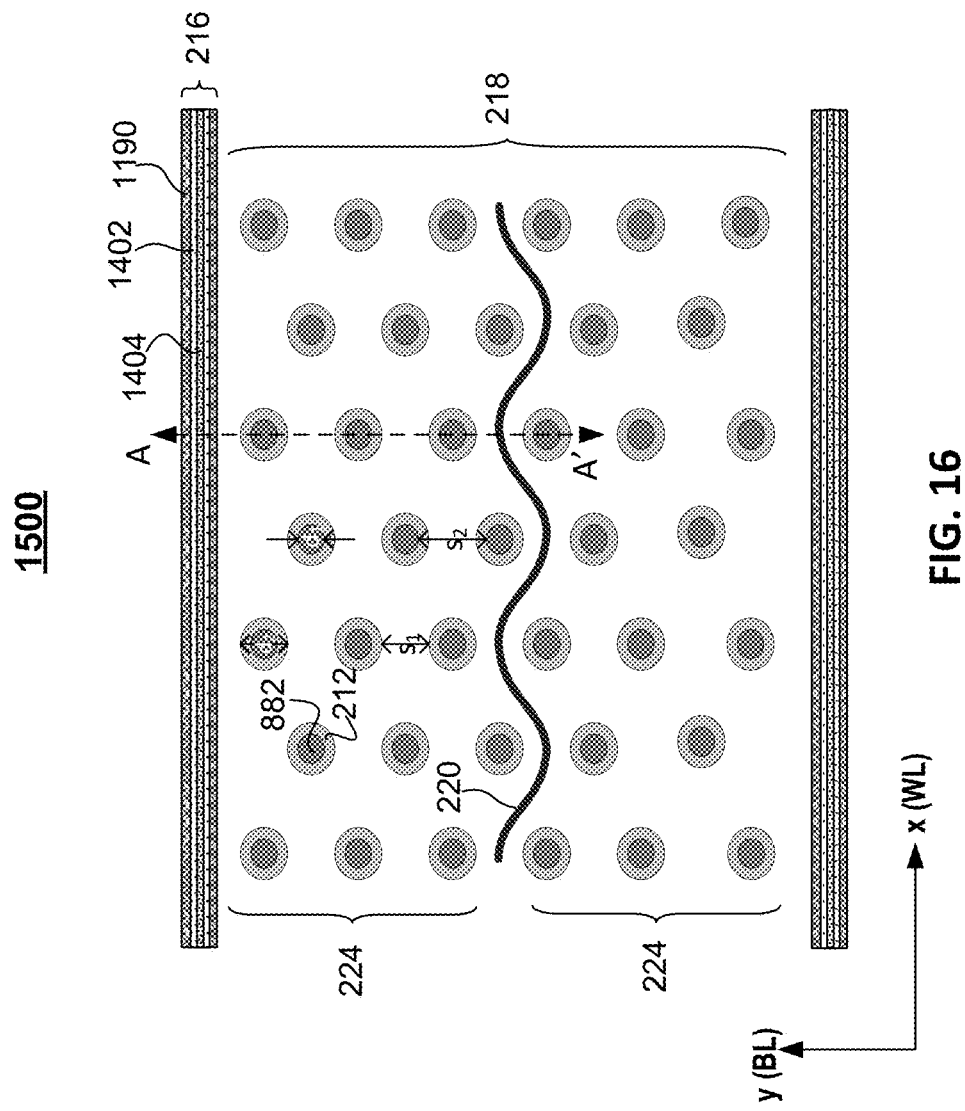
FIG. 16 illustrates a top-down view of a 3D memory device at certain process step, according to some embodiments of the present disclosure.

FIG. 16 illustrates an exemplary layout (top-down view) of the 3D memory structure 1500, according to some embodiments of the present disclosure. FIG. 15 can be the cross-sectional view along a line AA' in FIG. 16.

As discussed previously, to avoid intersect with the memory strings 212, the TSG cut 220 can be configured as a waving curve extending in the x-direction. In this example, the TSG cut 220 goes in between adjacent memory strings 212. Different from the layout 400B in FIG. 4B, the 3D memory structure 1500 includes the top select structure 872 having the top select plug 882 (see FIG. 15). The diameter "$d_2$" of the top select plug 882 is smaller than the diameter "$d_1$" of the memory string 212 (e.g., the channel top plug 658). Accordingly, the spacing "$s_2$" between adjacent top select plugs 882 is larger than the spacing "$s_1$" between adjacent memory strings 212. Therefore, there can be a larger process window to form the TSG cut 220 that does not intersect with the top select plugs 882 for the 3D memory structure 1500.

Referring to FIG. 5, at process step S575, BL contacts can be formed to connect with the top select plug of the top select structures. A cross-sectional view of an exemplary 3D memory structure 1700 is shown in FIG. 17, according to the process step S575.

Figure 17:
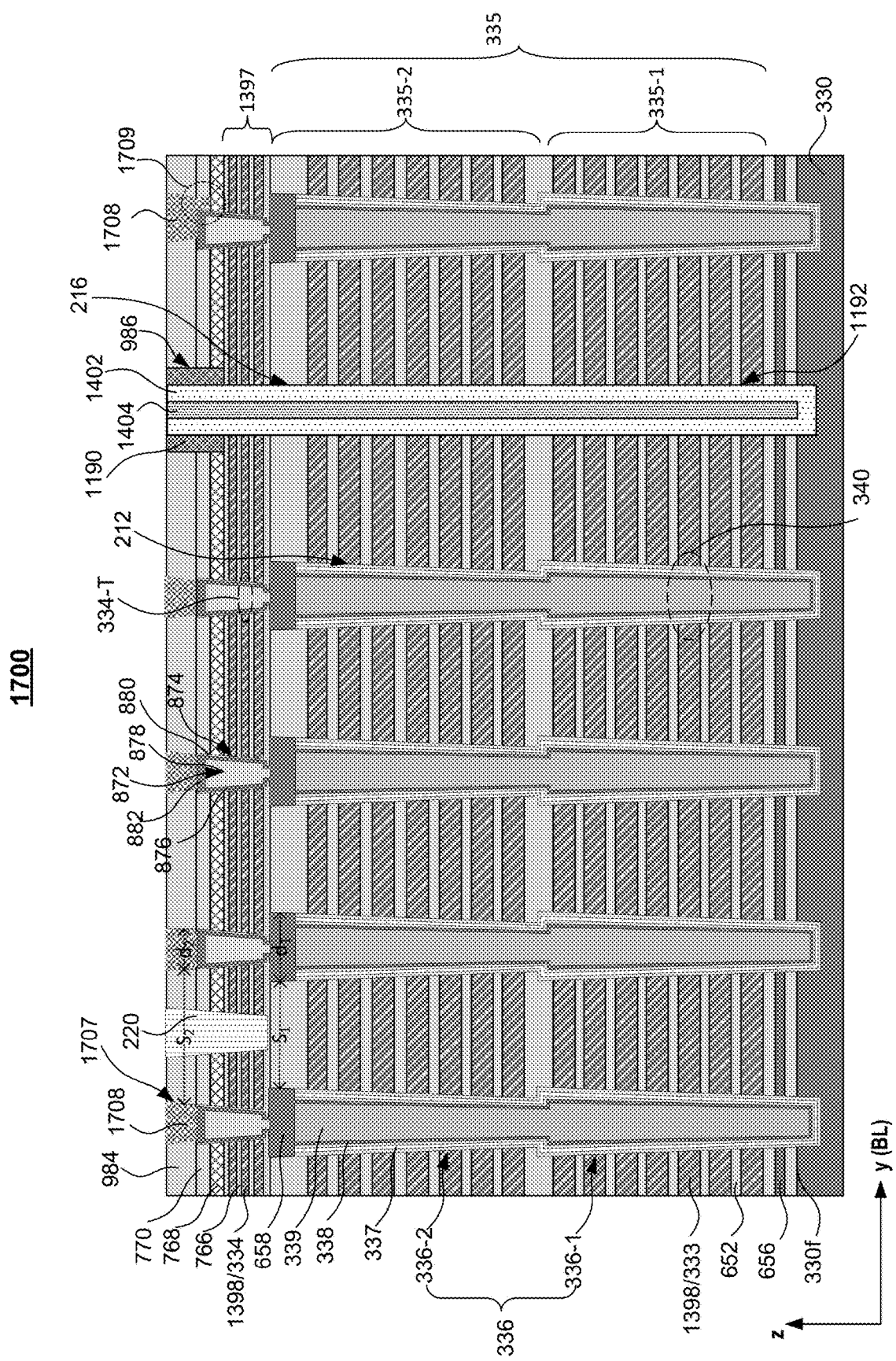
FIG. 17 illustrate cross-sectional views of a 3D memory device at certain process step, according to some embodiments of the present disclosure.

As shown in FIG. 17, the 3D memory structure 1700 includes BL contacts 1708 (also referred to as "contacts") penetrating vertically through the second capping layer 984 and connecting with the top select plugs 882 of the top select structure 872. The BL contacts 1708 can be substantially aligned with the top select structures 872. The BL contacts 1708 can form electrical connections between the top select plug 882 and the bit lines formed in the subsequent processes. As discussed previously, the top select plug 882 can be connected with the top select channel layer 876, which can be connected with the channel top plug 658 and the channel layer 338 of the memory string 212. As such, the bit line (not shown in FIG. 17) can be electrically connected to the channel layer 338 of the memory string 212, where conductive path through the top select channel layer 876 can be controlled by the TSG 334 using the top select transistors 334-T.

The forming of the BL contact 1708 includes patterning the second capping layer 984 (e.g., photolithography, dry etching, wet etching, or a combination thereof) to form a BL contact opening 1707 (i.e., a second opening), where a portion of the top select plug 882 can be exposed inside the BL contact opening 1707. Then, a conductive material can be disposed inside the BL contact opening 1707. The conductive material can include metal, metal alloy and/or metal silicide, for example, tungsten, titanium, tantalum, tungsten nitride, titanium nitride, tantalum nitride, nickel silicide, cobalt silicide, tungsten silicide, titanium silicide, or a combination thereof. The conductive material for the BL contact 1708 can be deposited by CVD, PVD, ALD, evaporation, sputtering, etc. In some embodiments, the BL contact 1708 can be tungsten deposited by CVD.

In some embodiments, a planarization process, such as CMP, can be used to remove any conductive materials on top of the second capping layer 984 such that the BL contacts 1708 are isolated from each other. In some embodiments, the BL contacts 1708 can be coplanar with the TSG cut 220 and the GLS 216.

As shown in FIG. 17, when the BL contacts 1708 can be substantially aligned with the top select structure 872, and the BL contacts 1708 have a lateral dimension (e.g., a diameter) smaller than the diameter "$d_2$" of the top select plug 882, the BL contacts 1708 can be landed on the top select plug 882. However, when there is an overlay offset between the BL contact 1708 and the top select structure 872, the BL contact 1708 can extend further into the first capping layer 770 and the etch-stop layer 768 to include a BL contact dip 1709.

As discussed previously, by implementing the GLS trench spacer 1190, the etch-stop layer 768 can be protected during the process step S555 when the second dielectric layers 654 and the fourth dielectric layers 764 are removed. Namely, the etch-stop layer 768 is not replaced with the conductive layer 1398 because the GLS trench spacer 1190 covers the sidewall of the etch-stop layer 768 and prevents the etch-stop layer 768 from being etched laterally. As such, when the BL contact dip 1709 is connected to the etch-stop layer 768, circuit shorts or leakage path does not occur.

Additionally, the etch-stop layer 768 can include an insulating material different from the first capping layer 770 and the second capping layer 984. So, the etch-stop layer 768 can function as an etch stop for forming the BL contact opening 1707. For example, the etch-stop layer 768 can have an etch rate much lower than an etch rate of the first capping layer 770 and the second capping layer 984. Therefore, when the second capping layer 984 is over-etched during an etching process for the BL contact opening 1707, the etch-stop layer 768 will not be punched through. Namely, the third dielectric layer 766 and the TSG 334 underneath the etch-stop layer 768 will not be exposed or etched. The BL contact 1708 does not connect with the TSG 334 even with the BL contact dip 1709. In the other words, the BL contact 1708 can be electrically connected to the top select structure 872, where the BL contact 1708 can be disposed above or on a side of the etch-stop layer 768 that is farther away from the conductive layers 1398 or TSG 334. Thus, the BL contact 1708 to the TSG 334 electrical circuit short can be avoided.

Figure 18:
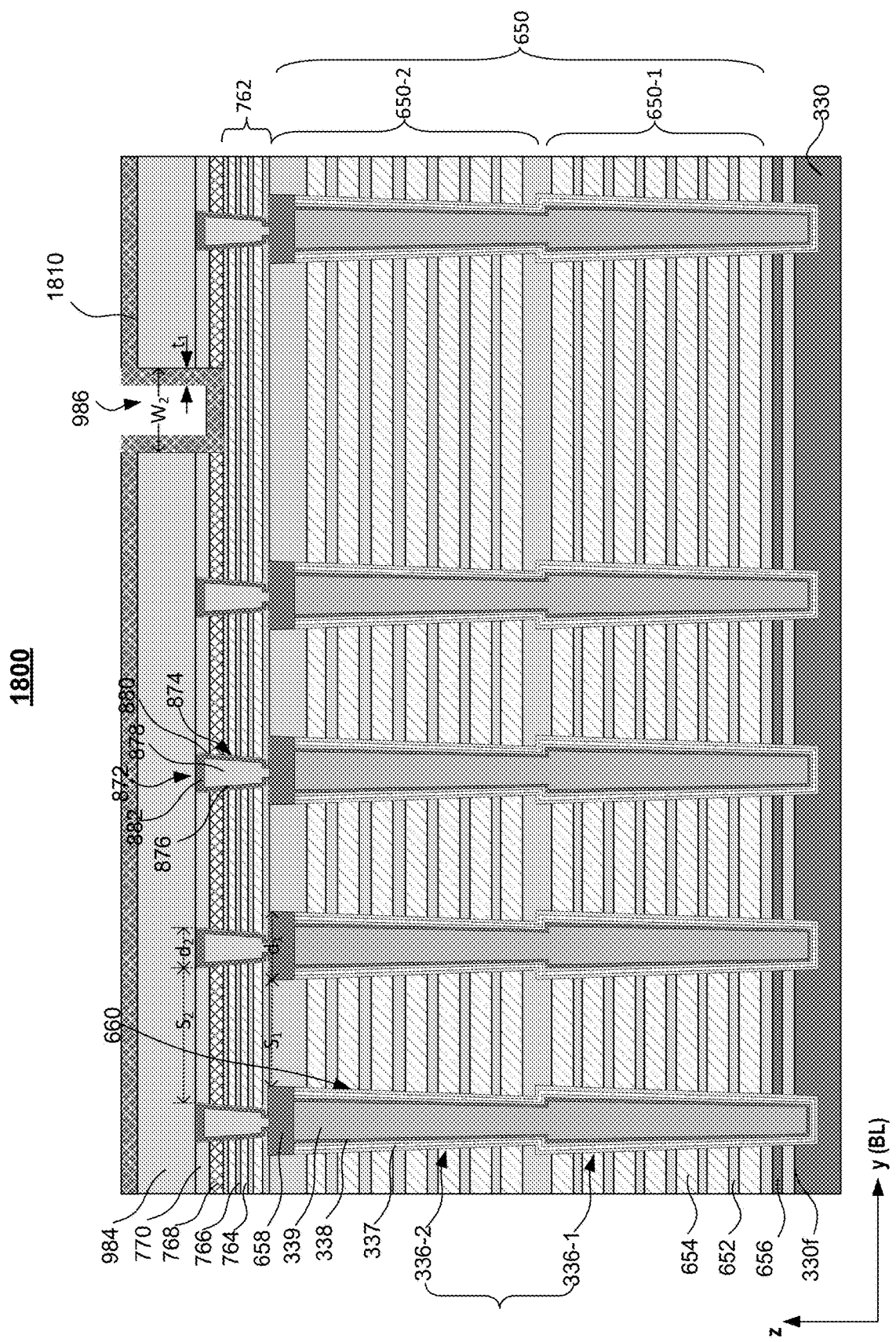
FIGS. 18-21 illustrate cross-sectional views of a 3D memory device at certain process step, according to some embodiments of the present disclosure.
Figure 19:
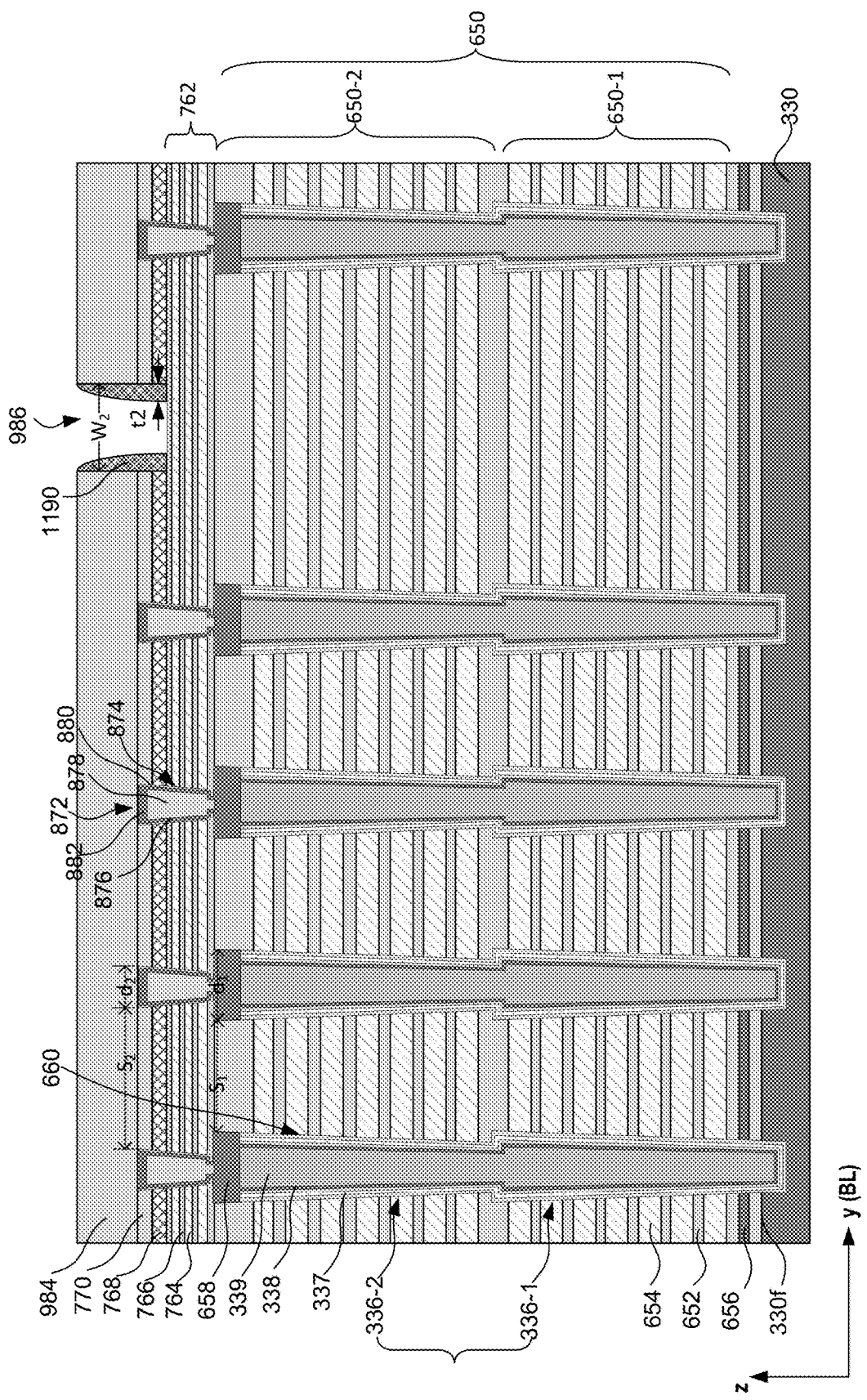
Figure 20:
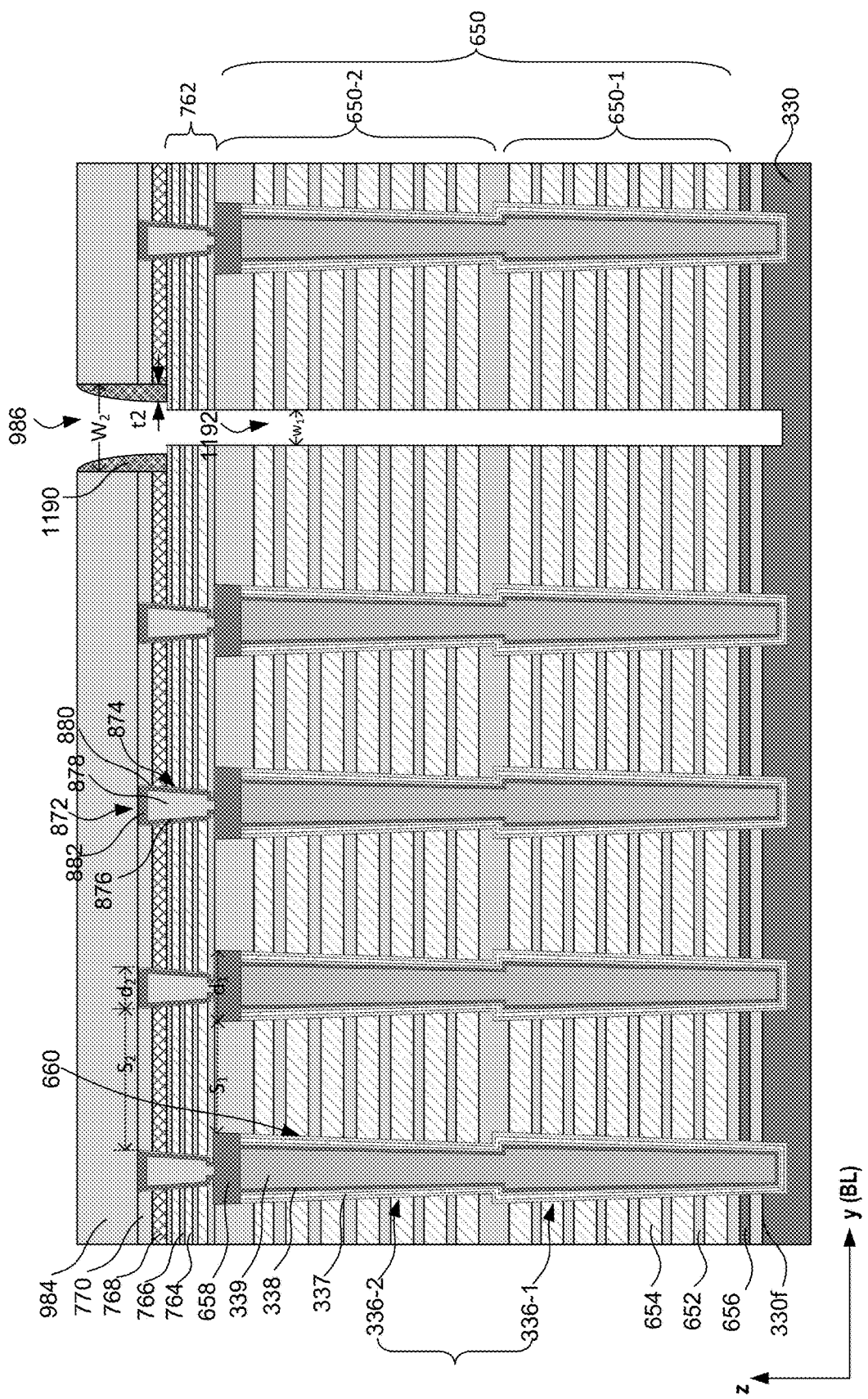
Figure 21:
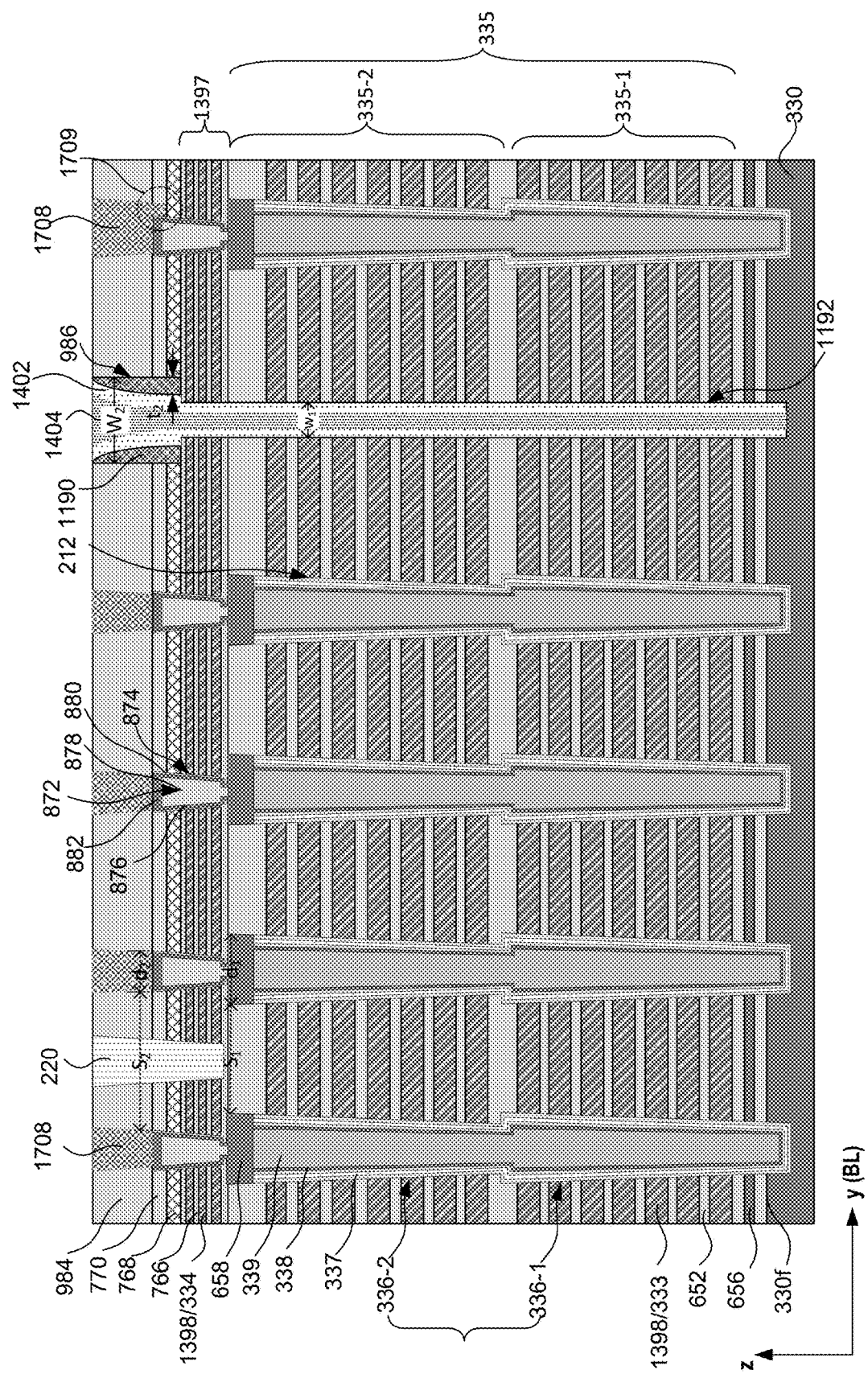

Other fabrication processes (different from process step S545) can be used to form the GLS trench spacer 1190. For example, after forming the GLS trench 986 (see FIG. 9), an insulating film 1810 can be disposed inside the GLS trench 986 (see FIG. 18), where the insulating film can include a thickness "$t_1$" less than a half of the width "$w_2$" of the GLS trench 986 such that the GLS trench 986 will not be completely filled up with the insulating film 1810 (in contrast to FIG. 10). Then, an anisotropic etching or directional etching (e.g., ME) can be used to remove a portion of the insulating film 1810 at a bottom of the GLS trench 986 to form the GLS trench spacer 1190 on a sidewall of the GLS trench 986 (see FIG. 19). In this example, the GLS trench spacer 1190 can be formed before forming the GLS opening 1192. The GLS trench spacer 1190 can have a thickness "$t_2$" covering the sidewall of the etch-stop layer 768. The thickness "$t_2$" of the GLS trench spacer 1190 can be determined by the thickness "$t_1$" of the insulating film 1810 disposed inside the GLS trench 986 and the anisotropic etching process. Next, the GLS opening 1192 can be formed (see FIG. 20) by using a similar process as described at the process step S550, where the GLS opening 1192 can be substantially aligned with the GLS trench 986. The GLS opening 1192 can penetrate through the top dielectric stack 762 and the alternating dielectric stack 650. The width "$w_1$" of the GLS opening 1192 can be determined by, for example, a photolithography process. As discussed previously, the width "$w_1$" of the GLS opening 1192 can be smaller than the width "$w_2$" of the GLS trench 986. Due to a shape of the GLS trench spacer 1190 formed by the anisotropic etching, a top portion of the GLS trench 986 can include a width larger than the width "$w_1$" of the GLS opening 1192. Additionally, when the width "$w_1$" is smaller than the width "$w_2$" subtracting twice the thickness "$t_2$," the GLS opening 1192 can be formed without penetrating through the GLS trench spacer 1190 (see FIG. 20). The fabrication processes, similar to process steps S555-S575, can then be resumed. A 3D memory structure 2100 is illustrated in FIG. 21 after forming the BL contacts 1708 at process step S575.

Figure 22:
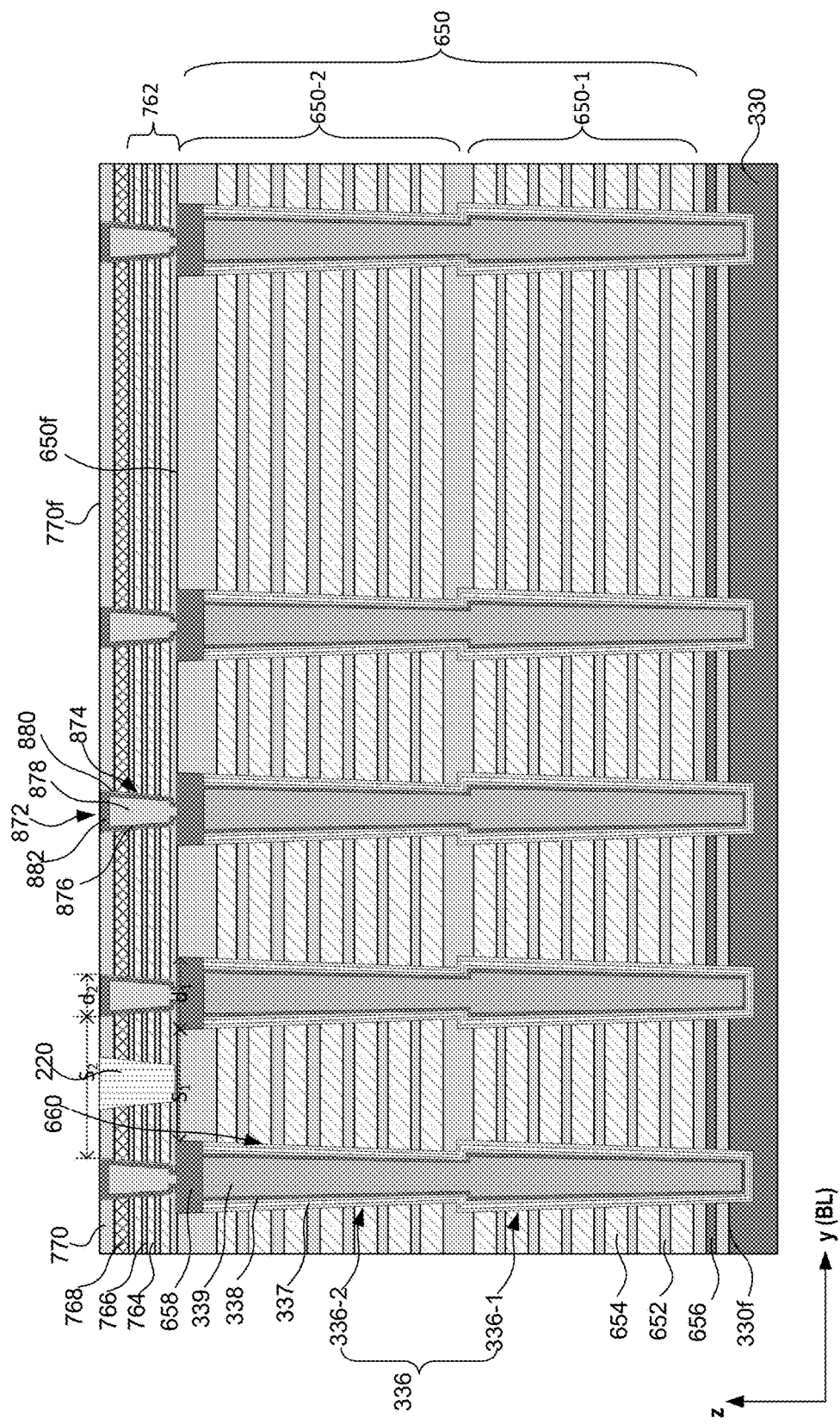
FIGS. 22-23 illustrate cross-sectional views of a 3D memory device at certain process step, according to some embodiments of the present disclosure.
Figure 23:
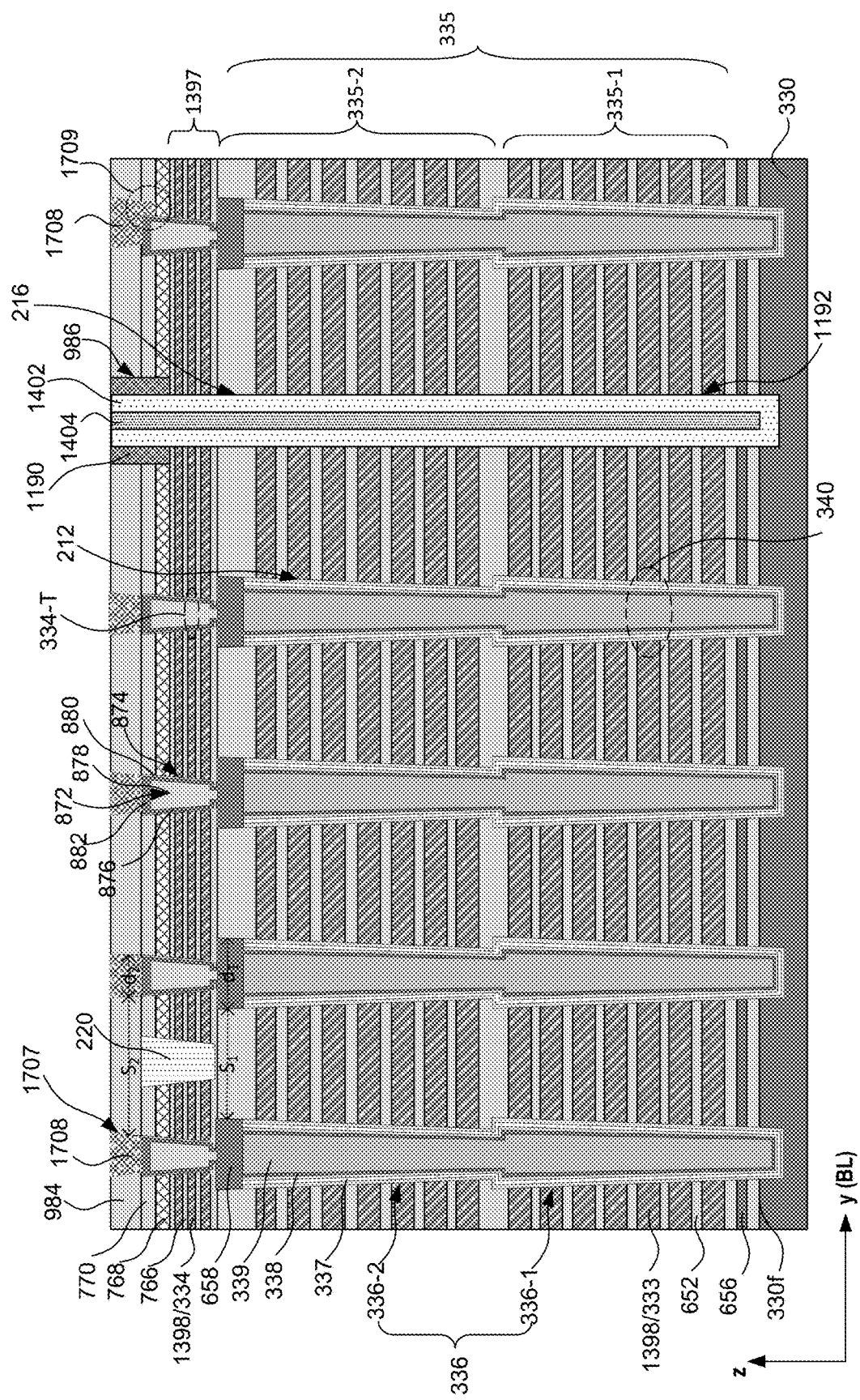

Alternatively, the TSG cut 220 can be formed before forming the GLS trench 986. For example, after forming the top select structures 872 (see FIG. 8), the TSG cut 220 can be formed in the top dielectric stack 762 (see FIG. 22). The TSG cut 220 penetrates vertically through the first capping layer 770, the etch-stop layer 768 and the top dielectric stack 762. The TSG cut 220 can be coplanar with the first capping layer 770. Then, the process steps S540-S565 can be performed. A 3D memory structure 2300 is illustrated in FIG. 23 after forming the BL contacts 1708 at process step S575.

Figure 24:
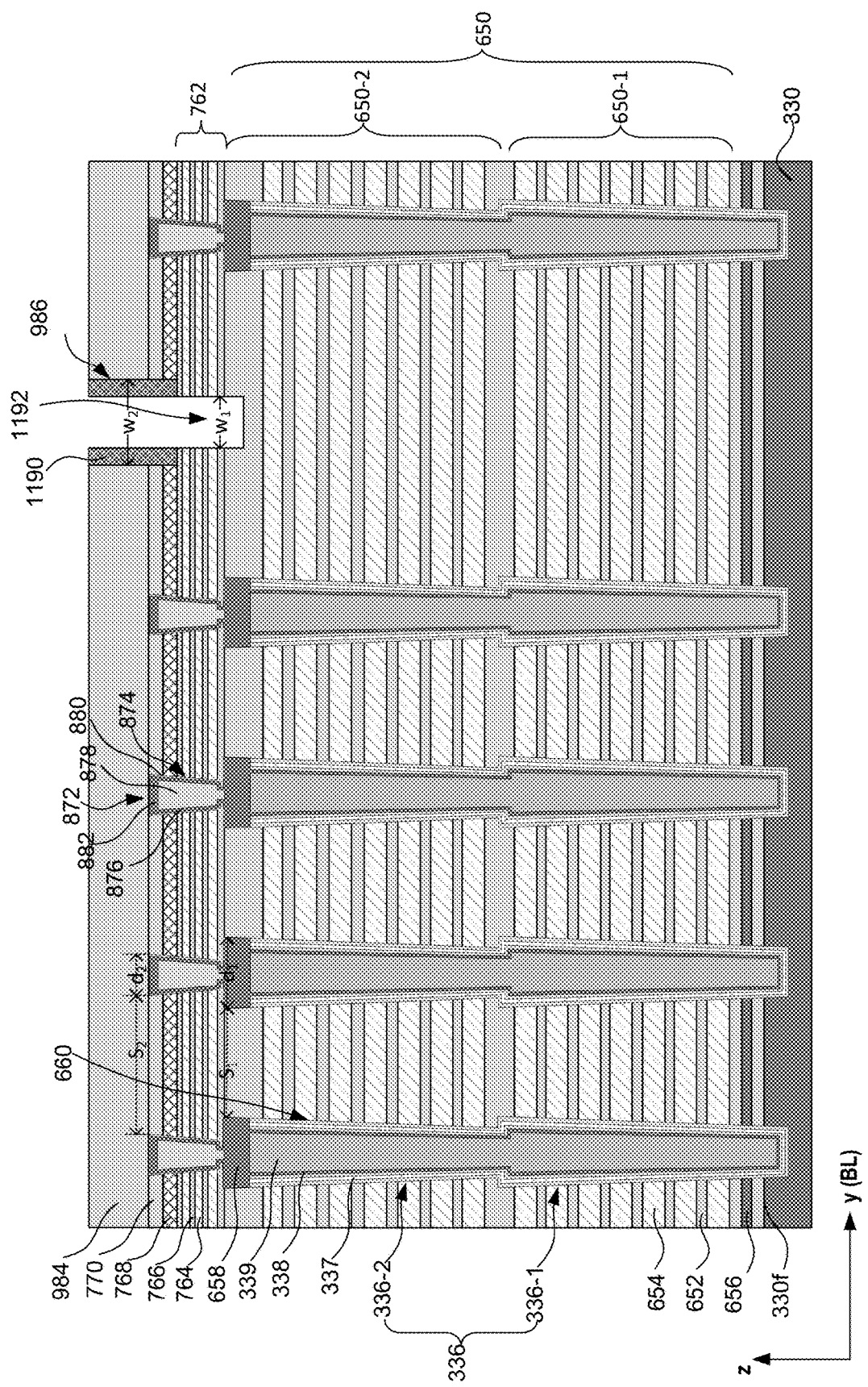
FIGS. 24-30 illustrate cross-sectional views of a 3D memory device at certain process step, according to some embodiments of the present disclosure.
Figure 25:
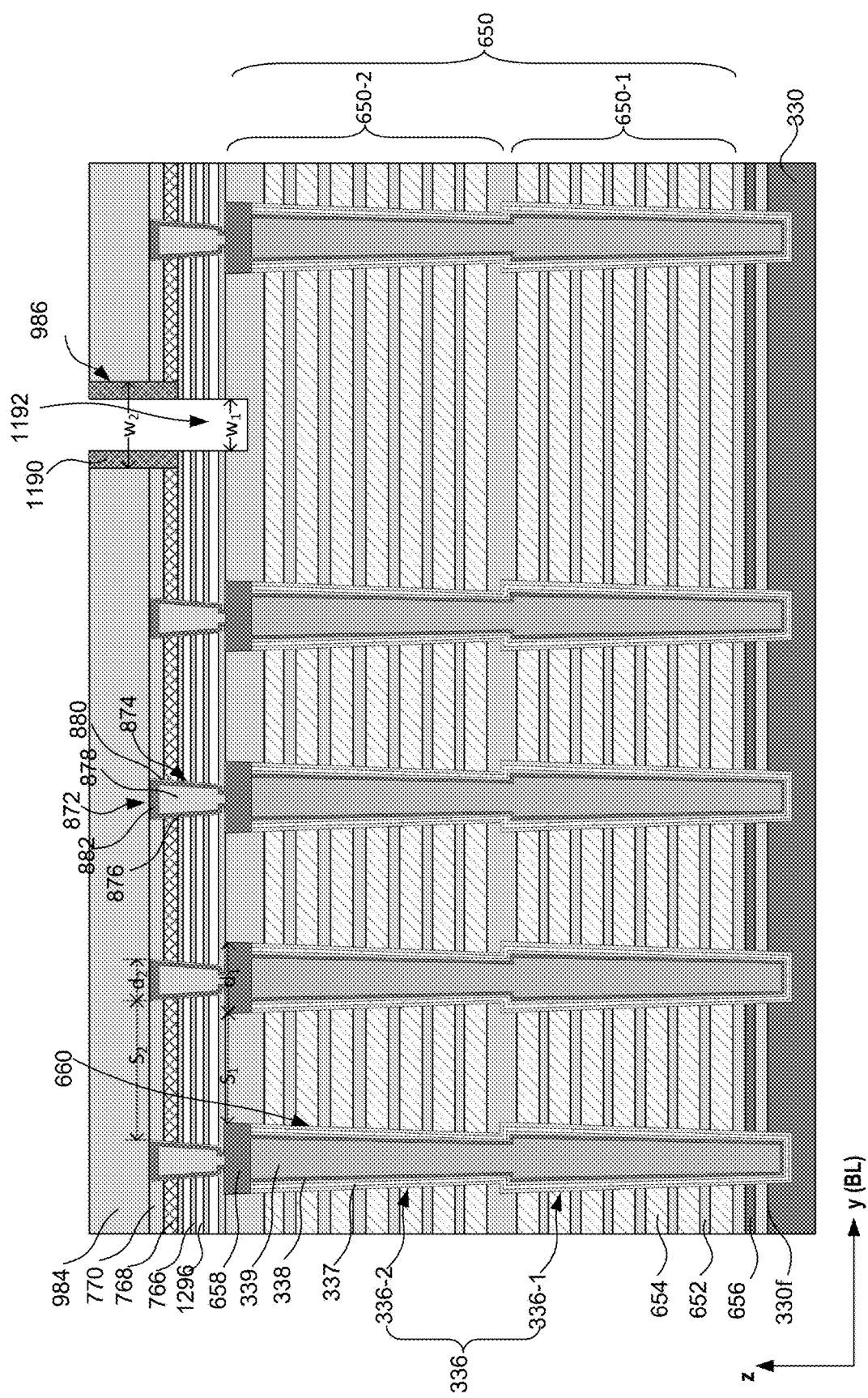
Figure 26:
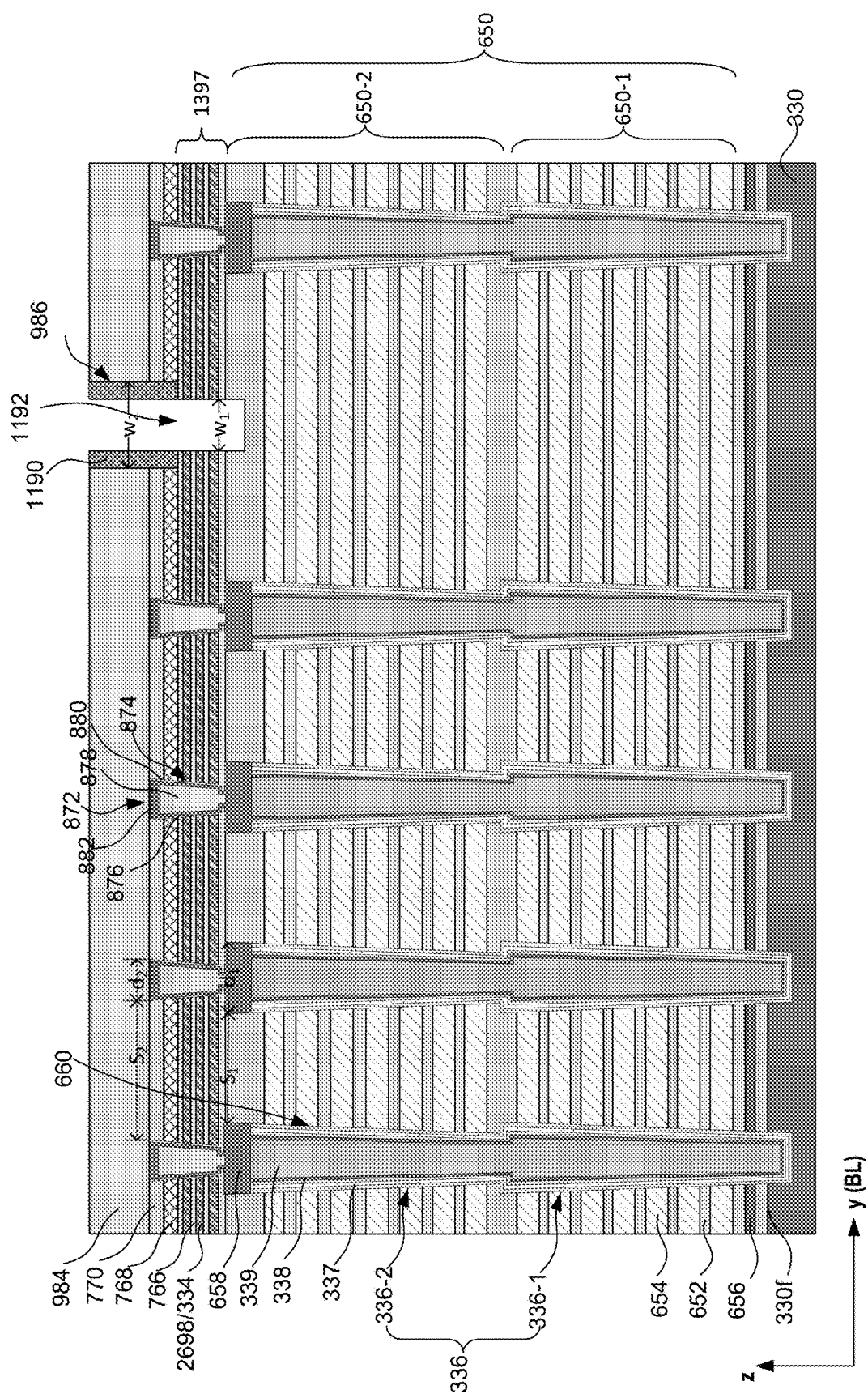
Figure 27:
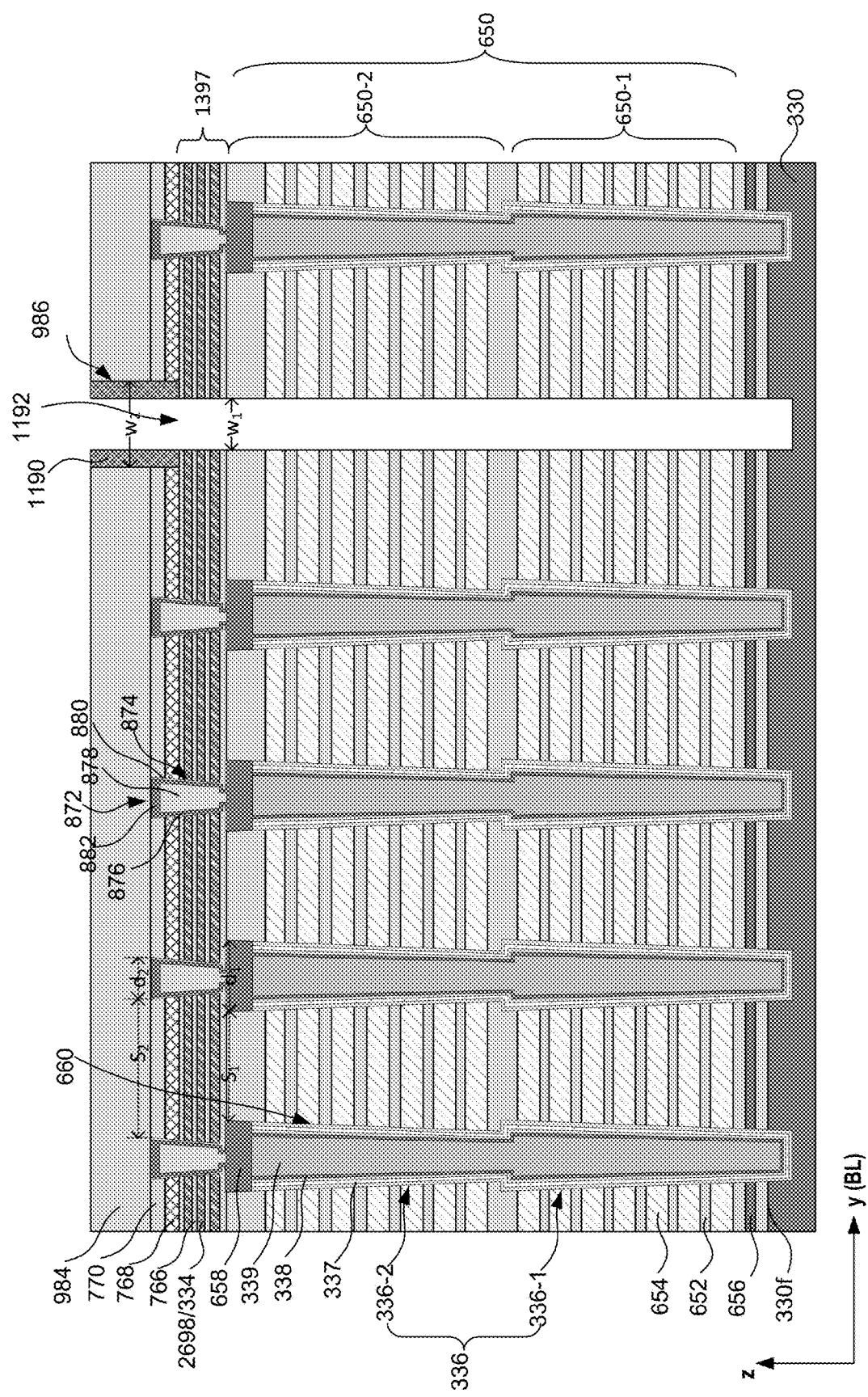
Figure 28:
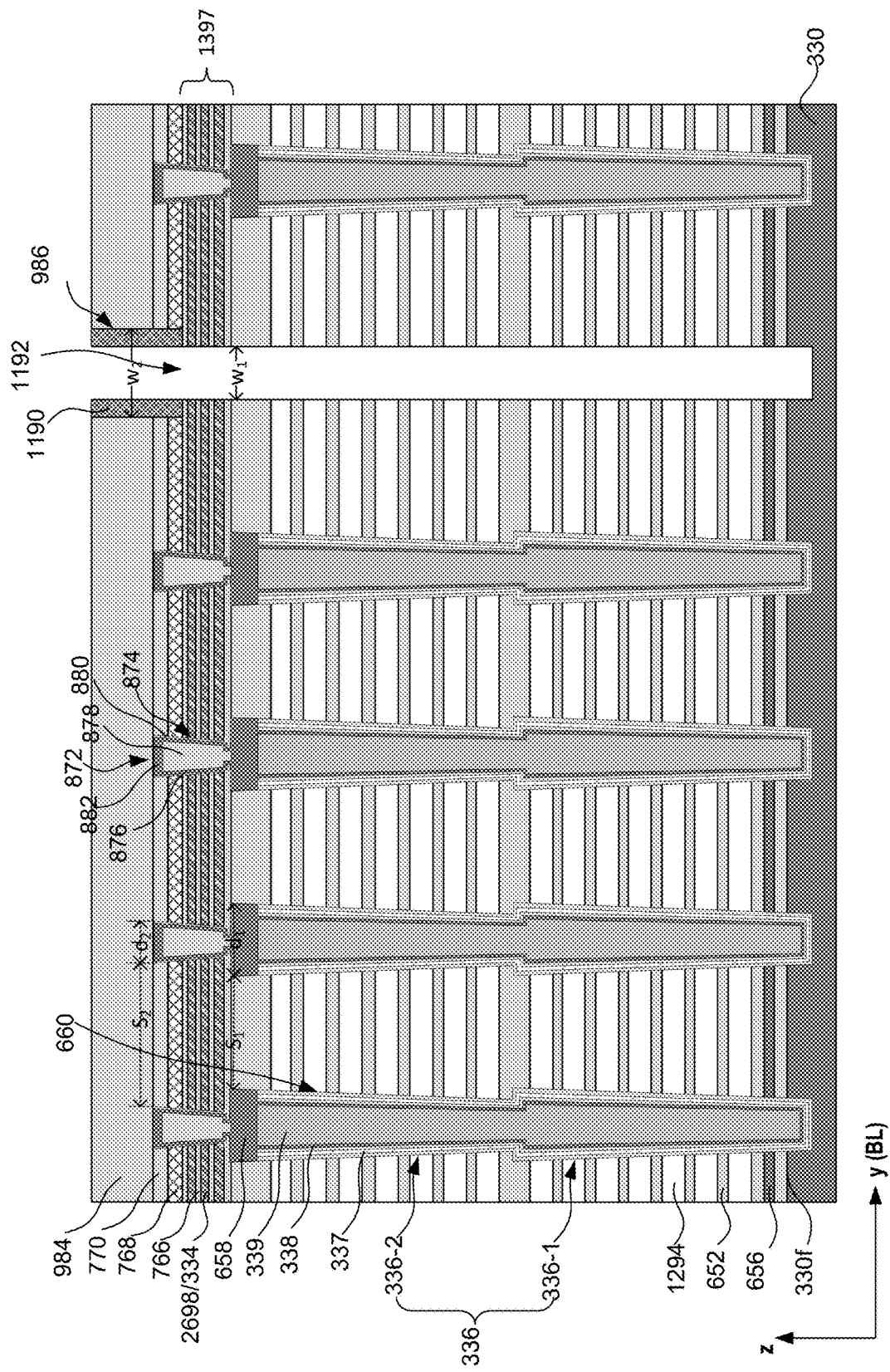
Figure 29:
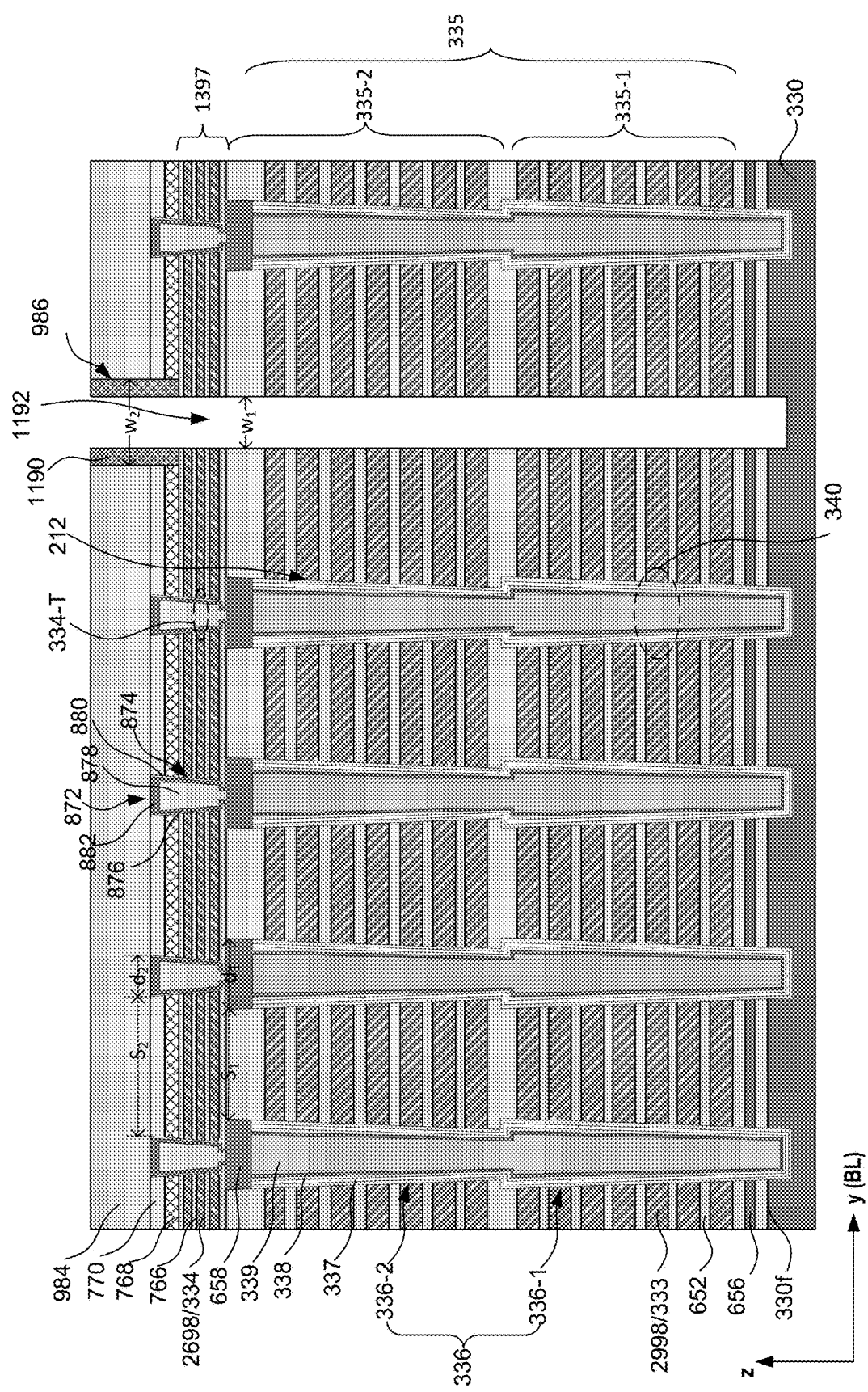
Figure 30:
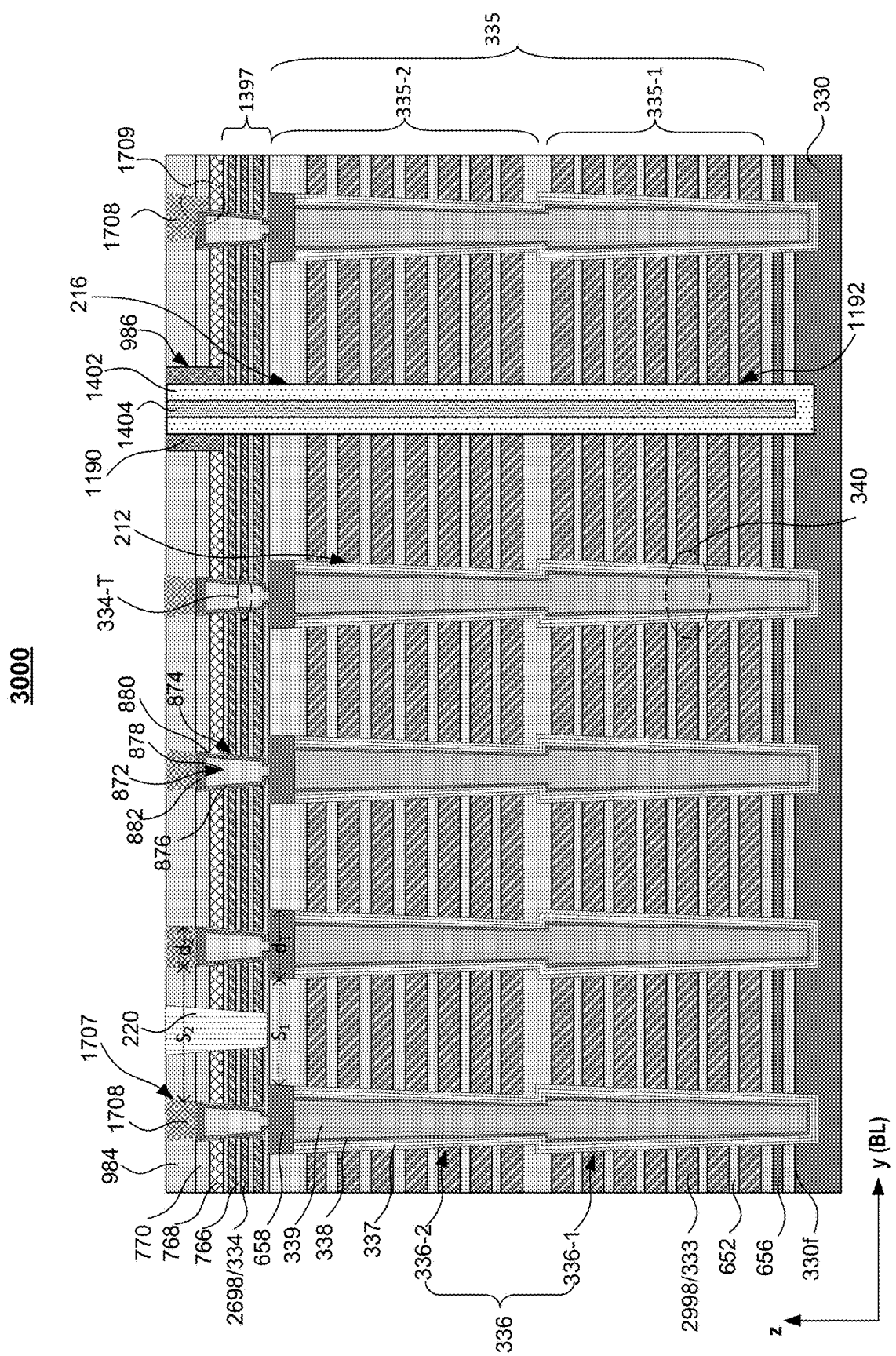

In FIGS. 5 and 13-17, conductive layers 1398 in the lower film stack 335-1, upper film stack 335-2 and the TSG film stack 1397 include the same conductive material. However, the lower film stack 335-1, upper film stack 335-2 and the TSG film stack 1397 can include different conductive materials and conductive layers. For example, the process step S550 can be modified such that the GLS opening 1192 having a first depth can be formed (see FIG. 24). The GLS opening 1192 with the first depth penetrates through the top dielectric stack 762. Then, the fourth dielectric layers 764 in the top dielectric stack 762 can be removed to form the second set of lateral tunnels 1296 (see FIG. 25). Next, a first conductive layer 2698 can be disposed inside the second set of lateral tunnels 1296 (see FIG. 26) to form the TSG film stack 1397. Then, the GLS opening 1192 having a second depth, which is deeper than the first depth, can be formed (see FIG. 27). The GLS opening 1192 with the second depth can extend further through the alternating dielectric stack 650 into the substrate 330. Subsequently, the second dielectric layers 654 in the alternating dielectric stack 650 can be removed to form the first set of lateral tunnels 1294 (see FIG. 28). A second conductive layer 2998 can be disposed inside the first set of lateral tunnels 1294 (see FIG. 29). As such, the TSG film stack 1397 includes the third dielectric layers 766 and the first conductive layers 2698, and the film stack 335 includes the first dielectric layers 652 and the second conductive layers 2998, where the second conductive layers 2998 can be different from the first conductive layers 2698 (see FIG. 30).

The present disclosure also describes a three-dimensional (3D) memory device. FIGS. 17, 21, 23, and 30 illustrate various 3D memory devices, where different features can be combined using the methods described associated with FIGS. 5-30.

Referring to FIG. 17, the 3D memory structure 1700 includes the film stack 335 of alternating conductive and dielectric layers, wherein the film stack 335 includes conductive layers 1398 and first dielectric layers 652 alternatingly stacked on top of the substrate 330. In some embodiments, the film stack 335 includes an upper film stack 335-2 and a lower film stack 335-1, wherein the lower film stack 335-1 is disposed on the substrate 330 and the upper film stack 335-2 is disposed on the lower film stack 335-1.

The substrate 330 can include monocrystalline, polycrystalline or single crystalline semiconductors, for example, silicon, silicon germanium (SiGe), germanium (Ge), silicon on insulator (SOI), germanium on insulator (GOI), gallium arsenide (GaAs), gallium nitride, silicon carbide, III-V compound, or any combinations thereof. In some embodiments, the substrate 330 can include a layer of semiconductor material formed on a handle wafer, for example, glass, plastic, or another semiconductor substrate.

The first dielectric layer 652 includes any suitable insulating materials, for example, silicon oxide, silicon oxynitride, silicon nitride, TEOS or silicon oxide with F-, C-, N-, and/or H-incorporation. The first dielectric layers 652 can have the same thickness or different thicknesses, which can be in a range between 10 nm to 500 nm. In some embodiments, the first dielectric layer 652 can be silicon oxide with a thickness about 25 nm.

The conductive layers 1398 include any suitable metal or metal alloys such as tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, or any combination thereof. The conductive layers 1398 can have the same thickness or different thicknesses, which can be in a range between 10 nm to 500 nm. In some embodiments, the conductive layers 1398 include W with a thickness in a range from about 25 nm to about 40 nm.

The film stack 335 can also include a gate dielectric layer surrounding the conductive layer 1398. The gate dielectric layer can include any suitable insulator, for example, silicon oxide, silicon nitride, silicon oxynitride, and/or any suitable combinations thereof. The gate dielectric layer can also include high-k dielectric materials, such as hafnium oxide, zirconium oxide, aluminum oxide, tantalum oxide, lanthanum oxide, and/or any combination thereof.

In some embodiments, the 3D memory device 1700 also includes a bottom semiconductor layer 656 sandwiched between the film stack 335 and the substrate 330. The bottom semiconductor layer 656 can include a crystalline or poly-crystalline semiconductor material, for example, silicon, silicon germanium, germanium, gallium arsenide, gallium nitride, III-V compound, or any combination thereof.

The 3D memory device 1700 also includes channel holes 336 in the channel structure region 211 (see FIG. 2), wherein the channel holes 336 vertically penetrate through the film stack 335, perpendicular to the front surface 330f of the substrate 330. In some embodiments, the channel holes 336 extend into the bottom semiconductor layer 656. In some embodiments, the channel holes 336 extend further into the substrate 330. The channel hole 336 can be in a shape of a cylinder.

The channel hole 336 can include the core filling film 339 in a center, where the core filling film 339 can be surrounded by the channel layer 338. The core filling film 339 can include any suitable insulator, for example, silicon oxide, silicon nitride, silicon oxynitride, spin-on-glass, boron or phosphorus doped silicon oxide, carbon-doped oxide (CDO or SiOC or SiOC:H), fluorine doped oxide (SiOF), or any combination thereof. The channel layer 338 can include any suitable semiconductor such as polycrystalline silicon with a thickness in a range from about 10 nm to about 30 nm.

The channel holes 336 can also include the memory film 337 covering a sidewall of the channel layer 338, i.e., surrounding the channel layer 338. The memory film 337 can be a composite layer including a tunneling layer, a storage layer (also known as "charge trap/storage layer"), and a blocking layer. In some embodiments, the tunneling layer, the storage layer, and the blocking layer are arranged along a direction from a center of the channel hole 336 toward the outer of the channel hole 336 in the above order. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 337 includes ONO dielectrics (e.g., a tunneling layer including silicon oxide, a storage layer including silicon nitride, and a blocking layer including silicon oxide). In some embodiments, a thickness of the memory film 337 can be in a range from about 10 nm to about 50 nm.

The 3D memory device 1700 includes a plurality of memory cells 340 vertically stacked on the substrate 330. The memory cell 340 is formed at an intersection between the conductive layer 1398 and the channel hole 336. The vertically stack memory cells 340 along the same channel hole 336 can form the memory string 212. The conductive layers 1398 can form word lines 333 in FIG. 3 to address the memory cells 340.

In some embodiments, the channel hole 336 also include an epitaxial plug (not shown) at bottom of the channel hole. The epitaxial plug can be connected to the bottom semiconductor layer 656 or the substrate 330.

The channel hole 336 can also include the channel top plug 658, configured to provide electrical contact to the channel layer 338.

In some embodiments, the film stack 335 includes the upper film stack 335-2 and the lower film stack 335-1. In this example, the 3D memory device 1700 can include lower channel holes 336-1 penetrating through the lower film stack 335-1, and upper channel holes 336-2 penetrating through the upper film stack 335-2. The upper channel holes can be aligned to the lower channel holes 336-1.

The 3D memory device 1700 also includes an etch-stop layer 768 disposed on the TSG film stack 1397. In some embodiments, the etch-stop layer 768 can be disposed on the third dielectric layer 766.

The 3D memory device 1700 also includes the first capping layer 770 and the second capping layer 984 (together also referred to as the "capping layer"). The first capping layer 770 can be disposed on the etch-stop layer 768 and the second capping layer 984 can be disposed on the first capping layer 770. The first capping layer 770 and the second capping layer 984 include any suitable material that is different from the etch-stop layer 768, where the first capping layer 770 and the second capping layer 984 can be etched selectively with respect to the etch-stop layer 768. Namely, the first capping layer 770 and the second capping layer 984 can be etched with an etch rate much higher than an etch rate of the etch-stop layer 768. The first capping layer 770 and the second capping layer 984 can include any suitable insulating materials, for example, silicon oxide, silicon oxynitride, silicon nitride, TEOS or silicon oxide with F-, C-, N-, and/or H-incorporation, or any combination of the above materials.

The 3D memory structure 1700 also includes the top select structures 872 that penetrate through the TSG film stack 1397 and extending into the channel top plugs 658 on top of the memory strings 212. In some embodiments, the top select structures 872 also penetrate through the first capping layer 770 and the etch-stop layer 768. The top select structures 872 can be aligned with the memory strings 212. In some embodiments, the top select structures 872 can also have a cylindrical shape. The top select structures 872 can have a diameter "$d_2$" smaller than a diameter "$d_1$" of the channel top plugs 658 on the top of the memory strings 212. Accordingly, a spacing "$S_2$" between adjacent top select structures 872 can be larger than a spacing "$S_1$" between two adjacent memory strings 212.

The top select structure 872 can include the top select dielectric layer 880 disposed on the sidewalls of the top select openings 874. In some embodiments, a thickness of the top select dielectric layer 880 can be in a range from about 10 nm to about 50 nm.

The top select structure 872 also includes the top select channel layer 876 disposed on a sidewall of the top select dielectric layer 880 inside the top select opening 874. The top select channel layer 876 can be any suitable semiconductor material such as silicon. In some embodiments, a thickness of the top select channel layer 876 can be in a range from about 10 nm to about 30 nm. The top select channel layer 876 in contact with the channel top plug 658, and thereby can be electrically connected to the channel layer 338 of the memory string 212.

In some embodiments, the top select structure 872 also includes a top select plug 882 at a top portion of the top select opening 874. The top select plug 882 can form electrical contact with the top select channel layer 876 on the sidewall of the top select opening 874. As such, the top select plug 882 can also be connected with the channel top plug 658 and the channel layer 338 of the memory string 212.

The 3D memory device 1700 also includes BL contacts 1708 on the top select structures 872, where the BL contacts 1708 penetrate vertically through the second capping layer 984. In some embodiments, the BL contact 1708 is in contact with the top select structure 872. The BL contact 1708 can provide electrical connection to the top select plug 882 and the top select channel layer 876 and thereby can provide electrical connections to the channel top plug 658 and the channel layer 338 in the memory string 212. Bit lines (not shown) of the 3D memory device 1700 can address the memory cells 340 in the memory string 212 through the BL contacts 1708. The BL contacts 1708 can include metal, metal alloy and/or metal silicide, for example, tungsten, titanium, tantalum, tungsten nitride, titanium nitride, tantalum nitride, nickel silicide, cobalt silicide, tungsten silicide, titanium silicide, or a combination thereof.

The BL contacts 1708 can be substantially aligned with the top select structures 872. However, when there is an overlay offset between the BL contact 1708 and the top select structure 872, the BL contact 1708 can extend further into the first capping layer 770 and the etch-stop layer 768 to include a BL contact dip 1709. The BL contact dip 1709 does not contact or penetrate through the conductive layer 1398 in the TSG film stack 1397 because the etch-stop layer 768 can function as an etch stop for forming the BL contact opening 1707. Namely, the second capping layer 984 can be etched must faster than the etch-stop layer 768. Accordingly, there is no electrical shorts between the BL contact 1708 and the conductive layers 1398.

The 3D memory device 1700 also includes the GLS 216, similar to the slit structures 216 in FIGS. 2 and 3. The GLS 216 penetrates vertically through TSG film stack 1397 and the film stack 335 and is configured to separate a memory block into multiple memory fingers. In some embodiments, the GLS 216 extends into the bottom semiconductor layer 656. In some embodiments, the GLS 216 extends further into the substrate 330. The GLS 216 includes the GLS opening filler 1404 at a center of the GLS opening 1192. The GLS opening filler 1404 can be any suitable insulator. In some embodiments, the GLS 216 can also include a conductive core contacting the bottom semiconductor layer 656 or the substrate 330 to function as an array common source (ACS) contact.

The GLS 216 also includes the GLS isolation layer 1402 disposed on a sidewall of the GLS opening 1192. The GLS isolation layer 1402 covers sidewalls of the conductive layers 1398 that are exposed inside the GLS opening 1192. The GLS isolation layer 1402 can also cover the exposed substrate 330 inside the GLS opening 1192.

In some embodiments, the GLS 216 further includes the GLS trench spacer 1190 that extends vertically through the second capping layer 984, the first capping layer 770 and the etch-stop layer 768. In some embodiments, a bottom portion of the GLS trench spacer 1190 contacts an uppermost third dielectric layer 766 that is directly underneath the etch-stop layer 768. In some embodiments, the GLS trench spacer 1190 extends vertically into the uppermost third dielectric layer 766. Namely, the GLS trench spacer 1190 penetrates through the etch-stop layer 768 in a direction perpendicular to the substrate, but terminates above the uppermost conductive layer 1398 away from the substrate. The GLS trench spacer 1190 does not contact or penetrate through the conductive layers 1398 in the TSG film stack 1397. The GLS trench spacer 1190 covers the sidewalls of the second capping layer 984, the first capping layer 770 and the etch-stop layer 768. The GLS trench spacer 1190 surrounds a top portion of the GLS isolation layer 1402. The GLS trench spacer 1190 can include any suitable insulating material that is different from the etch-stop layer 768. The GLS trench spacer 1190 can include silicon oxide, silicon oxynitride, silicon nitride, TEOS, high-k dielectric materials (e.g., hafnium oxide, zirconium oxide, aluminum oxide, tantalum oxide, or lanthanum oxide films, etc.), or a combination thereof.

In some embodiments, the GLS trench spacer 1190 includes silicon oxide. The etch-stop layer 768 includes silicon nitride. The first capping layer 770 includes silicon oxide. The first dielectric layer 652 and the third dielectric layer 766 includes silicon oxide.

The 3D memory device 1700 also includes the TSG cut 220 that penetrates vertically through the TSG film stack 1397 and can electrically separate the TSGs 334. The TSG cut 220 extends lateral along the x-direction (i.e., the WL direction) and can divide the memory finger 218 into multiple memory slices 224 (see FIG. 16). The TSG cut 220 electrically isolates the TSGs 334 such that the TSG 334 in each memory slice 224 can be independently controlled. In some embodiments, the TSG cut 220 also penetrates through the first capping layer 770 and the etch-stop layer 768. In some embodiments, the TSG cut 220 also penetrates through the second capping layer 984. The diameter "$d_2$" of the top select plug 882 is smaller than the diameter "$d_1$" of the memory string 212 (e.g., the channel top plug 658). Accordingly, the spacing "$s_2$" between adjacent top select plugs 882 is larger than the spacing "$s_1$" between adjacent memory strings 212. The TSG cut 220 goes in between adjacent memory strings 212. In a direction (e.g., the y-direction) parallel to the substrate 330, the TSG cut 220 is distant from the top select structure 872. The TSG cut 220 is formed in between the top select structures 872. The TSG cut 220 does not intersect with the top select structure 872. The TSG cut 220 includes any suitable insulating material disposed inside the TSG cut opening 1506. The insulating material of the TSG cut 220 can include silicon oxide, silicon nitride, silicon oxynitride, boron or phosphorus doped silicon oxide, carbon-doped oxide (CDO or SiOC or SiOC:H), or fluorine doped oxide (SiOF), or any combination thereof.

Figure 31:
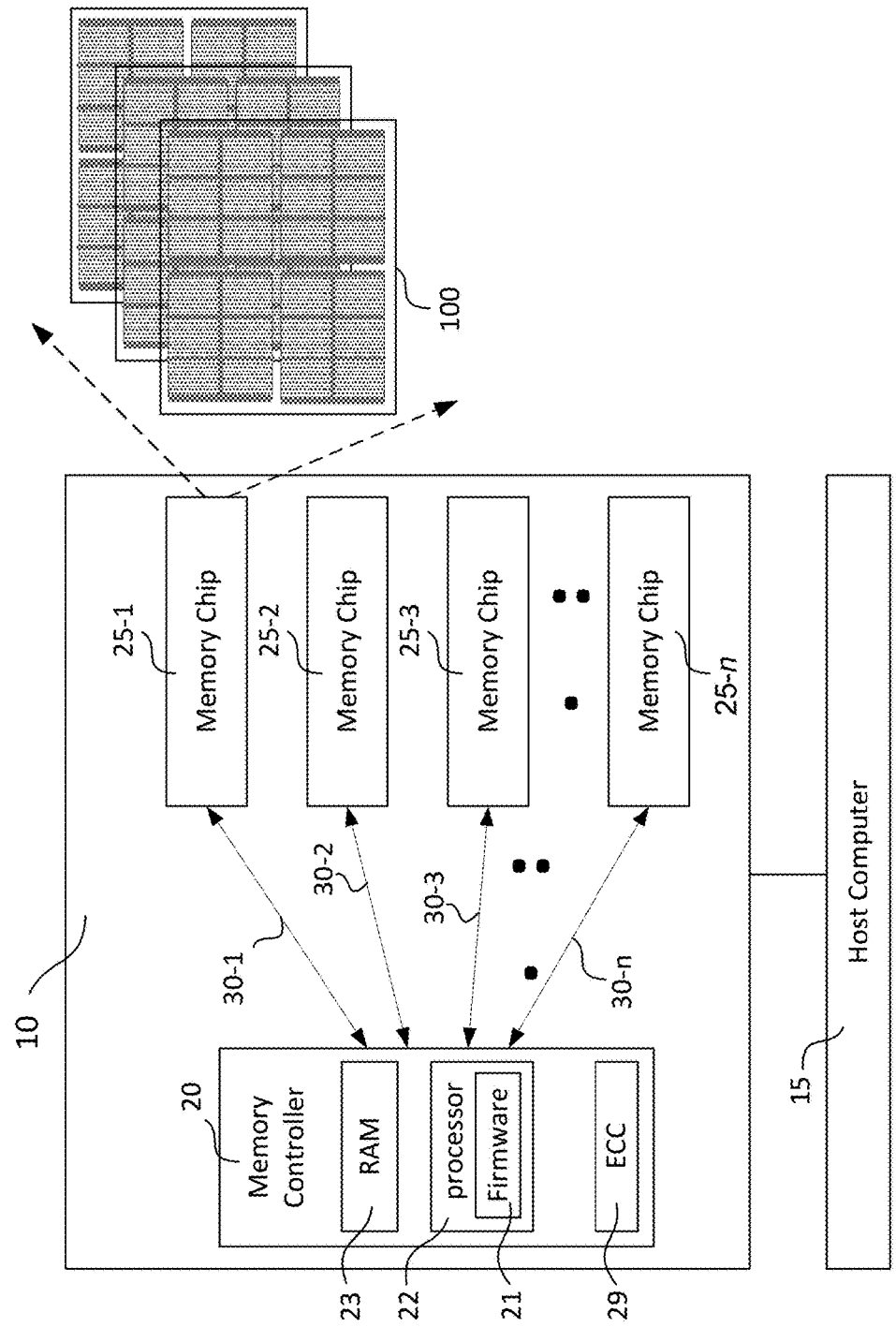
FIGS. 31 and 32A-32B illustrate a storage system with one or more memory chips, according to some embodiments of the present disclosure.

FIG. 31 illustrates a block diagram of an exemplary system S1 having a storage system 10, according to some embodiments of the present disclosure. System S1 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The storage system 10 (also referred to as a NAND storage system) can include a memory controller 20 and one or more semiconductor memory chips 25-1, 25-2, 25-3, . . . , 25-n. Each semiconductor memory chip 25 (hereafter just "memory chip") can be a NAND chip (i.e., "flash," "NAND flash" or "NAND"). The storage system 10 can communicate with a host computer 15 through the memory controller 20, where the memory controller 20 can be connected to the one or more memory chips 25-1, 25-2, 25-3, . . . , 25-n, via one or more memory channels 30-1, 30-2, 30-3, . . . , 30-n. In some embodiments, each memory chip 25 can be managed by the memory controller 20 via a memory channel 30.

In some embodiments, the host computer 15 can include a processor of an electronic device, such as a central processing unit (CPU), or a system-on-chip (SoC), such as an application processor (AP). The host computer 15 sends data to be stored at the NAND storage system or storage system 10 or retrieves data by reading the storage system 10.

The memory controller 20 can handle I/O requests received from the host computer 15, ensure data integrity and efficient storage, and manage the memory chip 25. To perform these tasks, the controller runs firmware 21, which can be executed by one or more processors 22 (e.g., microcontroller units, CPU) inside the controller 20. For example, the controller 20 runs firmware 21 to map logical addresses (i.e., address utilized by the host associated with host data) to physical addresses in the memory chip 25 (i.e., actual locations where the data is stored). The controller 20 also runs firmware 21 to manage defective memory blocks in the memory chip 25, where the firmware 21 can remap the logical address to a different physical address, i.e., move the data to a different physical address. The controller 20 can also include one or more memories 23 (e.g., DRAM, SRAM, EPROM, etc.), which can be used to store various metadata used by the firmware 21. In some embodiments, the memory controller 20 can also perform error recovery through an error correction code (ECC) engine 29. ECC is used to detect and correct the raw bit errors that occur within each memory chip 25.

The memory channels 30 can provide data and control communication between the memory controller 20 and each memory chip 25 via a data bus. The memory controller 20 can select one of the memory chip 25 according to a chip enable signal.

In some embodiments, each memory chip 25 in FIG. 31 can include one or more memory dies 100, where each memory die can be the 3D NAND memory 100 as shown in FIGS. 1-3. In some embodiments, each of the one or more memory dies 100 can include the 3D memory device shown in FIGS. 17, 21, 23 and 30, which can be fabricated using any of the methods described previously.

Figure 32A:
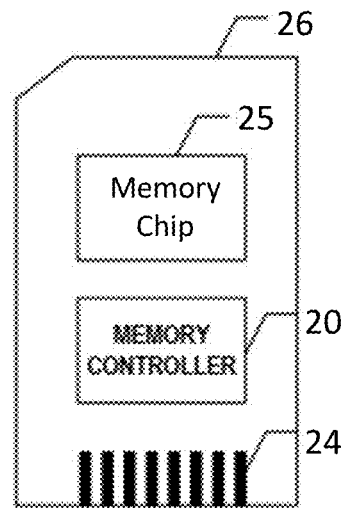
Figure 32B:
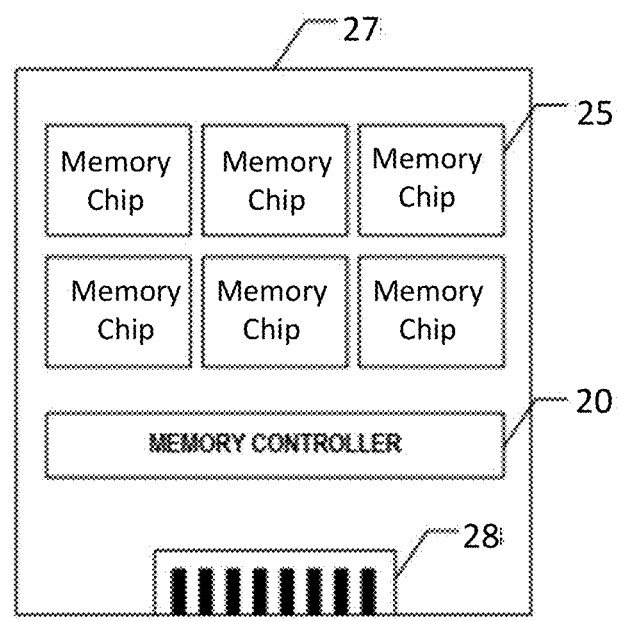

Memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 32A, memory controller 20 and a single memory chip 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, mini SD, microSD, SDHC), a UFS, etc. Memory card 26 can further include a memory card connector 24 coupling memory card 26 with a host (e.g., the host computer 15 in FIG. 31). In another example as shown in FIG. 32B, memory controller 20 and multiple memory chip 25 can be integrated into a solid state drive (SSD) 27. SSD 27 can further include a SSD connector 28 coupling SSD 27 with a host (e.g., the host computer 15 in FIG. 31).

Figure 33:
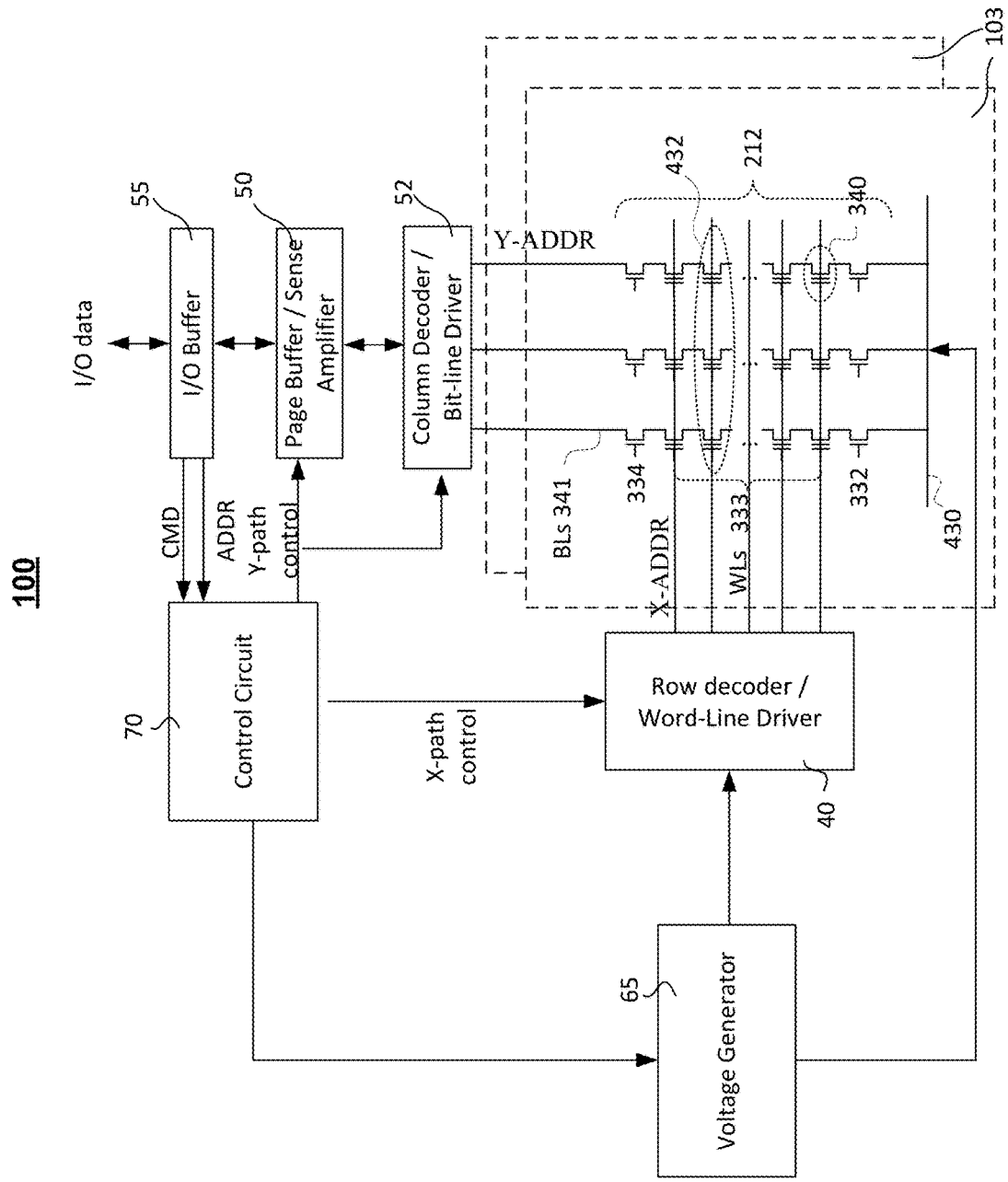
FIG. 33 illustrates a schematic of a three-dimensional (3D) memory die, according to some embodiments of the present disclosure.

FIG. 33 illustrates a schematic diagram of the memory die 100 (also referred to as memory device 100 in FIG. 1), according to some embodiments of the present disclosure. The memory die 100 includes one or more memory blocks 103 (e.g., 103-1, 103-2, 103-3). Each memory block 103 includes a plurality of memory strings 212. Each memory string 212 includes a plurality of memory cells 340. The memory cells 340 sharing the same word line forms a memory page 432. The memory string 212 can also include at least one field effect transistor (e.g., MOSFET) at each end, which is controlled by a bottom select gate (BSG) 332 and a top select gate (TSG) 334, respectively. The drain terminal of the top select transistor 334-T can be connected to the bit line 341, and the source terminal of the lower select transistor 332-T can be connected to an array common source (ACS) 430. The ACS 430 can be shared by the memory strings 212 in an entire memory block, and is also referred to as the common source line.

The memory die 100 can also include a periphery circuit that includes many digital, analog, and/or mixed-signal circuits to support functions of the memory block 103, for example, a page buffer/sense amplifier 50, a row decoder/word line driver 40, a column decoder/bit line driver 52, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

The memory blocks 103 can be coupled with the row decoder/word line driver 40 via word lines ("WLs") 333, bottom select gates ("BSGs") 332 and top select gates ("TSGs") 334. The memory blocks 103 can be coupled with the page buffer/sense amplifier 50 via bit lines ("BLs") 341. The row decoder/word line driver 40 can select one of the memory blocks 103 on the memory die 100 in response to an X-path control signal provided by the control circuit 70. The row decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70.

The column decoder/bit line driver 52 can transfer an inhibit voltage $V_{inhibit}$ to an unselected bit line and connect a selected bit line to ground according to a Y-path control signal received from the control circuit 70. In the other words, the column decoder/bit line driver 52 can be configured to select or unselect one or more memory strings 212 according to the Y-path control signal from the control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed into one memory page 432. In another example, page buffer/sense amplifier 50 can perform verify operations to ensure that the data has been properly programmed into each memory cell 340. In yet another example, during a read operation, the page buffer/sense amplifier 50 can sense current flowing through the bit line 341 that reflects the logic state (i.e., data) of the memory cell 340 and amplify small signal to a measurable magnification.

The input/output buffer 55 can transfer the I/O data from/to the page buffer/sense amplifier 50 as well as addresses ADDR or commands CMD to the control circuit 70. In some embodiments, the input/output buffer 55 can function as an interface between the memory controller 20 (in FIG. 31) and the memory die 100 on the memory chip 25.

The control circuit 70 can control the page buffer/sense amplifier 50 and the row decoder/word line driver 40 in response to the commands CMD transferred by the input/output buffer 55. During the program operation, the control circuit 70 can control the row decoder/word line driver 40 and the page buffer/sense amplifier 50 to program a selected memory cell. During the read operation, the control circuit 70 can control the row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify the memory page 432, memory block 103, and memory plane 101 (in FIG. 31), respectively. The column address Y-ADDR can identify a byte or a word in the data of the memory page 432.

The voltage generator 65 can generate voltages to be supplied to word lines and bit lines under the control of the control circuit 70. The voltages generated by the voltage generator 65 include the read voltage $V_{read}$, the program voltage $V_{pgm}$, the pass voltage $V_{pass}$, the inhibit voltage $V_{inhibit}$, etc.

In summary, the present disclosure provides a method for forming a three-dimensional (3D) memory device. The method includes forming a first dielectric stack on a substrate, wherein the first dielectric stack comprises a first dielectric layer and a second dielectric layer alternatingly stacked in a first direction perpendicular to the substrate. The method also includes forming a second dielectric stack on the first dielectric stack, wherein the second dielectric stack comprises a third dielectric layer and a fourth dielectric layer stacked in the first direction. The method further includes forming an etch-stop layer on the second dielectric stack; and replacing the fourth dielectric layer and the second dielectric layer with conductive layers to form a top select gate (TSG) film stack and a film stack of alternating conductive and dielectric layers, respectively.

In some embodiments, the method further includes forming a first capping layer on the etch-stop layer, wherein an etch rate of the first capping layer is higher than an etch rate of the etch-stop layer.

In some embodiments, the method further includes forming a gate line slit (GLS) trench penetrating through the etch-stop layer; and forming a GLS trench spacer to cover a sidewall of the etch-stop layer.

In some embodiments, the forming the GLS trench spacer includes forming a GLS trench isolation inside the GLS trench to cover the sidewall of the etch-stop layer and forming a GLS opening penetrating through the GLS trench isolation, the second dielectric stack and the first dielectric stack. An etch rate of the GLS trench isolation is lower than an etch rate of the fourth dielectric layer. A first width of the GLS opening in the GLS trench isolation is smaller than a second width of the GLS trench.

In some embodiments, the replacing the fourth dielectric layer and the second dielectric layer with the conductive layers includes removing the fourth dielectric layer and the second dielectric layer through the GLS opening to form a second lateral tunnel and a first lateral tunnel, respectively; and forming the conductive layers in the second lateral tunnel and the first lateral tunnel.

In some embodiments, the method further includes forming a GLS isolation layer on a sidewall of the GLS opening; and filling the GLS opening with a GLS opening filler to form a GLS.

In some embodiments, the method further includes, prior to forming the second dielectric stack, forming a channel structure penetrating through the first dielectric stack. The channel structure includes a channel layer; a memory film covering a sidewall of the channel layer; and a channel top plug at a top portion of the channel structure, wherein the channel top plug is connected to the channel layer.

In some embodiments, the method further includes forming a top select structure penetrating through the etch-stop layer and the second dielectric stack. The top select structure includes a top select channel layer; a top select dielectric layer covering a sidewall of the top select channel layer; and a top select plug at a top portion of the top select structure. The top select plug is connected to the top select channel layer. The top select channel layer is connected to the channel top plug of the channel structure. A second diameter at a top of the top select plug is smaller than a first diameter at a top of the channel top plug.

In some embodiments, the method further includes forming a contact electrically connected to the top select structure, wherein the contact is above or on a side of the etch-stop layer farther away from the conductive layers in the TSG film stack.

In some embodiments, the method further includes forming a TSG cut penetrating through the etch-stop layer and the TSG film stack, wherein the TSG cut is distant from the top select structure in a second direction parallel to the substrate.

The present disclosure also provides a three-dimensional (3D) memory device. The 3D memory device includes a film stack of alternating conductive and dielectric layers, the film stack having a first dielectric layer and a second conductive layer alternatingly stacked in a first direction. The 3D memory device also includes a top select gate (TSG) film stack disposed on the film stack, the TSG film stack having a third dielectric layer and a first conductive layer. The 3D memory device further includes an etch-stop layer disposed on the TSG film stack.

In some embodiments, the 3D memory device further includes a memory string penetrating through the film stack in the first direction, wherein the memory string includes a channel layer; a memory film covering a sidewall of the channel layer; and a channel top plug at a top portion of the memory string. The channel top plug is connected to the channel layer.

In some embodiments, the 3D memory device also includes a top select structure penetrating through the TSG film stack in the first direction, wherein the top select structure is disposed on the memory string. The top select structure includes a top select channel layer; a top select dielectric layer covering a sidewall of the top select channel layer; and a top select plug at a top portion of the top select structure. The top select plug is connected to the top select channel layer. The top select channel layer is connected to the channel top plug of the memory string. A second diameter at a top of the top select plug is smaller than a first diameter at a top of the channel top plug.

In some embodiments, the 3D memory device also includes a TSG cut penetrating through the etch-stop layer and the TSG film stack, wherein the TSG cut is distant from the top select structure in a second direction perpendicular to the first direction.

In some embodiments, the 3D memory device also includes a contact electrically connected to the top select structure, wherein the contact is above or on a side of the etch-stop layer farther away from the first conductive layer in the TSG film stack.

In some embodiments, the 3D memory device further includes a gate line slit (GLS) penetrating through the TSG film stack and the film stack of alternating conductive and dielectric layers in the first direction. The GLS includes a GLS isolation layer covering a sidewall of a GLS opening filler.

In some embodiments, the 3D memory device also includes a GLS trench spacer penetrating through the etch-stop layer in the first direction and covering a sidewall of the etch-stop layer.

In some embodiments, the 3D memory device further includes a first capping layer disposed on the etch-stop layer, wherein an etch rate of the first capping layer is higher than an etch rate of the etch-stop layer.

In some embodiments, the film stack further includes a lower film stack, a first channel hole penetrating through the lower film stack, an upper film stack and a second channel hole penetrating through the upper film stack. The upper film stack is disposed on the lower film stack. The second channel hole is disposed on the first channel hole.

The present disclosure further provides a three-dimensional (3D) memory device having a film stack of alternating conductive and dielectric layers, wherein the film stack includes a first dielectric layer and a conductive layer alternatingly stacked in a first direction. The 3D memory device also includes a top select gate (TSG) film stack disposed on the film stack, the TSG film stack having a third dielectric layer and the conductive layer. The 3D memory device further includes an etch-stop layer disposed on the TSG film stack, a top select structure penetrating through the etch-stop layer and the TSG film stack in the first direction; and a TSG cut penetrating through the etch-stop layer and the TSG film stack. The TSG cut is distant from the top select structure in a second direction perpendicular to the first direction.

In some embodiments, the 3D memory device further includes a contact electrically connected to the top select structure, wherein the contact is above or on a side of the etch-stop layer farther away from the conductive layer in the first direction.

In some embodiments, the 3D memory device also includes a memory string penetrating through the film stack in the first direction. The top select structure is disposed on the memory string. A second diameter at a top portion of the top select structure is smaller than a first diameter at a top portion of the memory string.

In some embodiments, the 3D memory device further includes a gate line slit (GLS) penetrating through the TSG film stack and the film stack of alternating conductive and dielectric layers in the first direction.

In some embodiments, the 3D memory device further includes a GLS trench spacer penetrating through the etch-stop layer in the first direction and covering a sidewall of the etch-stop layer.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
   forming a first dielectric stack on a substrate, wherein the first dielectric stack comprises a first dielectric layer and a second dielectric layer alternatingly stacked in a first direction perpendicular to the substrate;
   forming a second dielectric stack on the first dielectric stack, wherein the second dielectric stack comprises a third dielectric layer and a fourth dielectric layer stacked in the first direction;
   forming an etch-stop layer on the second dielectric stack:
   forming a gate line slit (GLS) opening through the etch-stop layer, the second dielectric stack and the first dielectric stack; and
   replacing the fourth dielectric layer and the second dielectric layer through the GLS opening with conductive layers to form a top select gate (TSG) film stack and a film stack of alternating conductive and dielectric layers, respectively.

2. The method of claim 1, further comprising forming a first capping layer on the etch-stop layer, wherein an etch rate of the first capping layer is higher than an etch rate of the etch-stop layer.

3. The method of claim 1, further comprising:
   forming a gate line slit (GLS) trench penetrating through the etch-stop layer; and
   forming a GLS trench spacer to cover a sidewall of the etch-stop layer.

4. The method of claim 3, wherein the forming the GLS trench spacer comprises:
   forming a GLS trench isolation inside the GLS trench to cover the sidewall of the etch-stop layer, wherein an etch rate of the GLS trench isolation is lower than an etch rate of the fourth dielectric layer; and
   forming the GLS opening penetrating through the GLS trench isolation, the second dielectric stack and the first dielectric stack, wherein a first width of the GLS opening in the GLS trench isolation is smaller than a second width of the GLS trench.

5. The method of claim 4, wherein the replacing the fourth dielectric layer and the second dielectric layer with the conductive layers comprises:
   removing the fourth dielectric layer and the second dielectric layer through the GLS opening to form a second lateral tunnel and a first lateral tunnel, respectively; and
   forming the conductive layers in the second lateral tunnel and the first lateral tunnel.

6. The method of claim 4, further comprising:
   forming a GLS isolation layer on a sidewall of the GLS opening; and
   filling the GLS opening with a GLS opening filler to form a GLS.

7. The method of claim 1, further comprising, prior to forming the second dielectric stack, forming a channel structure penetrating through the first dielectric stack, wherein the channel structure comprises:
   a channel layer;
   a memory film covering a sidewall of the channel layer; and
   a channel top plug at a top portion of the channel structure, wherein the channel top plug is connected to the channel layer.

8. The method of claim 7, further comprising forming a top select structure penetrating through the etch-stop layer and the second dielectric stack, wherein the top select structure comprises:
   a top select channel layer;
   a top select dielectric layer covering a sidewall of the top select channel layer; and
   a top select plug at a top portion of the top select structure, wherein:
      the top select plug is connected to the top select channel layer;
      the top select channel layer is connected to the channel top plug of the channel structure; and
      a second diameter at a top of the top select plug is smaller than a first diameter at a top of the channel top plug.

9. The method of claim 8, further comprising forming a contact electrically connected to the top select structure, wherein the contact is above or on a side of the etch-stop layer farther away from the conductive layers in the TSG film stack.

10. The method of claim 8, further comprising forming a TSG cut penetrating through the etch-stop layer and the TSG film stack, wherein the TSG cut is distant from the top select structure in a second direction parallel to the substrate.

11. A method for forming a three-dimensional (3D) memory device, comprising:
   forming a first dielectric stack on a substrate, wherein the first dielectric stack comprises a first dielectric layer and a second dielectric layer alternatingly stacked in a first direction perpendicular to the substrate;
   forming a second dielectric stack on the first dielectric stack, wherein the second dielectric stack comprises a third dielectric layer and a fourth dielectric layer stacked in the first direction;
   forming an etch-stop layer on the second dielectric stack;
   forming a channel structure penetrating through the first dielectric stack, wherein the channel structure comprises:
      a channel layer;
      a memory film covering a sidewall of the channel layer; and
      a channel top plug at a top portion of the channel structure, wherein the channel top plug is connected to the channel layer; and
   replacing the fourth dielectric layer and the second dielectric layer with conductive layers to form a top select gate (TSG) film stack and a film stack of alternating conductive and dielectric layers, respectively.

12. The method of claim 11, further comprising forming a first capping layer on the etch-stop layer, wherein an etch rate of the first capping layer is higher than an etch rate of the etch-stop layer.

13. The method of claim 11, further comprising:
forming a gate line slit (GLS) trench penetrating through the etch-stop layer; and
forming a GLS trench spacer to cover a sidewall of the etch-stop layer.

14. The method of claim 13, wherein the forming the GLS trench spacer comprises:
forming a GLS trench isolation inside the GLS trench to cover the sidewall of the etch-stop layer, wherein an etch rate of the GLS trench isolation is lower than an etch rate of the fourth dielectric layer; and
forming a GLS opening penetrating through the GLS trench isolation, the second dielectric stack and the first dielectric stack, wherein a first width of the GLS opening in the GLS trench isolation is smaller than a second width of the GLS trench.

15. The method of claim 14, wherein the replacing the fourth dielectric layer and the second dielectric layer with the conductive layers comprises:
removing the fourth dielectric layer and the second dielectric layer through the GLS opening to form a second lateral tunnel and a first lateral tunnel, respectively; and
forming the conductive layers in the second lateral tunnel and the first lateral tunnel.

16. The method of claim 14, further comprising:
forming a GLS isolation layer on a sidewall of the GLS opening; and
filling the GLS opening with a GLS opening filler to form a GLS.

17. The method of claim 11, further comprising:
forming a top select structure penetrating through the etch-stop layer and the second dielectric stack, wherein the top select structure comprises:
a top select channel layer;
a top select dielectric layer covering a sidewall of the top select channel layer; and
a top select plug at a top portion of the top select structure, wherein:
the top select plug is connected to the top select channel layer;
the top select channel layer is connected to the channel top plug of the channel structure; and
a second diameter at a top of the top select plug is smaller than a first diameter at a top of the channel top plug.

18. The method of claim 17, further comprising forming a contact electrically connected to the top select structure, wherein the contact is above or on a side of the etch-stop layer farther away from the conductive layers in the TSG film stack.

19. The method of claim 17, further comprising forming a TSG cut penetrating through the etch-stop layer and the TSG film stack, wherein the TSG cut is distant from the top select structure in a second direction parallel to the substrate.

20. A method for forming a three-dimensional (3D) memory device, comprising:
forming a first dielectric stack on a substrate, wherein the first dielectric stack comprises a first dielectric layer and a second dielectric layer alternatingly stacked in a first direction perpendicular to the substrate;
forming a second dielectric stack on the first dielectric stack, wherein the second dielectric stack comprises a third dielectric layer and a fourth dielectric layer stacked in the first direction;
forming an etch-stop layer on the second dielectric stack;
forming a first capping layer on the etch-stop layer, wherein an etch rate of the first capping layer is higher than an etch rate of the etch-stop layer; and
replacing the fourth dielectric layer and the second dielectric layer with conductive layers to form a top select gate (TSG) film stack and a film stack of alternating conductive and dielectric layers, respectively.

* * * * *